US012457811B2

(12) United States Patent
Satake et al.

(10) Patent No.: US 12,457,811 B2
(45) Date of Patent: Oct. 28, 2025

(54) IMAGING DEVICE AND ELECTRONIC EQUIPMENT

(71) Applicant: SONY SEMICONDUCTOR SOLUTIONS CORPORATION, Kanagawa (JP)

(72) Inventors: Yosuke Satake, Tokyo (JP); Tomoyuki Arai, Kanagawa (JP); Naohiro Takahashi, Kanagawa (JP); Koichiro Zaitsu, Kanagawa (JP); Akira Matsumoto, Kanagawa (JP); Keiji Nishida, Kanagawa (JP); Mizuki Nishida, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/692,427

(22) PCT Filed: Mar. 4, 2022

(86) PCT No.: PCT/JP2022/009286
§ 371 (c)(1),
(2) Date: Mar. 15, 2024

(87) PCT Pub. No.: WO2023/047632
PCT Pub. Date: Mar. 30, 2023

(65) Prior Publication Data

US 2024/0379691 A1 Nov. 14, 2024

(30) Foreign Application Priority Data

Sep. 24, 2021 (JP) ................................ 2021-155511

(51) Int. Cl.
*H10F 39/00* (2025.01)

(52) U.S. Cl.
CPC ....... *H10F 39/802* (2025.01); *H10F 39/8063* (2025.01); *H10F 39/807* (2025.01)

(58) Field of Classification Search
CPC ............................ H10F 39/802; H10F 39/807
See application file for complete search history.

(56) References Cited

U.S. PATENT DOCUMENTS

2016/0043119 A1* 2/2016 Lee ...................... H10F 39/807 257/446
2020/0235149 A1 7/2020 Shiraishi et al.
(Continued)

FOREIGN PATENT DOCUMENTS

| | | |
|---|---|---|
| JP | 2000-292685 | 10/2000 |
| JP | 2018-148116 | 9/2018 |
| JP | 2018-201015 | 12/2018 |

OTHER PUBLICATIONS

English Translation of International Search Report prepared by the Japan Patent Office on May 23, 2022, for International Application No. PCT/JP2022/009286, 2 pgs.

*Primary Examiner* — Thanh Luu
(74) *Attorney, Agent, or Firm* — SHERIDAN ROSS P.C.

(57) ABSTRACT

There is provided an imaging device including a semiconductor substrate and a plurality of imaging elements that are arrayed in a matrix in a first direction and a second direction on the semiconductor substrate and perform photoelectric conversion on incident light. Each of the plurality of imaging elements includes a plurality of pixels that are provided in a predetermined unit region of the semiconductor substrate to be adjacent to each other and contains impurities of a first conductivity type, a separation section that separates the plurality of pixels, two first element separation walls that are provided along two first side surfaces extending in the second direction of the predetermined unit region to pierce through at least a part of the semiconductor substrate, and a
(Continued)

first diffusion region provided in the semiconductor substrate around the first element separation wall and the separation section and containing impurities of a second conductivity type.

20 Claims, 54 Drawing Sheets

(56) References Cited

U.S. PATENT DOCUMENTS

| | | | | |
|---|---|---|---|---|
| 2020/0243578 | A1 | 7/2020 | Pyo et al. | |
| 2020/0243579 | A1 | 7/2020 | Pyo et al. | |
| 2020/0279885 | A1* | 9/2020 | Lee | H10F 39/811 |
| 2021/0143196 | A1 | 5/2021 | Uchida et al. | |
| 2021/0225906 | A1 | 7/2021 | Pyo et al. | |
| 2021/0313362 | A1 | 10/2021 | Shiraishi et al. | |
| 2022/0199660 | A1* | 6/2022 | Lee | H04N 25/59 |

* cited by examiner

CROSS SECTION A

CROSS SECTION B

CROSS SECTION A´

IMAGING DEVICE AND ELECTRONIC EQUIPMENT

CROSS REFERENCE TO RELATED APPLICATIONS

This application is a national stage application under 35 U.S.C. 371 and claims the benefit of PCT Application No. PCT/JP2022/009286, having an international filing date of 4 Mar. 2022, which designated the United States, which PCT application claimed the benefit of Japanese Patent Application No. 2021-155511, filed 24 Sep. 2021, the entire disclosures of each of which are incorporated herein by reference.

FIELD

The present disclosure relates to an imaging device and electronic equipment.

BACKGROUND

In recent years, an imaging device has adopted a method of detecting a phase difference using a pair of phase difference detection pixels as an autofocus function. As such an example, an imaging element disclosed in Patent Literature 1 below can be mentioned. In the technology disclosed in Patent Literature 1, both of an effective pixel that images an image of a subject and a phase difference detection pixel that detects the phase difference described above are separately provided on a light receiving surface.

CITATION LIST

Patent Literature

Patent Literature 1: JP 2000-292685 A

SUMMARY

Technical Problem

However, in the technology disclosed in Patent Literature 1, when a captured image of a subject is acquired, it is difficult to use information obtained by the phase difference detection pixel as the same information as information from the imaging pixel. Therefore, in the above technology, interpolation is performed on an image of a pixel corresponding to the phase difference detection pixel using information from effective pixels around the phase difference detection pixel and a captured image is generated. That is, in the technology disclosed in Patent Literature 1, since the phase difference detection pixel is provided to perform phase difference detection, it is difficult to avoid deterioration of the captured image due to a loss of information concerning the captured image corresponding to the phase difference detection pixel.

Therefore, the present disclosure proposes an imaging device and electronic equipment capable of avoiding deterioration of a captured image while improving accuracy of phase difference detection.

Solution to Problem

According to the present disclosure, there is provided an imaging device including: a semiconductor substrate; and a plurality of imaging elements that are arrayed in a matrix in a first direction and a second direction on the semiconductor substrate and perform photoelectric conversion on incident light. In the imaging device, each of the plurality of imaging elements includes: a plurality of pixels provided to be adjacent to one another in a predetermined unit region of the semiconductor substrate and including a photoelectric conversion section containing impurities of a first conductivity type; a separation section that separates the plurality of pixels; two first element separation walls provided to pierce through at least a part of the semiconductor substrate along two first side surfaces of the predetermined unit region extending in the second direction; an on-chip lens provided above a light receiving surface of the semiconductor substrate to be shared by the plurality of pixels; and a first diffusion region provided in the semiconductor substrate around the first element separation wall and the separation section and containing impurities of a second conductivity type having a conductivity type opposite to the first conductivity type.

Furthermore, according to the present disclosure, there is provided an electronic equipment including an imaging device. The imaging device includes a semiconductor substrate and a plurality of imaging elements that are arrayed in a matrix in a first direction and a second direction on the semiconductor substrate and perform photoelectric conversion on incident light. In the imaging device, each of the plurality of imaging elements includes: a plurality of pixels provided to be adjacent to one another in a predetermined unit region of the semiconductor substrate and including a photoelectric conversion section containing impurities of a first conductivity type; a separation section that separates the plurality of pixels; two first element separation walls provided to pierce through at least a part of the semiconductor substrate along two first side surfaces of the predetermined unit region extending in the second direction; an on-chip lens provided above a light receiving surface of the semiconductor substrate to be shared by the plurality of pixels; and a first diffusion region provided in the semiconductor substrate around the first element separation wall and the separation section and containing impurities of a second conductivity type having a conductivity type opposite to the first conductivity type.

DESCRIPTION OF EMBODIMENTS

Figure 1:
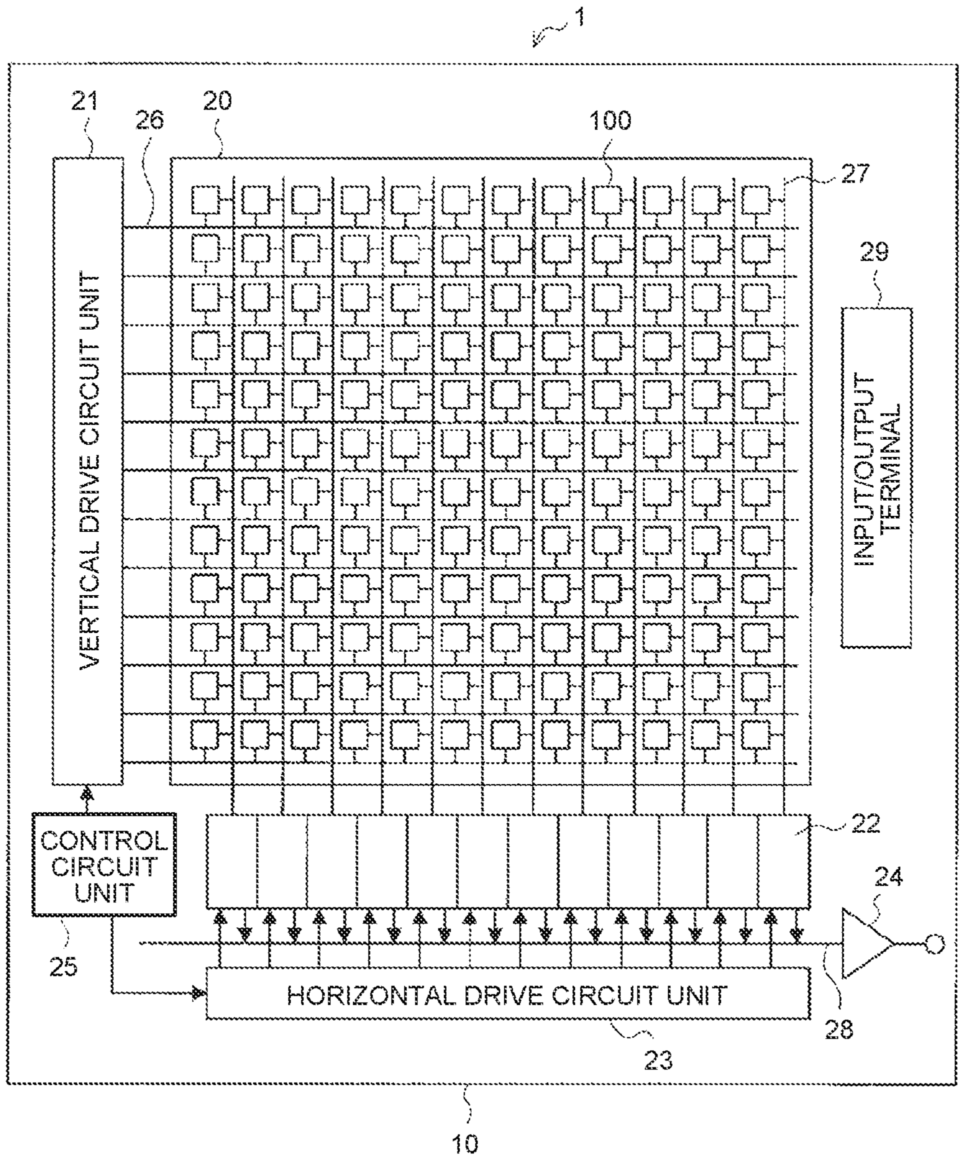
FIG. 1 is an explanatory diagram illustrating a planar configuration example of an imaging device 1 according to an embodiment of the present disclosure.

Preferred embodiments of the present disclosure are explained in detail below with reference to the accompanying drawings. Note that, in the present specification and the drawings, components having substantially the same functional configurations are denoted by the same reference numerals and signs, whereby redundant explanation of the components is omitted.

The drawings referred to in the following explanation are drawings for facilitating the explanation and understanding of an embodiment of the present disclosure. In order to clearly show the drawings, shapes, dimensions, ratios, and the like illustrated in the drawings are sometimes different from actual ones. Further, an imaging device illustrated in the drawings can be changed in design as appropriate in consideration of the following explanation and publicly known technologies.

Shapes and dimensions expressed in the following explanation mean not only shapes and dimensions defined mathematically or geometrically but also similar shapes and dimensions including differences (errors and distortions) to an allowable extent in an operation of the imaging device and a manufacturing process for the imaging device. Further, "same" used for specific shapes and dimensions in the following description does mean not only a case of complete mathematical or geometric matching but also a case of having a difference (error/distortion) to an allowable extent in the operation of the imaging device and the manufacturing process for the imaging device.

Further, in the following explanation, "electrically connect" means connecting a plurality of elements directly or indirectly via other elements.

Further, in the following explanation, "sharing" means that one other element (for example, an on-chip lens) is used together between elements (for example, pixels) different from each other.

Note that the explanation is made in the following order.

1. Schematic configuration of an imaging device
2. Comparative example
2.1 Background
2.2 Sectional configuration
2.3 Planar configuration
3. First embodiment
3.1 Background
3.2 Embodiment
3.3 Manufacturing method
3.4 Modification
4. Second embodiment
4.1 Background
4.2 Embodiment
4.3 Manufacturing method
4.4 Modification
5. Third embodiment
5.1 Background
5.2 Embodiment
5.3 Modification
6. Fourth embodiment
7. Summary
7.1 Summary
7.2 Other aspects
8. Application example to a camera
9. Application example to a smartphone
10. Application example to an endoscopic surgery system
11. Application example to a mobile body
12. Supplement

1. SCHEMATIC CONFIGURATION OF AN IMAGING DEVICE

First, a schematic configuration of an imaging device 1 according to an embodiment of the present disclosure is explained with reference to FIG. 1. FIG. 1 is an explanatory diagram illustrating a planar configuration example of the imaging device 1 according to the embodiment of the present disclosure. As illustrated in FIG. 1, the imaging device 1 according to the embodiment of the present disclosure includes a pixel array unit 20 in which a plurality of imaging elements 100 are arranged in a matrix on a semiconductor substrate 10 made of, for example, silicon, and peripheral circuit units provided to surround the pixel array unit 20. Further, the imaging device 1 includes, as the peripheral circuit units, a vertical drive circuit unit 21, a column signal processing circuit unit 22, a horizontal drive circuit unit 23, an output circuit unit 24, and a control circuit unit 25. In the following explanation, details of the blocks of the imaging device 1 are explained.

(Pixel Array Unit 20)

The pixel array unit 20 includes the plurality of imaging elements 100 two-dimensionally arranged in a matrix in a row direction (a first direction) and a column direction (a second direction) on the semiconductor substrate 10. The imaging elements 100 are elements that perform photoelectric conversion on incident light and includes a photoelectric conversion section (not illustrated) and a plurality of pixel transistors (for example, MOS (Metal-Oxide-Semiconductor) transistors) (not illustrated). The pixel transistors include, for example, four MOS transistors including a transfer transistor, a selection transistor, a reset transistor, and an amplification transistor. Further, in the pixel array unit 20, the plurality of imaging elements 100 are two-dimensionally arranged according to, for example, the Bayer array. Here, the Bayer array is an array pattern in which the imaging elements 100 that absorb light having a green wavelength (for example, a wavelength of 495 nm to 570 nm) and generate electric charges are arranged in a checkered pattern and the imaging elements 100 that absorb light having a red wavelength (for example, a wavelength of 620 nm to 750 nm) and generate electric charges and the imaging elements 100 that absorb light having a blue wavelength (for example, a wavelength of 450 nm to 495 nm) and generate electric charges are alternately arranged in the remaining portion for each column. Note that a detailed structure of the imaging element 100 is explained below.

(Vertical Drive Circuit Unit 21)

The vertical drive circuit unit 21 is formed by, for example, a shift register, selects a pixel drive wire 26, supplies a pulse for driving the imaging elements 100 to the selected pixel drive wire 26, and drives the imaging elements 100 in units of rows. That is, the vertical drive circuit unit 21 selectively scans the imaging elements 100 of the pixel array unit 20 sequentially in the vertical direction (the up-down direction in FIG. 1) in units of rows and supplies a pixel signal based on a signal charge generated according to a light reception amount of photoelectric conversion sections (not illustrated) of the imaging elements 100 to a column signal processing circuit unit 22 explained below through a vertical signal line 27.

(Column Signal Processing Circuit Unit 22)

The column signal processing circuit unit 22 is arranged for each column of the imaging elements 100 and performs, for each pixel column, signal processing such as noise removal on pixel signals output from the imaging elements 100 for one row. For example, the column signal processing circuit unit 22 performs signal processing such as CDS (Correlated Double Sampling and AD (Analog-Digital) conversion in order to remove fixed pattern noise unique to pixels.

(Horizontal Drive Circuit Unit 23)

The horizontal drive circuit unit 23 is formed by, for example, a shift register, sequentially selects each of the column signal processing circuit units 22 explained above by sequentially outputting horizontal scanning pulses, and causes each of the column signal processing circuit units 22 to output a pixel signal to a horizontal signal line 28.

(Output Circuit Unit 24)

The output circuit unit 24 performs signal processing on the pixel signals sequentially supplied from each of the column signal processing circuit units 22 explained above through the horizontal signal line 28 and outputs the pixel signals. The output circuit unit 24 may function as, for example, a functional unit that performs buffering or may perform processing such as black level adjustment, column variation correction, and various kinds of digital signal processing. Note that buffering means temporarily storing pixel signals in order to compensate for differences in processing speed and transfer speed when the pixel signals are exchanged. Further, an input/output terminal 29 is a terminal for exchanging signals with an external device.

(Control Circuit Unit 25)

The control circuit unit 25 receives an input clock and data for instructing an operation mode and the like and outputs data such as internal information of the imaging device 1. That is, the control circuit unit 25 generates, based on a vertical synchronization signal, a horizontal synchronization signal, and a master clock, a clock signal or a control signal serving as a reference for operations of the vertical drive circuit unit 21, the column signal processing circuit unit 22, the horizontal drive circuit unit 23, and the like. Then, the control circuit unit 25 outputs the generated clock signal and the generated control signal to the vertical drive circuit unit 21, the column signal processing circuit unit 22, the horizontal drive circuit unit 23, and the like.

2. COMPARATIVE EXAMPLE

2.1 Background

Next, details of the embodiment according to the present disclosure are explained, a comparative example studied by the present inventors before creating the embodiment according to the present disclosure is explained. First, a background of creating the comparative example is explained The comparative example compared with the embodiment of the present disclosure has been created during intensive studies on providing phase difference detection pixels on the entire surface of the pixel array unit 20 of the imaging device 1 (all-pixel phase difference detection) in order to further improve an autofocus function, that is, to improve the accuracy of phase difference detection while avoiding deterioration of a captured image. In the comparative example, the imaging element 100 functioning as one imaging element at the time of imaging and functioning as a pair of phase difference detection pixels at the time of phase difference detection is provided on the entire surface of the pixel array unit 20 (a dual photodiode structure). According to the comparative example that enables such all-pixel phase difference detection, since the phase difference detection pixels are provided on the entire surface, the accuracy of phase difference detection can be improve and, further, imaging can be performed by all imaging elements. Therefore, deterioration of a captured image can be avoided.

Further, in the comparative example, in order to improve the accuracy of phase difference detection, an element for physically and electrically separating the phase difference detection pixels for preventing outputs of the pair of phase difference detection pixels from being mixed at the time of the phase difference detection is provided. In addition, in the comparative example, an overflow path is provided between the pair of phase difference detection pixels in order to avoid deterioration of a captured image. Specifically, at the time of normal imaging, when electric charges of any one pixel of the phase difference detection pixels is about to be saturated, the saturation of the one pixel can be avoided by moving the electric charges to the other pixel via the overflow path. Then, by providing such an overflow path, the linearity of a pixel signal output from the imaging element can be secured and deterioration of a captured image can be prevented.

Details of such a comparative example are sequentially explained below.

2.2 Sectional Configuration

Figure 2:
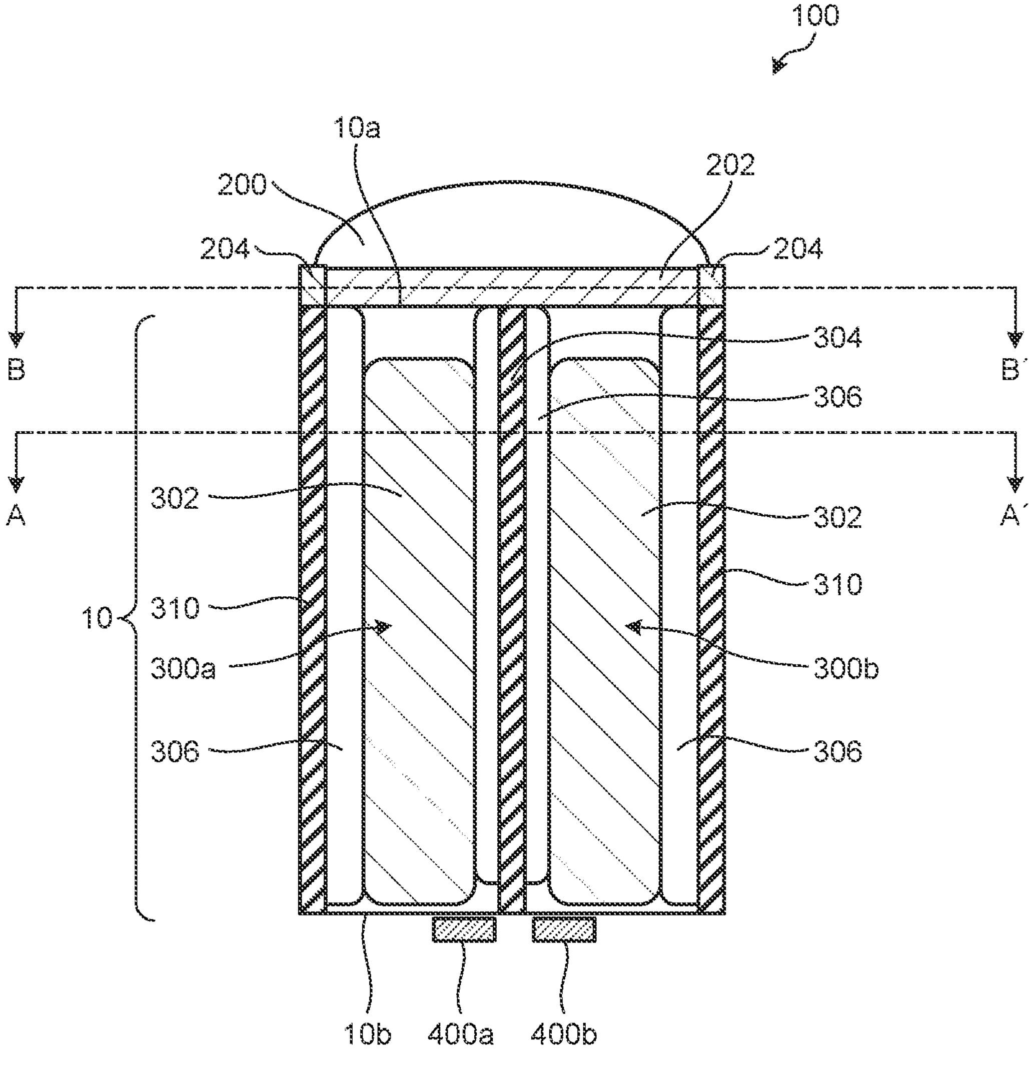
FIG. 2 is an explanatory diagram (part 1) illustrating a part of a cross section of an imaging element 100 according to a comparative example.
Figure 3:
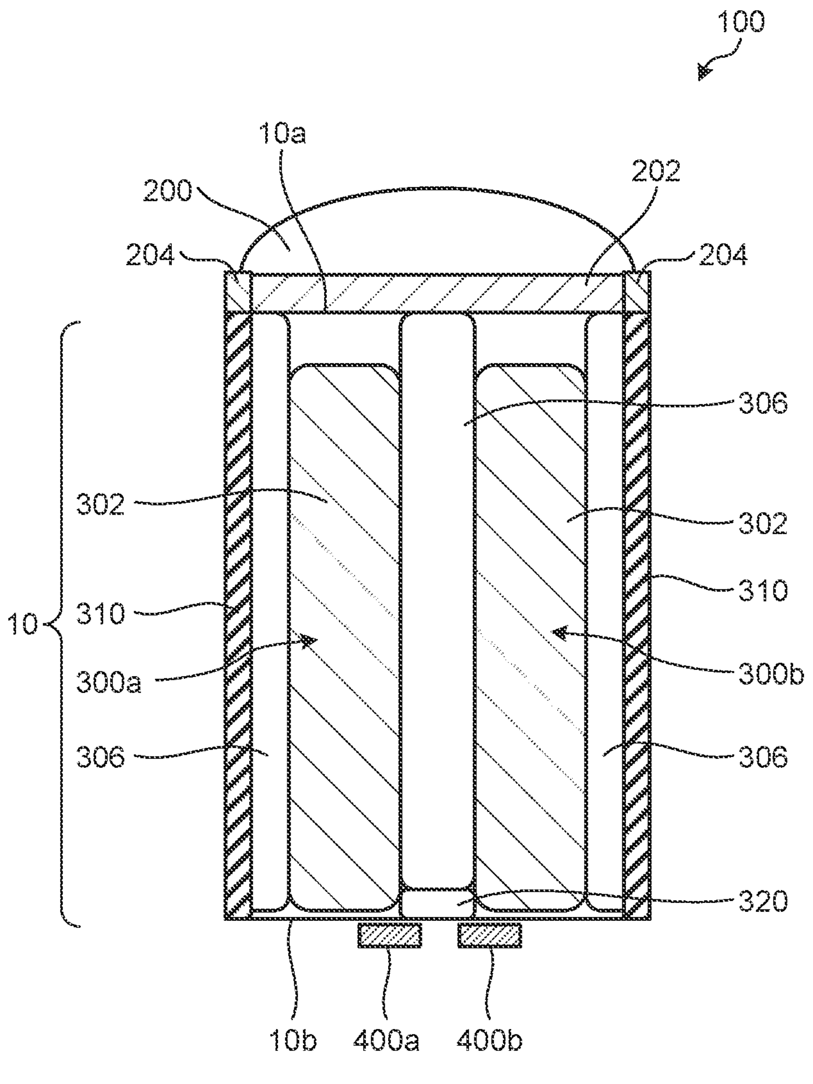
FIG. 3 is an explanatory diagram (part 2) illustrating the part of the cross section of the imaging element 100 according to the comparative example.

First, a sectional configuration of the imaging element 100 according to the comparative example is explained with reference to FIG. 2 and FIG. 3. FIG. 2 and FIG. 3 are explanatory diagrams illustrating a part of a cross section of the imaging element 100 according to the comparative example and, specifically, correspond to cross sections of the imaging element 100 taken along the thickness direction of the semiconductor substrate 10 in different positions.

As illustrated in FIG. 2 and FIG. 3, the imaging element 100 according to the comparative example includes an on-chip lens 200, a color filter 202, a light blocking section 204, a semiconductor substrate 10, and transfer gates 400*a* and 400*b*. Further, in the present embodiment, the semiconductor substrate 10 includes a pair of pixels 300*a* and 300*b* respectively including photoelectric conversion sections 302. In addition, the semiconductor substrate 10 includes a projecting section (a pixel separation region) 304 (an example of a separation section) for separating the pair of pixels 300*a* and 300*b* and includes an element separation wall 310 surrounding the pixels 300*a* and 300*b* and diffusion regions (first diffusion regions) 306 provided around the projecting section 304 and the element separation wall 310.

In the following explanation, a stacked structure of the imaging element 100 according to the comparative example is explained. However, in the following explanation, explanation is made in order from the upper side (a light receiving surface 10 a side) to the lower side in FIG. 2 and FIG. 3. Note that FIG. 2 corresponds to a cross section of the imaging element 100 taken along a position where the projecting section 304 explained above is cut and FIG. 3 corresponds to a cross section of the imaging element 100 taken along a position where a region between projecting sections 304 facing each other (a slit 312, see FIG. 4) is cut.

As illustrated in FIG. 2 and FIG. 3, the imaging element 100 includes one on-chip lens 200 that is provided above a light receiving surface 10*a* of the semiconductor substrate 10 and condenses incident light on the photoelectric conversion sections 302. The imaging element 100 has structure in which the pair of pixels 300*a* and 300*b* is provided for one on-chip lens 200. That is, the on-chip lens 200 is shared by the two pixels 300*a* and 300*b*. Note that the on-chip lens 200 can be formed by, for example, a silicon nitride film (SiN) or a resin material such as styrene resin, acrylic resin, styrene-acrylic copolymer resin, o siloxane resin.

Then, the incident light condensed by the on-chip lens 200 is emitted to each of the photoelectric conversion sections 302 of the pair of pixels 300*a* and 300*b* via the color filter 202 provided below the on-chip lens 200. The color filter 202 is any of a color filter that transmits a red wavelength component, a color filter that transmits a green wavelength component, and a color filter that transmits a blue wavelength component. For example, the color filter 202 can be formed of, for example, a material in which a pigment or a dye is dispersed in a transparent binder such as silicone.

Further, the light blocking section 204 is provided on the light receiving surface 10*a* of the semiconductor substrate 10 to surround the color filter 202. Since the light blocking section 204 is provided between the imaging elements 100 adjacent to each other, it is possible to perform light blocking between the imaging elements 100 in order to suppress crosstalk between the adjacent imaging elements 100 and further improve accuracy in phase difference detection. The light blocking section 204 can be formed of, for example, a metal material or the like containing tungsten (W), aluminum (Al), copper (Cu), titanium (Ti), molybdenum (Mo), nickel (Ni), or the like.

Moreover, for example, in a predetermined unit region in the semiconductor substrate 10 of a second conductivity type (for example, a p-type), the photoelectric conversion sections (photodiodes) 302 having impurities of a first conductivity type (for example, an n-type) is provided for each of the pixels 300*a* and 300*b* adjacent to each other. As explained above, the photoelectric conversion sections 302 absorb light having a red wavelength component, a green wavelength component, or a blue wavelength component made incident through the color filter 202 and generate electric charges. Then, in the present embodiment, the photoelectric conversion section 302 of the pixel 300*a* and the photoelectric conversion section 302 of the pixel 300*b* can function as a pair of phase difference detection pixels at the time of phase difference detection. That is, in the present embodiment, a phase difference can be detected by detecting a difference between pixel signals based on the electric charges generated by the photoelectric conversion section 302 of the pixel 300*a* and the photoelectric conversion section 302 of the pixel 300*b*.

Specifically, an amount of electric charges to be generated, that is, the sensitivity of the photoelectric conversion sections 302 changes depending on an incident angle of light with respect to the optical axes (axes perpendicular to light receiving surfaces) of the photoelectric conversion sections 302. For example, the photoelectric conversion sections 302 have the highest sensitivity when the incident angle is 0 degrees. Further, the sensitivity of the photoelectric conversion sections 302 has, with respect to the incident angle, a symmetrical relation in which the optical axes are symmetrical axes when the incident angle is 0 degree. Therefore, in the photoelectric conversion section 302 of the pixel 300*a* and the photoelectric conversion section 302 of the pixel 300*b*, light from the same point is made incident at different incident angles and electric charges of amounts corresponding to the incident angles are generated. Therefore, a shift (a phase difference) occurs in a detected image. That is, the phase difference can be detected by detecting a difference between pixel signals based on electric charge amounts generated by the photoelectric conversion section 302 of the pixel 300*a* and the photoelectric conversion section 302 of the pixel 300*b*. Therefore, such a difference (phase difference) between the pixel signals is detected as, for example, a difference signal in a detecting unit (not illustrated) of the output circuit unit 24, a defocus amount is calculated based on the detected phase difference, and an image forming lens (not illustrated) is adjusted (moved), whereby autofocus can be realized. Note that, in the above explanation, it is explained that the phase difference is detected as the difference between the pixel signals of the photoelectric conversion section 302 of the pixel 300*a* and the photoelectric conversion section 302 of the pixel 300*b*. However, in the present embodiment, not only this, but, for example, the phase difference may be detected as a ratio of the pixel signals of the photoelectric conversion section 302 of the pixel 300*a* and the photoelectric conversion section 302 of the pixel 300*b*.

Further, in the comparative example, the two photoelectric conversion sections 302 are physically separated by the projecting section 304 (the pixel dividing region) (an example of a separation section). The projecting section 304 includes a groove section (a trench) (not illustrated) provided as a through-DTI (Deep Trench Isolation) pierce through the semiconductor substrate 10 from a front surface 10*b* side opposite to the light receiving surface 10*a* in the thickness direction of the semiconductor substrate 10 and a material embedded in the trench and made of an oxide film or a metal film such as a silicon oxide film (SiO), a silicon nitride film, amorphous silicon, polycrystalline silicon, a titanium oxide film (TiO), aluminum, or tungsten. In the imaging element 100, at the time of phase difference detection, when the pixel signals output by the pair of pixels 300*a* and 300*b* are mixed with each other and color mixing occurs, accuracy of phase difference detection is deteriorated. In the present embodiment, since the projecting section 304 pierces through the semiconductor substrate 10, the pair of pixels 300*a* and 300*b* can be physically separated effectively. As a result, the occurrence of color mixing can be suppressed and the accuracy of the phase difference detection can be further improved.

Further, when the imaging element 100 is viewed from the light receiving surface 10*a* side or the front surface 10*b* side, the slit 312 (see FIG. 4) corresponding to a space between the two projecting sections 304 is provided near the center of the imaging element 100. In a region of the slit 312 (an example of a region located around the projecting section 304 and extending in the thickness direction of the semiconductor substrate 10) in the semiconductor substrate 10, impurities of the second conductivity type (for example, the p-type) are diffused via the trench of the projecting section 304 by conformal doping and the diffusion regions 306 are formed (specifically, as explained below, the diffusion regions 306 are also formed around the element separation wall 310.). By providing the diffusion regions 306, the pair of pixels 300*a* and 300*b* can be electrically not to cause color mixing. Therefore, the accuracy of phase difference detection can be further improved.

Further, in the comparative example, since the projecting section 304 pierces through the semiconductor substrate 10, the diffusion regions 306 can be formed deep (here, depth is a distance from the light receiving surface 10*a* of the semiconductor substrate 10 in the thickness direction of the semiconductor substrate 10) in the semiconductor substrate 10 by conformal doping via the projecting section 304. Therefore, in the comparative example, since desired diffusion regions 306 can be accurately formed, the pair of pixels 300*a* and 300*b* can be effectively electrically separated. As a result, the occurrence of color mixing can be suppressed and the accuracy of the phase difference detection can be further improved. Note that details of the region of the slit 312 is explained below.

Further, in the comparative example, as illustrated in FIG. 3, impurities of the first conductivity type (for example, the n-type) are introduced by ion implantation below the diffusion regions 306 (on the surface 10*b* side) provided in the slit 312, whereby a diffusion region 320 is formed. Specifically, the impurities of the first conductivity type are ion-injected into a lower region in the diffusion regions 306 explained above, whereby the diffusion region 320 is formed below the diffusion regions 306. The diffusion region 320 can function as an overflow path (In this specification, sometimes referred to as "path" as well) that can exchange generated electric charges between the pixels 300*a* and 300*b*. Specifically, at the time of normal imaging, when electric charges of one pixel of the pixels 300*a* and 300*b* is about to be saturated, the electric charges are moved to the other pixel via the overflow path, whereby the saturation of one pixel can be avoided. Then, by providing such an overflow path, the linearity of the pixel signal output from the imaging element 100 can be secured and deterioration of a captured image can be prevented. In the comparative example, instead of forming the diffusion region 320 with ion implantation, a gate (not illustrated) may be provided between the transfer gates 400*a* and 400*b* on the front surface 10*b* of the semiconductor substrate 10. In this case, by adjusting a voltage applied to the gate, the pair of pixels 300*a* and 300*b* may be electrically separated at the time of phase difference detection and a channel serving as an overflow path may be formed in a region on the surface 10*b* side of the slit 312 at the time of normal imaging.

In the comparative example, the element separation wall 310 surrounding the pixels 300*a* and 300*b* and physically separating the imaging elements 100 adjacent to each other is provided in the semiconductor substrate 10. The element separation wall 310 includes a groove section (a trench) (not illustrated) provided to pierce through the semiconductor substrate 10 in the thickness direction of the semiconductor substrate 10 and the material embedded in the trench and made of an oxide film or a metal film such as a silicon oxide film, a silicon nitride film, amorphous silicon, polycrystalline silicon, a titanium oxide film, aluminum, or tungsten. That is, the projecting section 304 and the element separation wall 310 may be formed of the same material. Note that, in the comparative example, since the element separation wall 310 and the projecting section 304 have the same configuration, the element separation wall 310 and the projecting section 304 can have an integrated form and, therefore, can be formed simultaneously. As a result, according to the comparative example, since the projecting section 304 can be formed simultaneously with the element separation wall 310, an increase in process steps for the imaging element 100 can be suppressed.

Further, in the comparative example, the diffusion regions 306 can be formed deep (here, depth is a distance from the light receiving surface 10*a* of the semiconductor substrate 10 in the thickness direction of the semiconductor substrate 10) in the semiconductor substrate 10 around the element separation wall 310 by conformal doping of impurities of the second conductivity type (for example, the p-type) via the element separation wall 310.

Further, in the comparative example, the electric charges generated in the photoelectric conversion section 302 of the pixel 300*a* and the photoelectric conversion section 302 of the pixel 300*b* are transferred via the transfer gates 400*a* and 400*b* of the transfer transistors (one type of the pixel transistors explained above) provided on the surface 10*b* located on the opposite side of the light receiving surface 10*a* of the semiconductor substrate 10. The transfer gates 400*a* and 400*b* can be formed of, for example, a metal film. Then, the electric charges may be stored in, for example, a floating diffusion section (a charge storage section) (not illustrated) provided in a semiconductor region having the first conductivity type (for example, the n-type) provided in the semiconductor substrate 10. Note that, in the comparative example, the floating diffusion section is not limited to be provided in the semiconductor substrate 10 and may be provided, for example, on another substrate (not illustrated) stacked on the semiconductor substrate 10.

Further, on the front surface 10*b* of the semiconductor substrate 10, a plurality of various pixel transistors (not illustrated) other than the transfer transistors explained above, which are used for, for example, reading electric charges as pixel signal, may be provided. Further, in the comparative example, the pixel transistors may be provided on the semiconductor substrate 10 or may be provided on another substrate (not illustrated) stacked on the semiconductor substrate 10.

2.3 Planar Configuration

Figure 4:
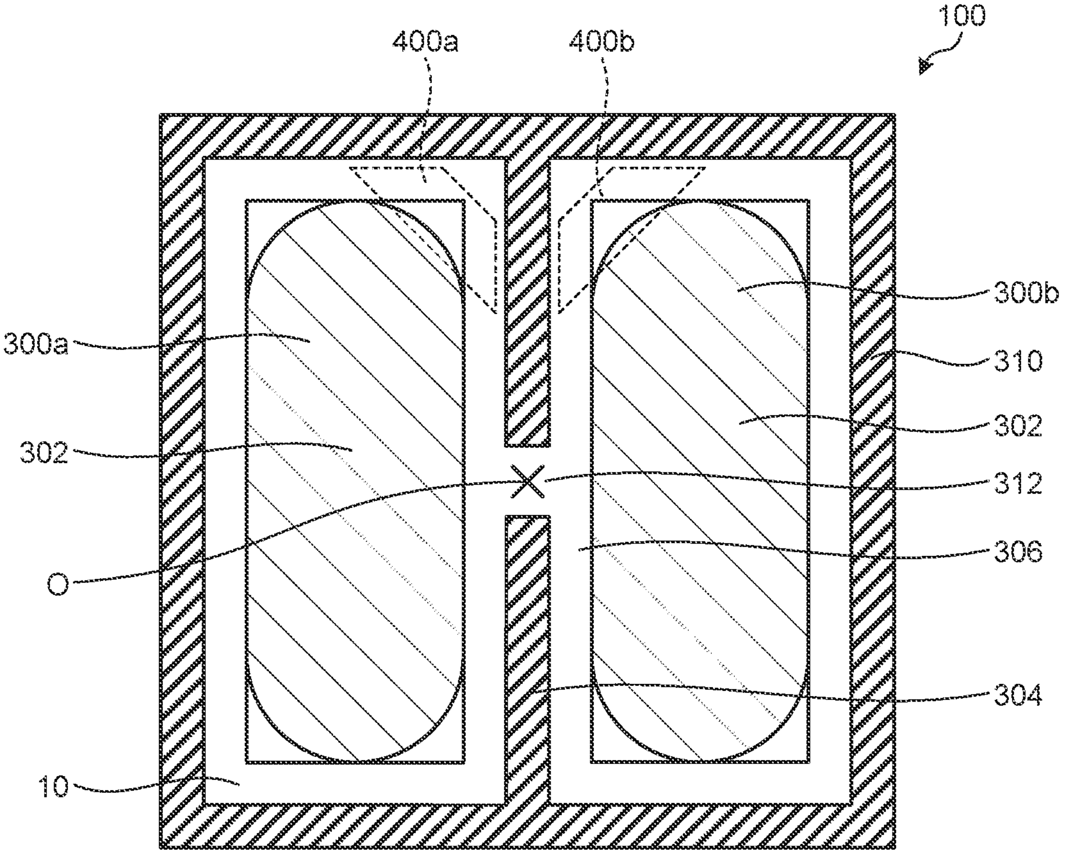
FIG. 4 is an explanatory diagram illustrating a plane of the imaging element 100 according to the comparative example.

Next, a planar configuration of the imaging element 100 according to the comparative example is explained with reference to FIG. 4. FIG. 4 is an explanatory diagram illustrating a plane of the imaging element 100 according to the comparative example and, specifically, corresponds to a cross section of the imaging element 100 taken along line A-A' illustrated in FIG. 3.

As illustrated in FIG. 4, in the comparative example, the pixels 300*a* and 300*b* adjacent to each other are separated by the projecting section 304 formed integrally with the element separation wall 310. Specifically, when the imaging element 100 is viewed from above the light receiving surface 10*a* or the front surface 10*b*, the element separation wall 310 includes the two projecting sections 304 projecting in the column direction toward the center O of the imaging element 100 and facing each other. Here, when the imaging element 100 is viewed from the light receiving surface 10*a* side or the front surface 10*b* side, a region between the two projecting sections 304 located near the center of the imaging element 100 is referred to as a slit 312. In the region of the slit 312, as explained above, the impurities of the second conductivity type (for example, the p-type) are diffused via the trench of the projecting section 304 by conformal doping and the diffusion regions 306 are formed to surround the projecting section 304. As explained above, the diffusion regions 306 can electrically separate the pair of pixels 300*a* and 300*b* and prevent color mixing. Further, in the comparative example, the impurities of the second conductivity type are diffused via the trench of the element separation wall 310 by conformal doping and the diffusion regions 306 are formed along the element separation wall 310.

Further, the two projecting sections 304 are provided in the center of the imaging element 100 in the row direction when the imaging element 100 is viewed from above the light receiving surface 10*a* or the surface 10*b*. Projecting lengths (lengths in the column direction) of the projecting sections 304 are substantially the same. As explained above, the two projecting sections 304 are provided to pierce through the semiconductor substrate 10. Note that, in the comparative example, the width of the projecting section 304 is not particularly limited as long as the pair of pixels 300*a* and 300*b* can be separated.

Figure 5:
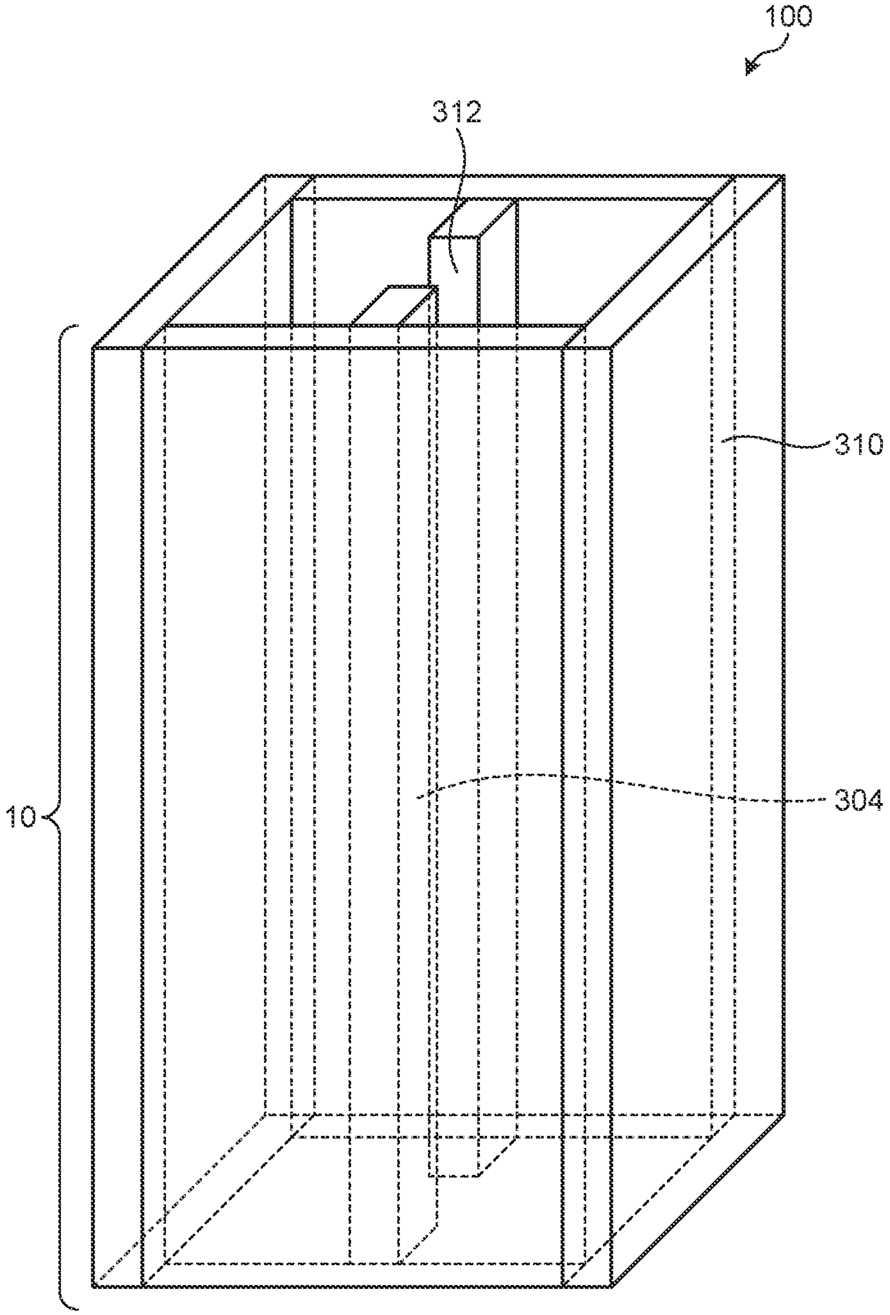
FIG. 5 is a transparent perspective view of the imaging element 100 according to the comparative example.

Further, the projecting section 304 and the element separation wall 310 according to the comparative example explained above have a form as illustrated in FIG. 5, which is a transparent perspective view of the imaging element 100 according to the comparative example. That is, the projecting section 304 and the element separation wall 310 according to the comparative example are provided to pierce through the semiconductor substrate 10. Further, the slit 312 is provided near the center of the imaging element 100 between the two projecting sections 304. Note that the diffusion regions 306 are formed in at least a part in the slit 312.

As explained above, in the comparative example, since the slit 312 is provided near the center O of the imaging element 100, scattering of light by the projecting section 304 is suppressed. Therefore, according to the comparative example, light made incident on the center O of the imaging element 100 can be made incident on the photoelectric conversion sections 302 without being scattered. As a result, according to the comparative example, since the imaging element 100 can more reliably capture light made incident on the center O of the imaging element 100, deterioration of imaging pixels can be avoided.

Further, in the comparative example, as explained above, for example, the impurities of the first conductivity type are introduced into the region on the surface 10*b* side of the slit 312 by ion implantation and the channel serving as the overflow path can be formed. Therefore, according to the comparative example, it is possible to form the overflow path at the time of normal imaging while separating the pair of pixels 300*a* and 300*b* at the time of phase difference detection. Therefore, it is possible to avoid deterioration of a captured image while improving the accuracy of phase difference detection.

Further, in the comparative example, it is possible to introduce impurities into the region of the slit 312 through the trench of the projecting section 304 with conformal doping and form the diffusion regions 306. Therefore, use of ion implantation can be avoided. Therefore, according to the comparative example, since the ion implantation is not used, it is possible to avoid introduction of impurities into the photoelectric conversion sections 302 and it is possible to avoid a reduction of and damage to the photoelectric conversion sections 302. Further, by using the conformal doping, it is possible to repair crystal defects while uniformly diffusing impurities by applying a high temperature. As a result, according to the comparative example, it is possible to suppress deterioration in sensitivity and a reduction of a dynamic range of the imaging element 100.

Note that the conformal doping is a method of uniformly introducing impurities into the semiconductor substrate 10. Specifically, uniformization of impurities is realized using plasma doping, vapor phase decomposition (VPD), solid phase diffusion, thermal diffusion, or the like. Compared with such conformal doping, the ion implantation method used for impurity introduction has an impurity distribution having a peak depending on implantation energy. Therefore, it is difficult to uniformly introduce impurities.

Note that, in the comparative example, when the imaging element 100 is viewed from above the light receiving surface 10*a* or the surface 10*b*, the element separation wall 310 may include two projecting sections 304 projecting in the row direction toward the center O of the imaging element 100 and facing each other. Further, in this case, the two projecting sections 304 may be provided in the center of the imaging element 100 in the column direction when the imaging element 100 is viewed from above the light receiving surface 10*a* or the surface 10*b*.

As explained above, according to the comparative example, at the time of phase difference detection, since the diffusion regions 306 electrically separated from the projecting section 304 that physically separates the pair of pixels 300*a* and 300*b*, the diffusion region 320 that electrically separates the pair of pixels 300*a* and 300*b*, and the like are provided, it is possible to avoid deterioration in a captured image while improving the accuracy of phase difference detection. Specifically, in the comparative example, the pair of pixels 300*a* and 300*b* can be effectively separated by the projecting section 304 and the diffusion regions 306. As a result, it is possible to suppress occurrence of color mixing and further improve the accuracy of phase difference detection. Further, in the comparative example, since the overflow path is provided, when electric charges of any one pixel of the pixels 300*a* and 300*b* is about to be saturated at the time of normal imaging, saturation of one pixel can be avoided by transferring the electric charges to the other pixel via the overflow path. Therefore, according to the comparative example, by providing such an overflow path, it is possible to secure the linearity of a pixel signal output from the imaging element 100 and prevent deterioration of a captured image.

Further, in the comparative example, since the diffusion regions 306 can be formed by diffusing impurities to the region of the slit 312 through the trench of the projecting section 304 with conformal doping, use of ion implantation can be avoided. Therefore, according to the comparative example, since the ion implantation is not used, it is possible to avoid introduction of impurities into the photoelectric conversion sections 302 and it is possible to avoid a reduction of and damage to the photoelectric conversion sections 302. Further, by using the conformal doping, it is possible to repair crystal defects while uniformly diffusing impurities by applying a high temperature. As a result, according to the comparative example, it is possible to suppress deterioration in sensitivity and a reduction of a dynamic range of the imaging element 100.

In the comparative example, since the projecting section 304 pierces through the semiconductor substrate 10, the diffusion regions 306 can be formed in a deep region in the semiconductor substrate 10 by conformal doping via the projection section 304. Therefore, in the comparative example, since desired diffusion regions 306 can be accurately formed, the pair of pixels 300*a* and 300*b* can be effectively electrically separated. As a result, the occurrence of color mixing can be suppressed and the accuracy of the phase difference detection can be further improved. According to the comparative example, since the element separation wall 310 and the projecting section 304 have the same form, the projecting section 304 can be formed simultaneously with the element separation wall 310. An increase in process steps for the imaging element 100 can be suppressed.

In addition, in the comparative example, since the slit 312 is provided in the center O of the imaging element 100, scattering of light by the projecting section 304 is suppressed and light made incident on the center O of the imaging element 100 can be made incident on the photoelectric conversion sections 302 without being scattered. As a result, according to the comparative example, since the imaging element 100 can more reliably capture light made incident on the center O of the imaging element 100, deterioration of imaging pixels can be avoided.

In the following explanation, details of embodiments of the present disclosure created by the present inventors are sequentially explained based on the comparative example explained above.

3. FIRST EMBODIMENT

3.1 Background

Next, a first embodiment of the present disclosure created by the present inventors is explained. First, a background leading to the creation of the first embodiment is explained.

In the imaging element 100 according to the comparative example, it is inevitable that the photoelectric conversion sections 302 (the photodiodes) are reduced in size by the element separation wall 310 surrounding the imaging element 100 and the diffusion regions 306 provided around the element separation wall 310 and the projecting section 304. In particular, when the imaging element 100 is further refined, since the photoelectric conversion sections 302 are small, there is a limit to an amount of electric charges to be generated even if a large amount of light is made incident on the imaging element 100. In other words, in the comparative example, there is a limit in increasing a saturation signal amount (Qs) of the imaging element 100. In addition, in the comparative example, since the element separation wall 310 is provided in the row direction and the column direction, there is a limit in a range in which the transfer gates 400*a* and 400*b*, various pixel transistors (not illustrated), the floating diffusion section (the charge storage section) (not illustrated), and the like can be arranged. In the comparative example, flexibility of a layout is low.

Therefore, the present inventors have created the first embodiment of the present disclosure in order to further improve flexibility of a layout while further increasing the saturation signal amount (Qs) in the imaging element 100 according to such a comparative example.

3.2 Embodiment

Figure 6:
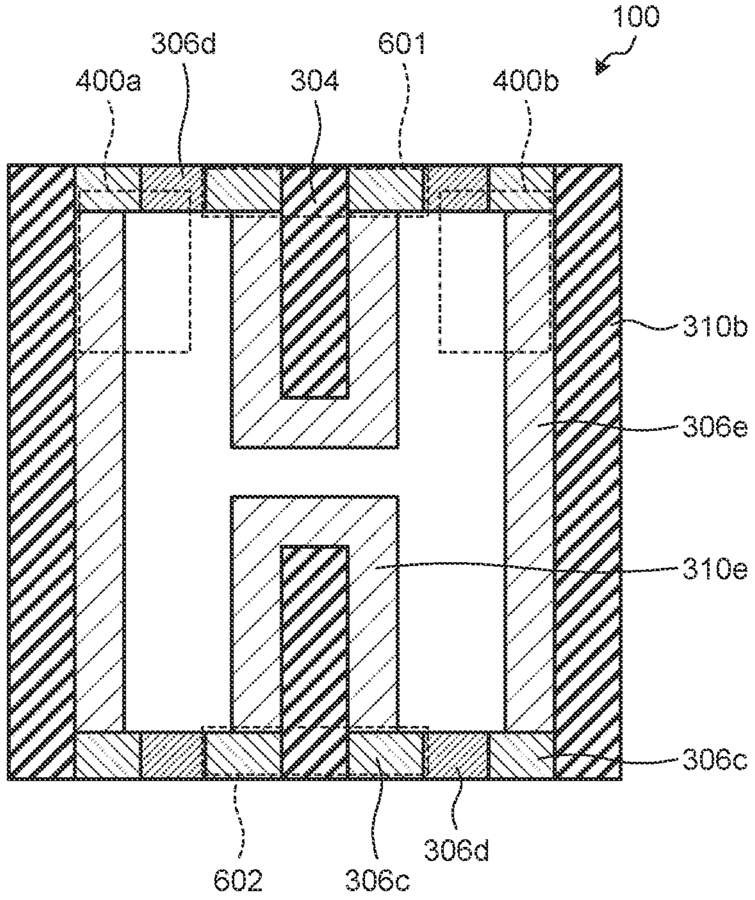
FIG. 6 is a plan view of the imaging element 100 according to a first embodiment of the present disclosure.

First, a planar configuration of the present embodiment is explained with reference to FIG. 6. FIG. 6 is a plan view of the imaging element 100 according to the first embodiment of the present disclosure and is a plan view of the imaging element 100 viewed from above the front surface 10*b* of the semiconductor substrate 10. Note that, in FIG. 6, the transfer gates 400*a* and 400*b*, a floating diffusion section (FD section) (a charge storage section) 601, and a ground section (a well region) 602 provided on the front surface 10*b* side are indicated by broken lines to facilitate understanding. In the following explanation, elements common to the comparative example are denoted by the same reference numerals and signs in the figures, and explanation of the elements is omitted.

Whereas the element separation wall 310 is provided in the row direction (the first direction) and the column direction (the second direction) in the comparative example, in the present embodiment, as illustrated in FIG. 6, element separation walls (first element separation walls) 310*b* are provided only in the column direction (the second direction) (the up-down direction in FIG. 6). Specifically, two element separation walls 310*b* are provided to pierce through at least a part or the entire semiconductor substrate 10 from the front surface 10*b* along two side surfaces (first side surfaces) extending in the column direction in a predetermined unit region (the entire region illustrated in FIG. 6) in which the imaging element 100 is provided in the semiconductor substrate 10. Note that, in the present embodiment, since the plurality of imaging elements 100 are arranged in a matrix, each of the element separation walls 310*b* and each the projecting sections 304 adjacent to each other in the column direction are provided to be connected to each other.

Further, in the present embodiment, the imaging elements 100 adjacent in the row direction (the first direction) are physically and electrically separated by the element separation walls 310*b*. However, unlike the comparative example, the element separation wall 310 in the row direction is not provided. Therefore, there is no element that separates the imaging elements 100 adjacent to each other in the column direction (the second direction). Therefore, there is a high possibility that color mixing occurs between the imaging elements 100 adjacent to each other in the column direction. Therefore, in the present embodiment, in order to electrically separate the imaging elements 100 adjacent to each other in the column direction, a diffusion region (a second diffusion region) 306*d* is provided between the imaging elements 100 adjacent to each other in the column direction. Specifically, as illustrated in FIG. 6, in the present embodiment, the diffusion region 306*d* can be formed by diffusing impurities of the second conductivity type (for example, the p-type) along and around two side surfaces (second side surfaces) extending in the row direction of the predetermined unit region (the entire region illustrated in FIG. 6) in which the imaging element 100 is provided in the semiconductor substrate 10. In the present embodiment, at least a part of the diffusion region 306*d* (a diffusion region 306*c* in FIG. 6) contains impurities of the second conductivity type at higher concentration compared with a diffusion region (a first diffusion region) 306*e* around the element separation wall 310 and the projecting section 304.

As explained above, in the present embodiment, by providing the element separation walls 310*b* only in the column direction (the second direction) and providing the diffusion region (the second diffusion region) 306*d* between the imaging elements 100 adjacent to each other in the column direction, the imaging elements 100 adjacent in the column direction can be electrically separated. Therefore, in the present embodiment, since the element separation wall 310 in the row direction is not provided, the photoelectric conversion sections 302 (the photodiodes) can be increased in size compared with the comparative example. As a result, according to the present embodiment, the saturation signal amount (Qs) of the imaging element 100 can be further increased.

In addition, in the present embodiment, since the element separation wall 310 in the row direction is not provided, a range in which the transfer gates 400*a* and 400*b*, the various pixel transistors (not illustrated), the floating diffusion section (the charge storage section) 601, the ground section 602, and the like can be arranged is widened. As a result, according to the present embodiment, flexibility of a layout is improved.

Further, in the present embodiment, since the element separation walls 310*b* are provided only in the column direction (the second direction) and the element separation wall 310 is not provided in the row direction (the first direction), the element separation wall 310 is not formed in a lattice shape (in plan view). Therefore, according to the present embodiment, since the element separation walls 310*b* can be formed in a simple shape, the element separation walls 310*b* can be formed more accurately and the rectangularity of the element separation walls 310*b* can be improved.

Note that, in the above explanation, the element separation walls 310*b* are provided only in the column direction (the second direction). However, in the present embodiment, conversely, the element separation wall 310 may be provided only in the row direction (the first direction). In this case, in order to electrically separate the imaging elements 100 adjacent to each other in the row direction, the diffusion region (the second diffusion region) 306*d* is provided between the imaging elements 100 adjacent to each other in the row direction.

3.3 Manufacturing Method (Manufacturing Method 1)

Figure 7A:
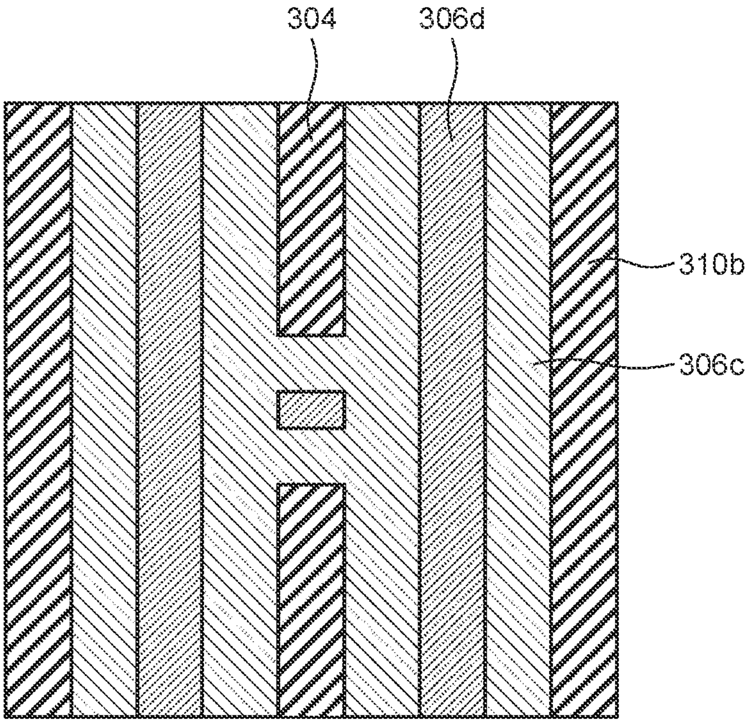
FIG. 7A is a plan view (part 1) for explaining a part of the manufacturing process of a manufacturing method 1 for the imaging element 100 according to the first embodiment of the present disclosure.
Figure 7B:
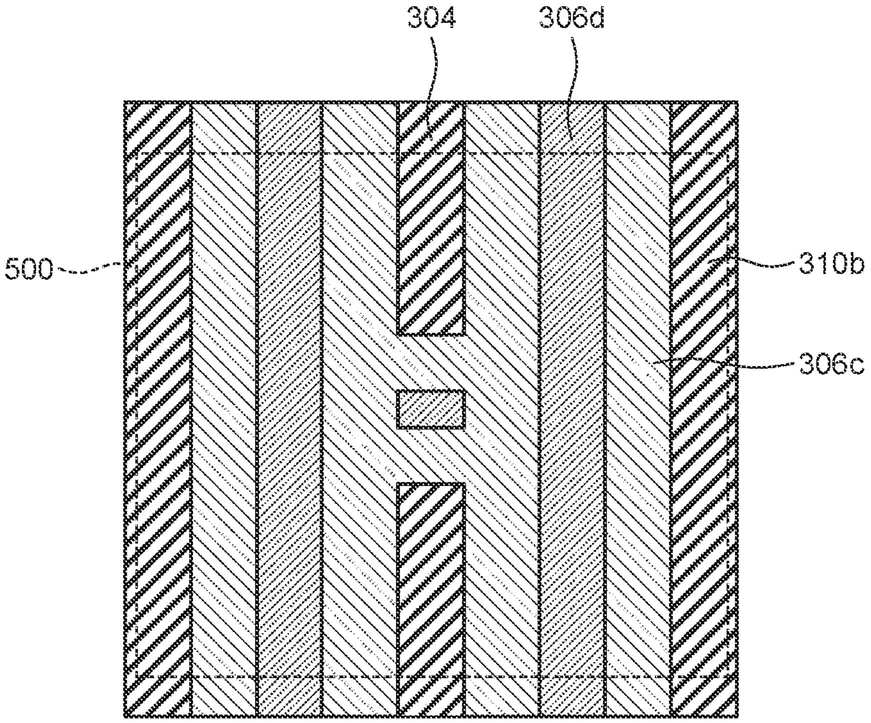
FIG. 7B is a plan view (part 2) for explaining the part of the manufacturing process of the manufacturing method 1 for the imaging element 100 according to the first embodiment of the present disclosure.
Figure 7C:
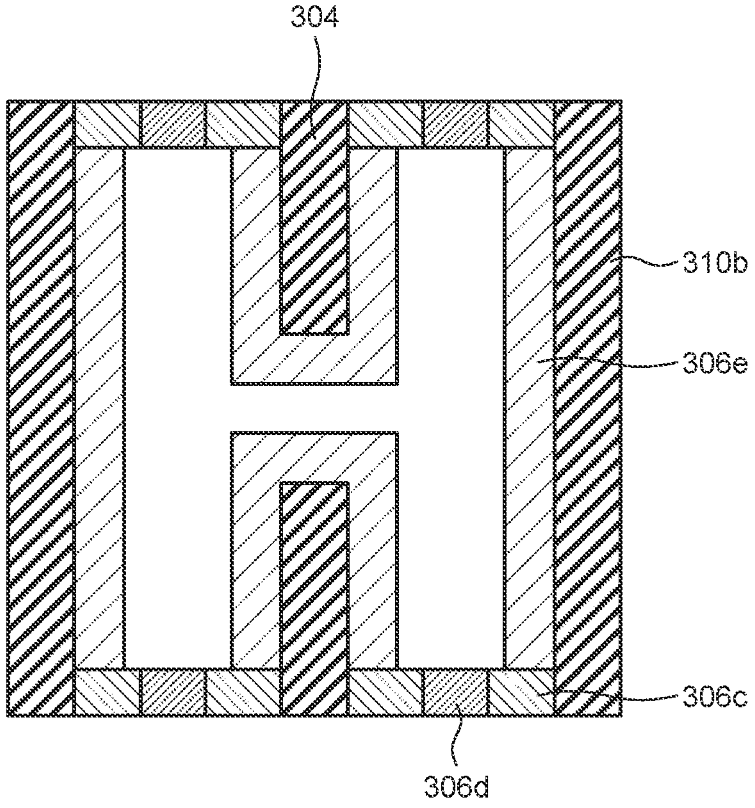
FIG. 7C is a plan view (part 3) for explaining the part of the manufacturing process of the manufacturing method 1 for the imaging element 100 according to the first embodiment of the present disclosure.

Next, a part of a manufacturing process (a manufacturing method) for the imaging element 100 according to the present embodiment is explained with reference to FIG. 7A to FIG. 7C. FIG. 7A to FIG. 7C are plan views for explaining a part of a manufacturing process of a manufacturing method 1 for the imaging element 100 according to the first embodiment of the present disclosure and, specifically, correspond to the plan view illustrated in FIG. 6.

First, in order to form the element separation wall 310*b* and the projecting section 304 in the semiconductor substrate 10, a trench is formed at a predetermined position of the semiconductor substrate 10, and a material (For example, polysilicon) containing impurities of the second conductivity type (For example, p-type) is formed in the trench. Further, the material containing the impurities in the trench is removed by dry etching to be left on the inner wall surface of the trench. Subsequently, by applying heat to the semiconductor substrate 10, the impurities are diffused from the material to the semiconductor substrate 10. That is, the diffusion regions 306 are formed by conformal doping. Subsequently, by forming an insulating material in the trench, a form illustrated in FIG. 7A can be obtained.

Further, in the present embodiment, impurities of the first conductivity type (for example, the n-type) are ion-implanted (patterned) into a region 500 illustrated in FIG. 7B using a mask or the like. Note that an amount of the impurities implanted at this time is smaller than an amount for electrically cancelling impurities of the second conductivity type (for example, the p-type) already included in the diffusion regions 306.

In this way, as illustrated in FIG. 7C, the diffusion region 306*d* (including the diffusion region 306*c*) containing high-concentration impurities of the second conductivity type (for example, the p-type) and the diffusion region 306*e* containing low-concentration impurities of the second conductivity type can be separately formed because a part of the impurities of the second conductivity type is electrically cancelled by the impurities of the first conductivity type (for example, the n-type) implanted later.

(Manufacturing Method 2)

Next, the imaging element 100 according to the present embodiment can also be formed by another method (anisotropic conformal doping). A part of the manufacturing process (the manufacturing method) for the manufacturing method 2 is explained with reference to FIG. 8A to FIG. 8E. FIG. 8A to FIG. 8E are plan views for explaining a part of the manufacturing process for the manufacturing method 2 for the imaging element 100 according to the first embodiment of the present disclosure and, specifically, correspond to the plan view illustrated in FIG. 6.

Figure 8A:
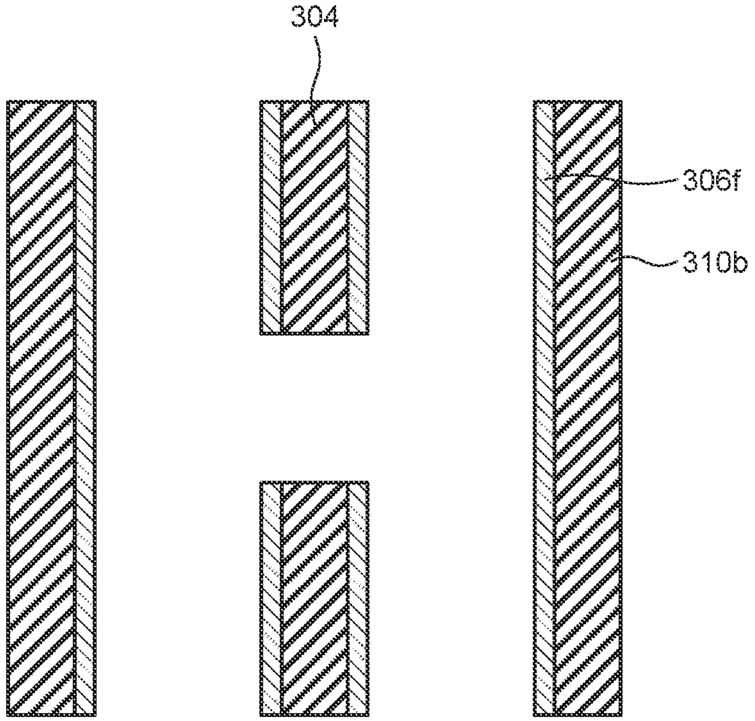
FIG. 8A is a plan view (part 1) for explaining a part of a manufacturing process of a manufacturing method 2 for the imaging element 100 according to the first embodiment of the present disclosure.
Figure 8B:
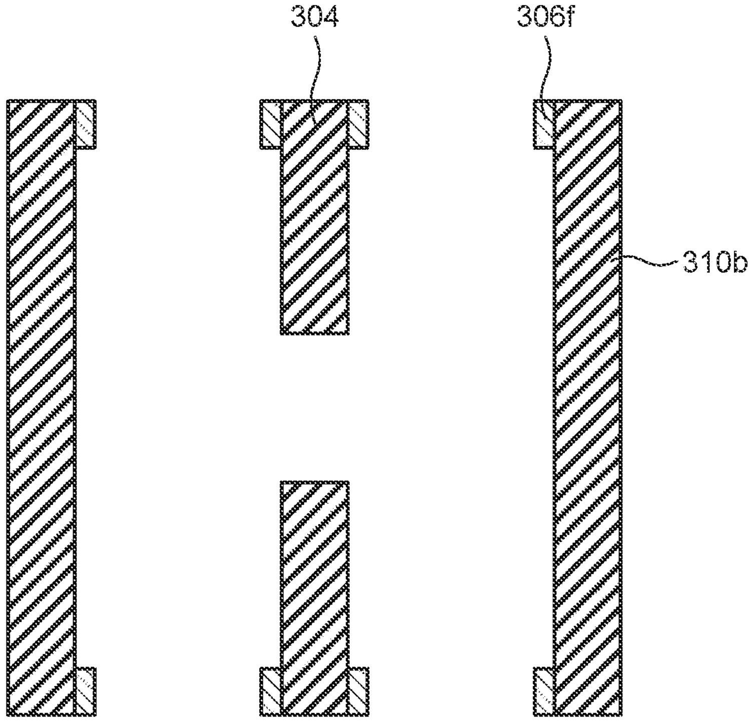
FIG. 8B is a plan view (part 2) for explaining the part of the manufacturing process of the manufacturing method 2 for the imaging element 100 according to the first embodiment of the present disclosure.

First, as illustrated in FIG. 8A, a trench is formed in a predetermined part of the semiconductor substrate 10, a material (for example, polysilicon) containing impurities of the second conductivity type (for example, the p-type) is formed in a predetermined region in the trench, an insulating material is formed in the remaining trench, and the element separation walls 310*b* and the projecting section 304 are formed.

Next, the material (for example, polysilicon) containing the impurities of the second conductivity type (for example, the p-type) is etched using a mask or the like and the material is left only at a desired part. Further, polysilicon not containing impurities is formed an etched part and a form illustrated in FIG. 8B can be obtained.

Figure 8C:
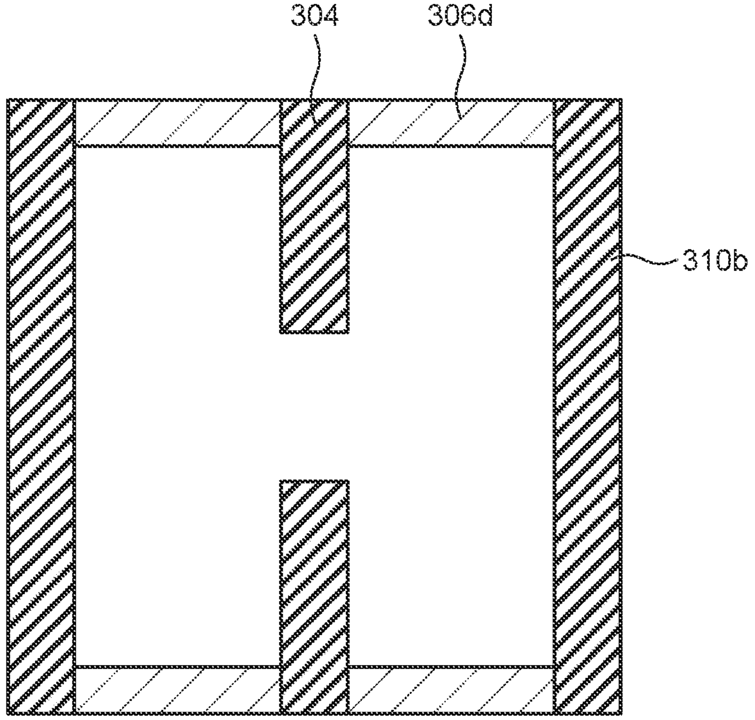
FIG. 8C is a plan view (part 3) for explaining the part of the manufacturing process of the manufacturing method 2 for the imaging element 100 according to the first embodiment of the present disclosure.

Further, as illustrated in FIG. 8C, by applying heat to the semiconductor substrate 10, the impurities are diffused from the material to the semiconductor substrate 10. That is, the diffusion region 306*d* is formed by conformal doping.

Figure 8D:
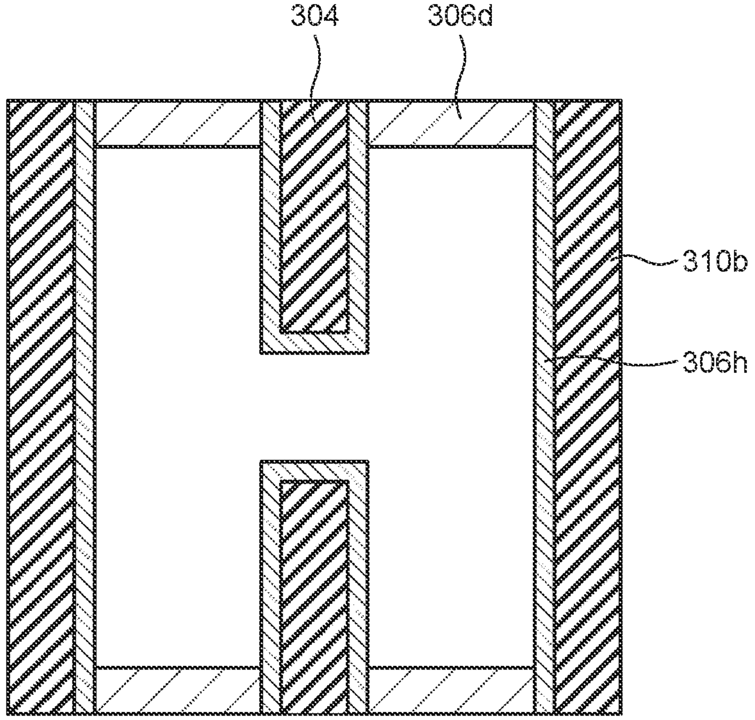
FIG. 8D is a plan view (part 4) for explaining the part of the manufacturing process of the manufacturing method 2 for the imaging element 100 according to the first embodiment of the present disclosure.

Subsequently, a trench is formed along the element separation walls 310*b* and the projecting section 304, a material (for example, polysilicon) containing impurities of the second conductivity type (for example, the p-type) is formed in the trench, and a form illustrated in FIG. 8D can be obtained.

Figure 8E:
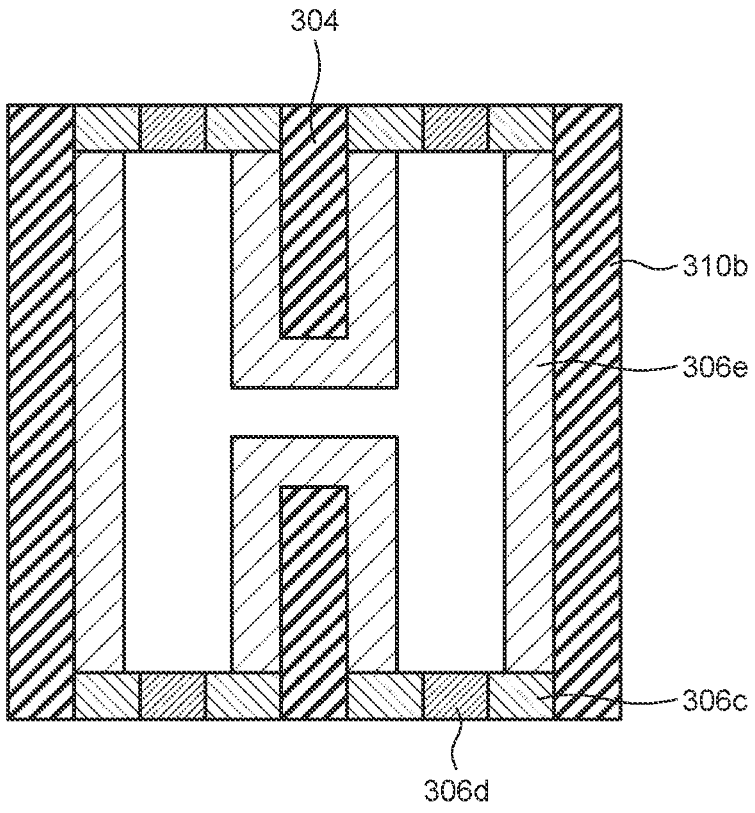
FIG. 8E is a plan view (part 5) for explaining the part of the manufacturing process of the manufacturing method 2 for the imaging element 100 according to the first embodiment of the present disclosure.

Further, as illustrated in FIG. 8E, by applying heat to the semiconductor substrate 10, impurities are diffused from the material to the semiconductor substrate 10. That is, the diffusion regions 306*d* and 306*e* are formed by conformal doping.

3.4 Modifications (Modification 1)

Figure 9:
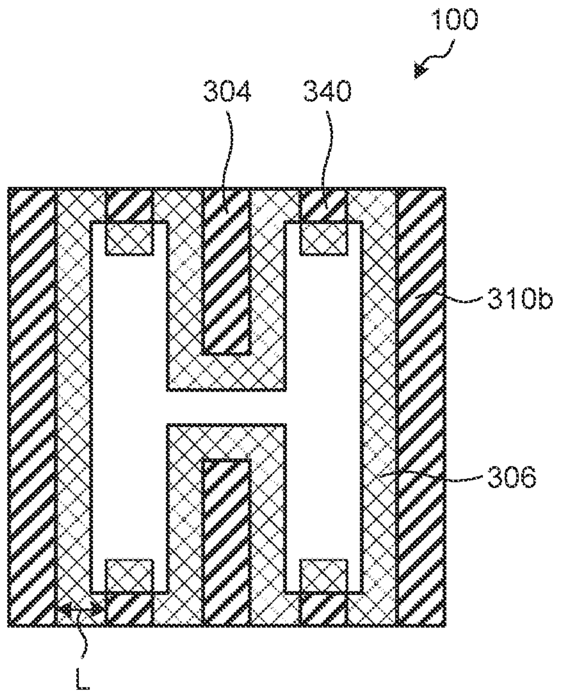
FIG. 9 is a plan view (part 1) of the imaging element 100 according to a modification 1 of the first embodiment of the present disclosure.
Figure 10:
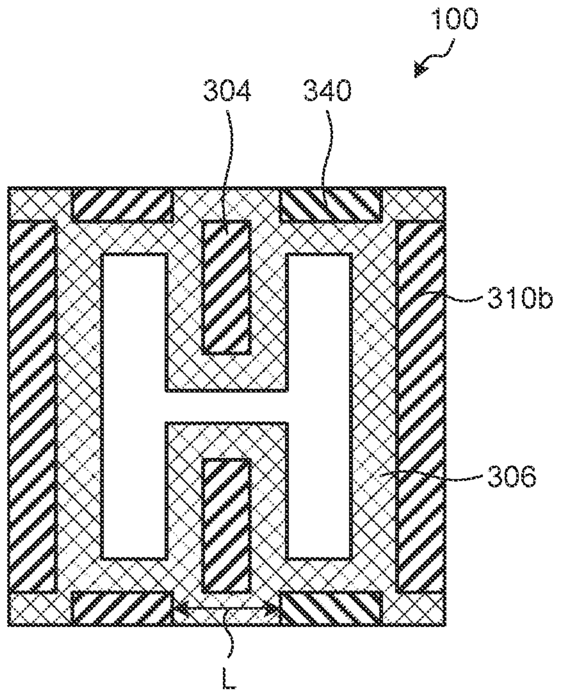
FIG. 10 is a plan view (part 2) of the imaging element 100 according to the modification 1 of the first embodiment of the present disclosure.
Figure 11:
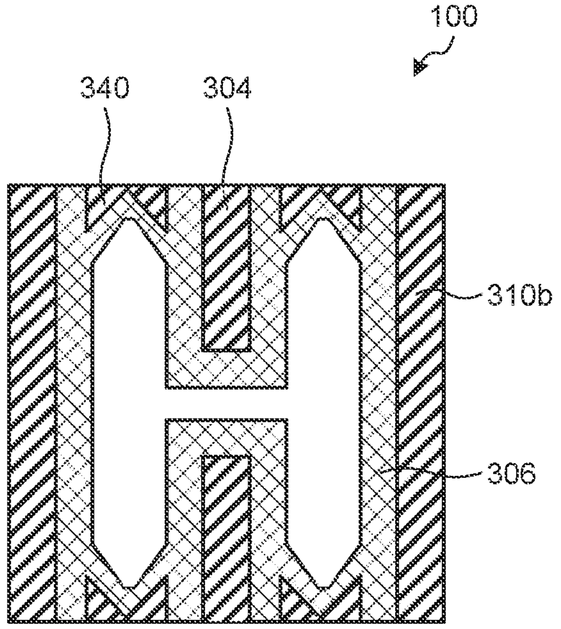
FIG. 11 is a plan view (part 3) of the imaging element 100 according to a modification 1 of the first embodiment of the present disclosure.

In the embodiment explained above, the element separation wall 310 in the row direction (the second direction) is explained as not being provided. However, the present embodiment is not limited to this and can be modified as appropriate. Therefore, a modification 1 of the present embodiment is explained with reference to FIG. 9 to FIG. 11. FIG. 9 to FIG. 11 are plan views of the imaging element

100 according to the modification 1 of the present embodiment and correspond to the plan view of FIG. 6.

As illustrated in FIG. 9 and FIG. 10, in the present modification, an element separation wall (a second element separation wall) 340 piercing through at least a part or the entire semiconductor substrate 10 from the front surface 10*b* may be provided between the element separation walls (the first element separation walls) 310*b* and the projecting section 304 (an example of the separation section) along two side surfaces (second side surfaces) extending in the row direction (the first direction) of a predetermined unit region (the entire region illustrated in FIG. 9 and FIG. 10) in which the imaging element 100 is provided. In the present modification, by providing such an element separation wall 340, the imaging elements 100 adjacent to each other in the column direction (the second direction) can be physically separated.

Note that, as illustrated in FIG. 9 and FIG. 10, the length of the element separation wall 340 in the row direction, a distance L (FIG. 9) to the element separation walls (the first element separation walls) 310*b*, and the distance L (FIG. 10) between the element separation walls 340 are not limited. Note that, in the present modification, as the length and the distance L are longer, the photoelectric conversion sections 302 (the photodiodes) can be increased in size compared with the comparative example. Therefore, the saturation signal amount (Qs) of the imaging element 100 can be further increased. In addition, flexibility of a layout is improved. In the present modification, it is possible to form the diffusion region 306*d* by diffusing impurities via the trench of the element separation wall 340 (conformal doping).

Further, in the present modification, as illustrated in FIG. 10, four corners of a predetermined unit region (the entire region illustrated in FIG. 10) of the imaging element 100 in the element separation wall (the first element separation wall) 310*d* may be reduced in the length in the column direction (the second direction). Consequently, in the present modification, since the region of the photoelectric conversion sections 302 (the photodiodes) can be increased in size compared with the comparative example, it is possible to further increase the saturation signal amount (Qs) of the imaging element 100. In addition, in the present modification, flexibility of a layout is improved.

In the present modification, the shape of the element separation wall (the second element separation wall) 340 is not limited. Various shapes such as a rectangular shape, a circular shape, an elliptical shape, a polygonal shape, and a shape obtained by connecting vertexes of two triangles illustrated in FIG. 11 can be selected. Further, in the present modification, the number of element separation walls 340 between the element separation walls (the first element separation walls) 310*b* and the projecting section 304 (an example of the separation section) is not limited. A plurality of element separation walls 340 may be provided in a dot-like manner.

(Modification 2)

Figure 12:
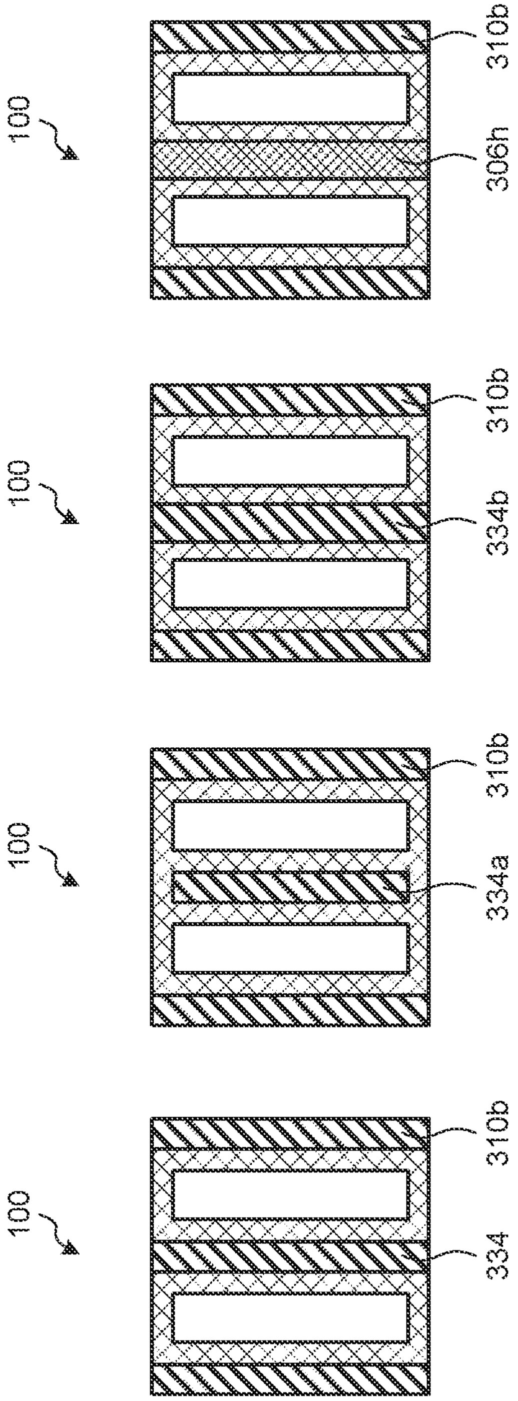
FIG. 12 is a plan view of the imaging element 100 according to a modification 2 of the first embodiment of the present disclosure.

Further, in the present embodiment, an element that separates the two pixels 300*a* and 300*b* (the photoelectric conversion sections 302) is not limited to the pair of projecting sections 304 (an example of the separation section) and the diffusion region 306*e* around the projecting sections. Therefore, a modification of the separation section that separates the two pixels 300*a* and 300*b* is explained with reference to FIG. 12. FIG. 12 is a plan view of the imaging element 100 according to a modification 2 of the present embodiment and corresponds to the plan view of FIG. 6. Note that, to facilitate understanding, the diffusion regions 306*d* and 306*e* explained above are illustrated as an integrated diffusion region in FIG. 6.

For example, the separation section illustrated at the left end of FIG. 12 may be one pixel separation wall (a first pixel separation wall) 334 provided to extend between the two pixels 300*a* and 300*b* in the column direction (the second direction) to separate the two pixels 300*a* and 300*b* and pierce through the semiconductor substrate 10 from the front surface 10*b*.

As illustrated second from the left side in FIG. 12, when the imaging element 100 is viewed from above the front surface 10*b*, the pixel separation wall (the first pixel separation wall) 334 may be cut in upper and lower portions to be shorter compared with the pixel separation wall 334 illustrated on the left side in FIG. 12. In this case, the length of the pixel separation wall 334 in the column direction (the second direction) is shorter compared with the element separation walls (the first element separation walls) 310*b* in a predetermined unit region (the entire region of the imaging element 100 illustrated second from the left side of FIG. 12).

As illustrated third from the left side of FIG. 12, the pixel separation wall (the first pixel separation wall) 334*b* may not be provided to pierce through the semiconductor substrate 10 from the front surface 10*b* and, for example, may be provided to pierce through to halfway in the semiconductor substrate 10 from the front surface 10*b* in the thickness direction of the semiconductor substrate 10.

In the present modification, rather than being physically separated, for example, as illustrated on the right side of FIG. 12, the two pixels 300*a* and 300*b* may be electrically separated by a diffusion region (a fourth diffusion region) 306*h* provided to extend in the column direction (the second direction). In this case, the diffusion region 306*h* includes impurities of the second conductivity type (for example, the p-type).

(Modification 3)

Figure 13:
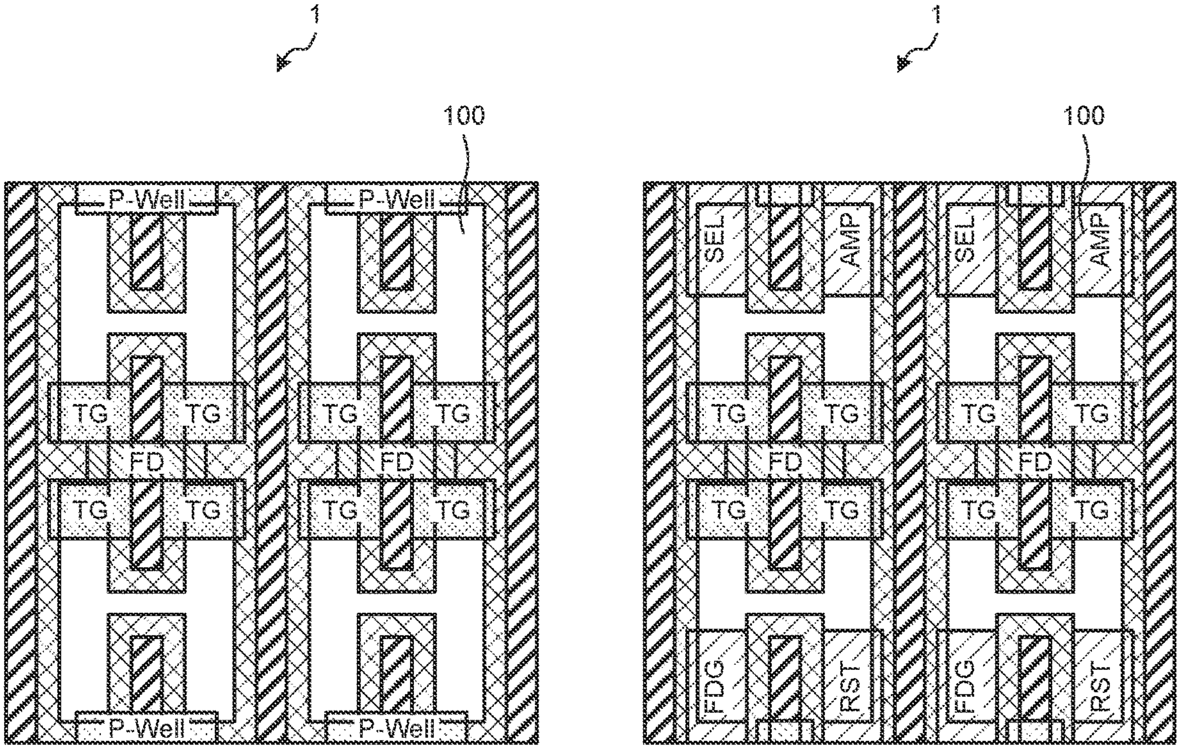
FIG. 13 is a plan view of a part of the imaging device 1 according to a modification 3 of the first embodiment of the present disclosure.

In the present embodiment, since flexibility of a layout is high, arrangement of the pixel transistors and the like is not limited. Therefore, the arrangement of the pixel transistors is explained with reference to FIG. 13. FIG. 13 is a plan view of a part of the imaging device 1 according to a modification 3 of the present embodiment. Specifically, FIG. 13 illustrates a form in which a plurality of imaging elements 100 are arranged in a matrix on the semiconductor substrate 10 and further illustrates positions of various pixel transistors (AMP, SEL, RST, and FDG) provided on the surface 10*b*, the transfer gates (TG) 400*a* and 400*b*, the floating diffusion section (FD section) (the charge storage section) 601, and the ground section (the well region) 602.

For example, in the present modification, as illustrated on the left side of FIG. 13, the transfer gate (TG) 400, the floating diffusion section (FD section) 601, and the ground section (the well region) 602 may be provided on the diffusion region 306*d* of the semiconductor substrate 10 or instead of a part of the diffusion region 306*d*. In this case, for example, various pixel transistors are provided on another substrate (not illustrated) stacked on the front surface 10*b* side of the semiconductor substrate 10.

For example, in the present modification, as illustrated on the right side of FIG. 13, pixel transistors such as an amplification transistor (AMP), a selection transistor (SEL), a reset transistor (RST), and an FD transfer transistor (FDG) may be provided on the semiconductor substrate 10.

(Modification 4)

Figure 14:
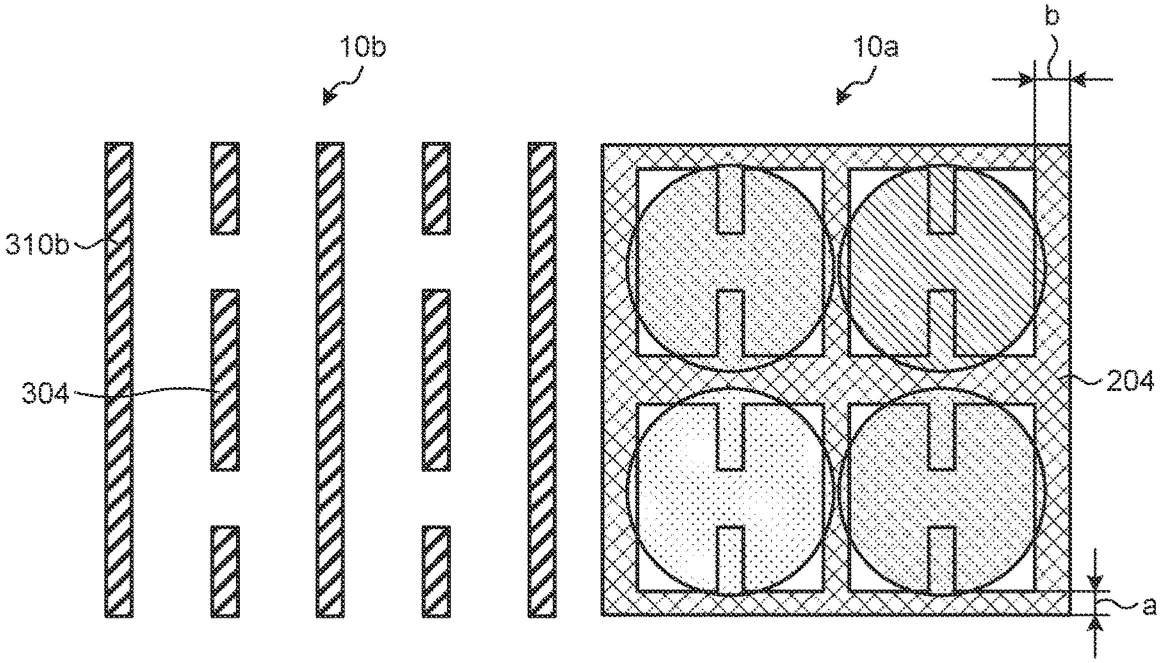
FIG. 14 is a plan view (part 1) of a part of the imaging device 1 according to a modification 4 of the first embodiment of the present disclosure.
Figure 15:
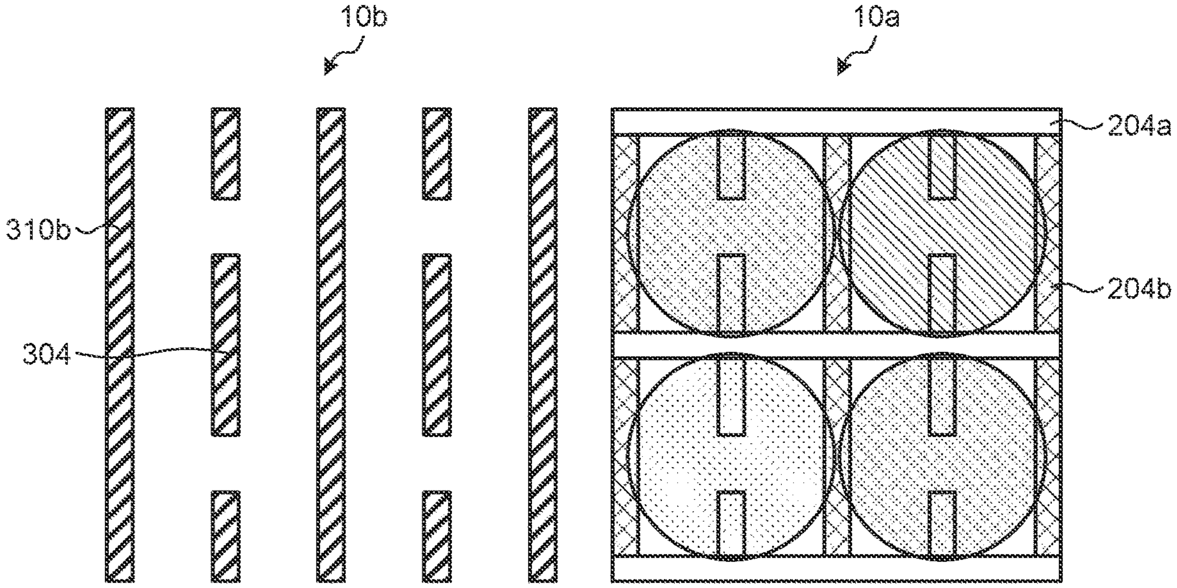
FIG. 15 is a plan view (part 2) of the part of the imaging device 1 according to the modification 4 of the first embodiment of the present disclosure.

In the present embodiment explained above, since the element separation wall 310 in the row direction (the second direction) is not provided, there is no element that separates the imaging elements 100 adjacent to each other in the column direction (the second direction). Therefore, there is a high possibility that color mixing occurs between the imaging elements 100 adjacent to each other in the column direction. Therefore, in order to prevent such color mixing, it is conceivable to deform the light blocking section 204 provided on the light receiving surface 10*a* of the semiconductor substrate 10. In the following explanation, modifications of such a light blocking section 204 are explained with reference to FIG. 14 and FIG. 15. FIG. 14 and FIG. 15 are plan views of a part of the imaging device 1 according to a modification 4 of the present embodiment and, specifically, a plan view as viewed from the front surface 10*b* side of the semiconductor substrate is illustrated on the left side and a plan view as viewed from the light receiving surface 10*a* side of the semiconductor substrate is illustrated on the right side.

As illustrated in FIG. 14, in the present comparative example, the light blocking section 204 extending in the row direction (the first direction) and the light blocking section 204 extending in the column direction (the second direction) are provided on the light receiving surface 10*a* of the semiconductor substrate 10. In the present modification, width a of the light blocking section 204 extending in the row direction is set larger compared with width b of the light blocking section 204 extending in the column direction, whereby it is possible to prevent color mixing from occurring between the imaging elements 100 adjacent to each other in the column direction.

As illustrated in FIG. 15, in the present comparative example, a light blocking section 204*a* extending in the row direction (the first direction) and a light blocking section 204*b* extending in the column direction (the second direction) are provided on the light receiving surface 10*a* of the semiconductor substrate 10. In the present modification, the light blocking section 204*a* and the light blocking section 204*b* are formed of different materials. Specifically, the light blocking section 204*a* is formed of a material that can block light. For example, the light blocking section 204*a* can be formed of silicon (Si), titanium (Ti), tungsten (W), aluminum (Al), an oxide film or a nitride film thereof, or a laminated film thereof. The light blocking section 204*a* may have, for example, a hollow structure (an air gap) made of the material explained above.

4. SECOND EMBODIMENT

4.1 Background

Next, a second embodiment of the present disclosure created by the present inventors is explained. First, a background leading to the creation of the second embodiment is explained.

In the imaging element 100 according to the comparative example, since the element separation wall 310 surrounding the imaging element 100 and the diffusion regions 306 provided around the element separation wall 310 and the projecting section 304 are provided, it is inevitable that the photoelectric conversion sections 302 (the photodiodes) are reduced in size. In other words, in the comparative example, there is a limit in increasing the saturation signal amount (Qs) of the imaging element 100.

Therefore, as in the first embodiment explained above, the present inventors have created the second embodiment of the present disclosure in order to further increase the saturation signal amount (Qs) of the imaging element 100 according to the comparative example.

4.2 Embodiment (Planar Configuration)

Figure 16:
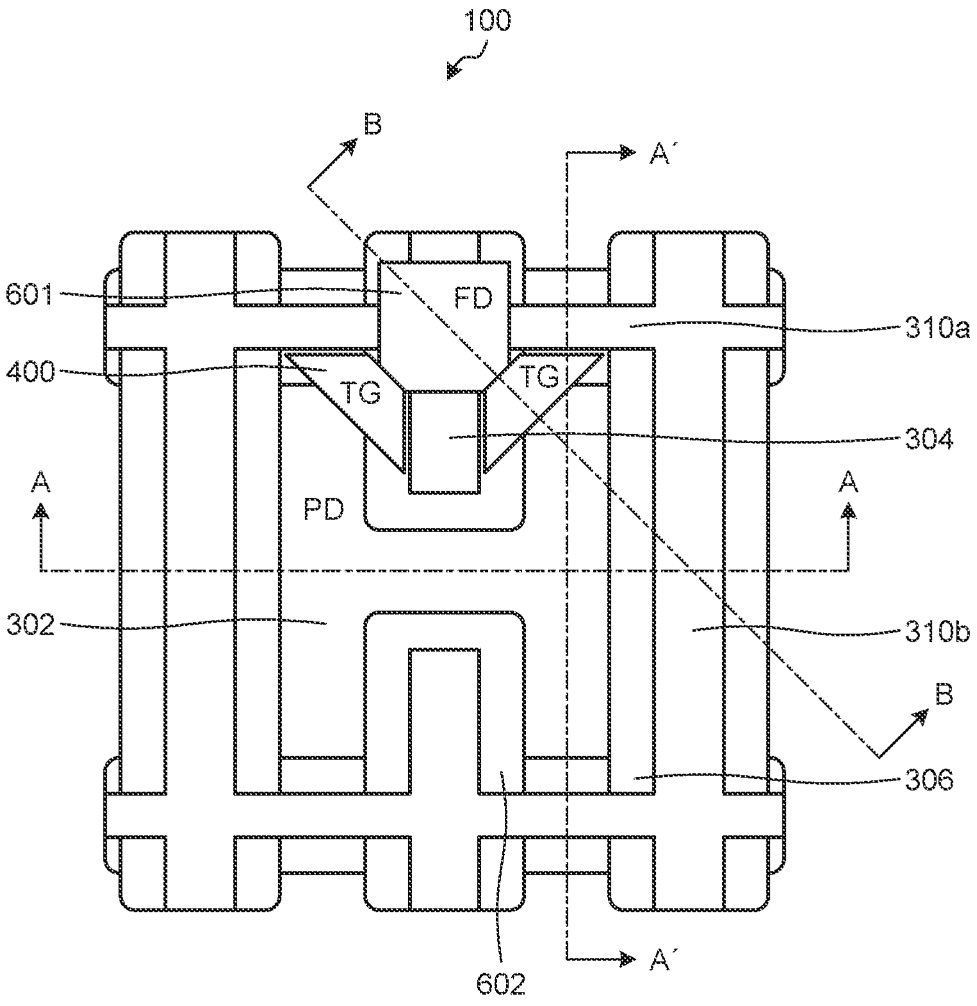
FIG. 16 is a plan view of the imaging element 100 according to a second embodiment of the present disclosure.

First, a planar configuration of the imaging element 100 of the present embodiment is explained with reference to FIG. 16. FIG. 16 is a plan view of the imaging element 100 according to the present embodiment viewed from the front surface 10*b* side. In the following explanation, elements common to the comparative example are denoted by the same reference numerals and signs in the figures, and explanation of the elements is omitted.

As illustrated in FIG. 16, in the present embodiment, element separation walls (third element separation walls) 310*a* extending in the row direction (the first direction) and element separation walls (first element separation walls) 310*b* extending in the column direction (the second direction) are provided on the semiconductor substrate 10. Further, whereas the element separation walls 310*a* and the element separation walls 310*b* are provided to have the same width in the comparative example, in the present embodiment, the width of the element separation walls 310*a* is smaller compared with the element separation walls 310*b*.

In the present embodiment, the diffusion regions 306 containing impurities of the second conductivity type (for example, the p-type) (including a diffusion region (a third diffusion region) around the element separation walls 310*a*) are provided around the element separation walls 310*a* and 310*b*. Specifically, in the present embodiment, the diffusion regions 306 around the element separation walls 310*a* may be narrower than the diffusion regions 306 around the element separation walls 310*b*, and the concentration of impurities in the diffusion regions 306 around the element separation walls 310*a* may be lower than the concentration of impurities in the diffusion regions 306 around the element separation walls 310*b*.

(Sectional Configuration)

Figure 17:
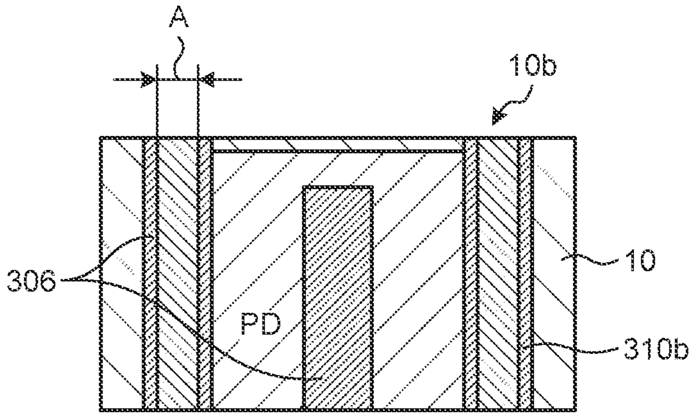
FIG. 17 is a sectional view of the imaging element 100 according to the second embodiment of the present disclosure.
Figure 17:
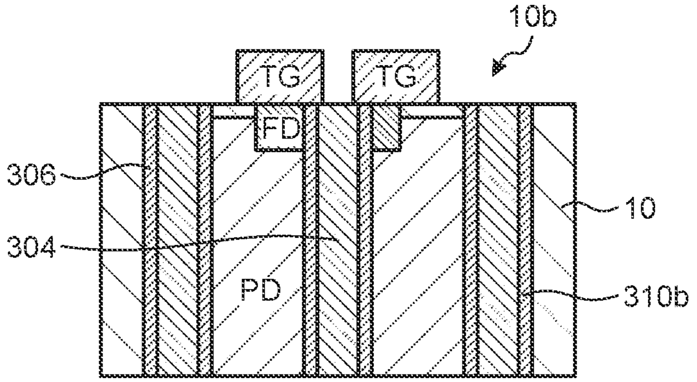
Figure 17:
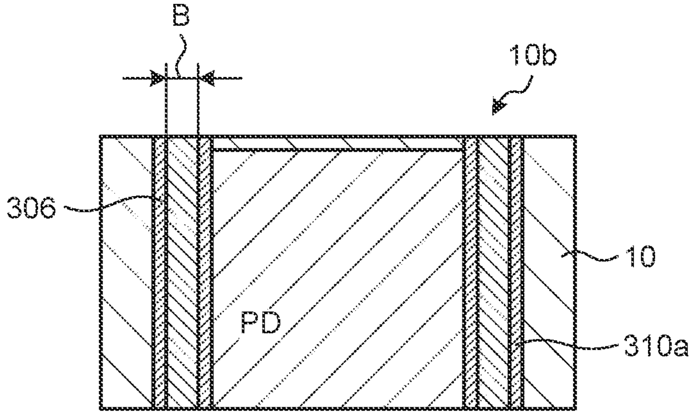

Next, a sectional configuration of the imaging element 100 of the present embodiment is explained with reference to FIG. 17. FIG. 17 is a sectional view of the imaging element 100 according to the present embodiment and, specifically, is an A-A cross section, an A'-A' cross section, and a B-B cross section of FIG. 16 from the top. In the following explanation, elements common to the comparative example are denoted by the same reference numerals and signs in the figures, and explanation of the elements is omitted.

Specifically, as illustrated in FIG. 17, the element separation walls (the second element separation walls) 310*a* and the element separation walls (the first element separation walls) 310*b* are provided to pierce through the entire semiconductor substrate 10 from the front surface 10*b*. Specifically, the element separation walls 310*a* are provided to pierce through the semiconductor substrate 10 along the two side surfaces (the second side surfaces) extending in the row direction (the first direction) of a predetermined unit region of the imaging element 100. Furthermore, the element separation walls 310*b* are provided to pierce through the semiconductor substrate 10 along two side surfaces (first side surfaces) extending in the column direction (second direction) of a predetermined unit region of the imaging element 100.

Further, as explained above, in the present embodiment, the width B of the element separation walls 310*a* is smaller compared with the width A of the element separation walls

310*b*. In the present embodiment, the diffusion regions 306 around the element separation wall 310*a* may be narrower than the diffusion regions 306 around the element separation wall 310*b*, Further, the concentration of impurities in the diffusion regions 306 around the element separation wall 310*a* may be lower than the concentration of impurities in the diffusion regions 306 around the element separation wall 310*b*.

In the present embodiment, by setting the width B of the element separation walls 310*a* smaller compared with the width A of the element separation walls 310*b*, the region of the photoelectric conversion sections 302 (the photodiodes) can be increased in size compared with the comparative example. Therefore, the saturation signal amount (Qs) can be further increased.

Note that, in FIG. 16 and FIG. 17, the widths of the two element separation walls 310*a* surrounding one imaging element 100 are the same but are not limited to this in the present embodiment. In the present embodiment, for example, the width of the element separation walls 310*a* on the floating diffusion section (FD section) 601 side may be set smaller compared with the width of the element separation walls 310*a* on the ground section (well region) 602 side. In this case, the impurity concentration of the diffusion regions 306 around the element separation walls 310*a* on the floating diffusion section (FD section) 601 side may be set lower compared with the impurity concentration of the diffusion regions 306 around the element separation walls 310*a* on the ground section (well region) 602 side. Consequently, the region of the photoelectric conversion sections 302 (the photodiodes) can be expanded to the floating diffusion section (FD section) 601 side and the floating diffusion section 601 and the photoelectric conversion sections 302 can be brought close to each other. Therefore, the charge transfer efficiency can be improved.

4.3 Manufacturing Method (Manufacturing Method 1)

Figure 18:
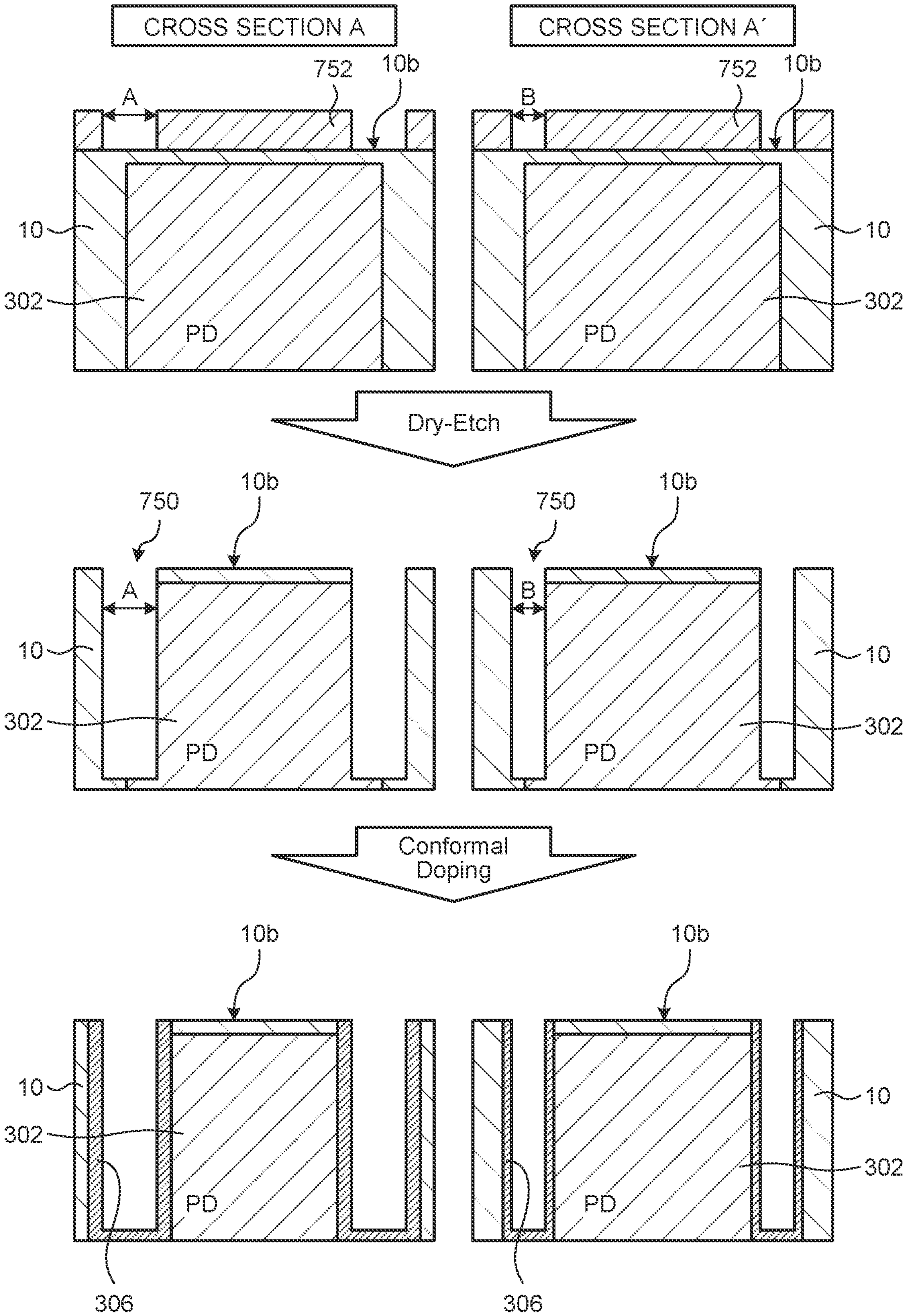
FIG. 18 is a sectional view for explaining a part of a manufacturing process of the manufacturing method 1 for the imaging element 100 according to the second embodiment of the present disclosure.

Next, a part of a manufacturing process (a manufacturing method) for the imaging element 100 according to the present embodiment is explained with reference to FIG. 18. FIG. 18 is a sectional view for explaining a part of a manufacturing process of a manufacturing method 1 for the imaging element 100 according to the present embodiment. Specifically, FIG. 18 corresponds to a part of the sectional view illustrated in FIG. 17, a sectional view on the right side corresponds to the A-A section of FIG. 16, and a sectional view on the left side corresponds to the A'-A' section of FIG. 16.

First, as illustrated in an upper part and a middle part of FIG. 18, trenches 750 extending in the row direction (the first direction) and the column direction (the second direction) and piercing through the semiconductor substrate 10 from the front surface 10*b* side are formed using a mask 752 having a predetermined pattern and dry etching. At this time, in the manufacturing method 1, the width of the trenches 750 extending in the row direction is formed to be smaller compared with the width of the trenches 750 extending in the column direction. In the present manufacturing method, the trenches 750 may pierce through only a part of the semiconductor substrate 10 instead of piercing through the semiconductor substrate 10 from the front surface 10*b* side. The present manufacturing method is not limited to forming the trenches 750 using a mask and dry etching. The trenches 750 may be formed using an anisotropic etching method or the like. The trenches 750 extending in the row direction and the trenches 750 extending in the column direction may be simultaneously formed or may be formed in separate processes.

Next, as illustrated in a lower part of FIG. 18, diffusion regions 306 made of polysilicon or the like containing impurities of the second conductivity type (for example, the p-type) is formed on the side surfaces of the trenches 750 using a pulsed laser deposition method or the like. At this time, the impurity concentration of the diffusion regions 306 on the side surfaces of the trenches 750 extending in the row direction is set to be lower compared with the impurity concentration of the diffusion regions 306 on the side surfaces of the trenches 750 extending in the column direction. Further, in the present manufacturing method, impurities are diffused into the semiconductor substrate 10 by applying heat to the semiconductor substrate 10 (conformal doping). Further, although not illustrated, the element separation walls 310*a* and 310*b* are formed by forming insulating materials in the trenches 750.

(Manufacturing Method 2)

Figure 19:
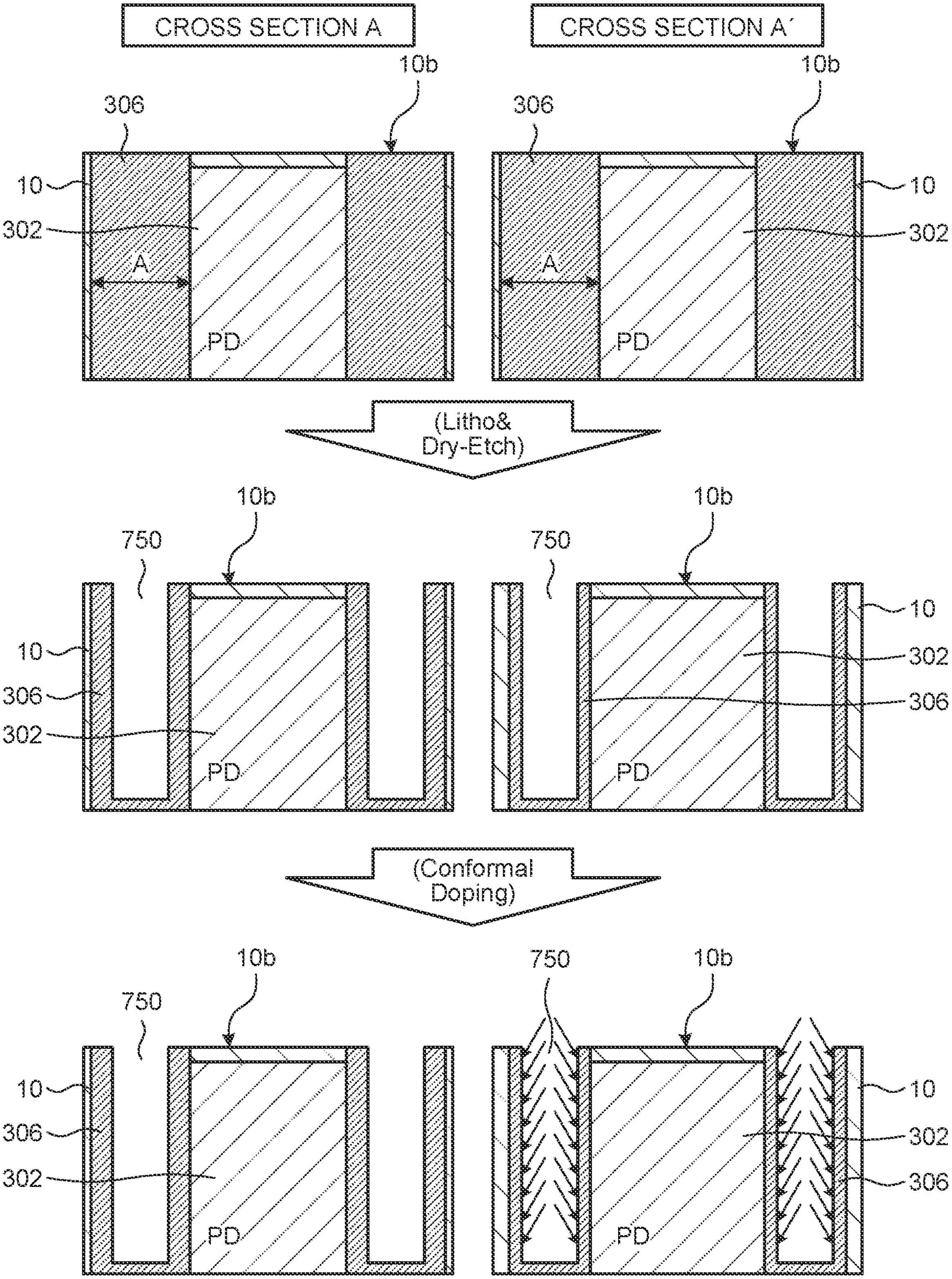
FIG. 19 is a sectional view for explaining a part of a manufacturing process of the manufacturing method 2 for the imaging element 100 according to the second embodiment of the present disclosure.

Further, in the present embodiment, the imaging element 100 can be formed by other manufacturing methods. Next, a part of a manufacturing process (a manufacturing method) for the imaging element 100 according to the present embodiment is explained with reference to FIG. 19. FIG. 19 is a sectional view for explaining a part of the manufacturing process of the manufacturing method 1 for the imaging element 100 according to the present embodiment. Specifically, FIG. 19 corresponds to a part of the sectional view illustrated in FIG. 17, a sectional view on the right side corresponds to the A-A section of FIG. 16, and a sectional view on the left side corresponds to the A'-A' section of FIG. 16.

First, as illustrated in an upper part of FIG. 19, the diffusion regions 306 made of polysilicon or the like containing impurities of the second conductivity type (for example, the p-type) is formed in a range extending in the row direction (the first direction) and the column direction (the second direction) from the front surface 10*b* side to the light receiving surface 10*a* side of the semiconductor substrate 10. At this time, the impurity concentration of the diffusion regions 306 extending in the row direction is set the same as the impurity concentration of the diffusion regions 306 extending in the column direction. Further, the width of the diffusion regions 306 extending in the row direction is formed to be the same as the width of the diffusion regions 306 extending in the column direction.

Further, as illustrated in a middle part of FIG. 19, trenches 750 are formed in the diffusion regions 306. At this time, the trenches 750 are formed such that the diffusion regions 306 remain on the sidewalls of the trenches 750. In the present manufacturing method, the width of the trenches 750 in the diffusion regions 306 extending in the row direction is formed to be the same as the width of the trenches 750 in the diffusion regions 306 extending in the column direction.

Next, as illustrated in a lower part of FIG. 19, impurities of the first conductivity type (for example, the n-type) are implanted into the diffusion regions 306 on the sidewalls of the trenches 750 extending in the row direction (the first direction) to electrically cancel impurities of the second conductivity type (for example, the p-type) in the diffusion regions 306.

Further, although not illustrated, in the present manufacturing method, impurities are diffused into the semiconductor substrate 10 by applying heat to the semiconductor substrate 10 (conformal doping). Furthermore, the element separation walls 310*a* and 310*b* are formed by forming insulating materials in the trenches 750.

(Manufacturing Method 3)

Figure 20:
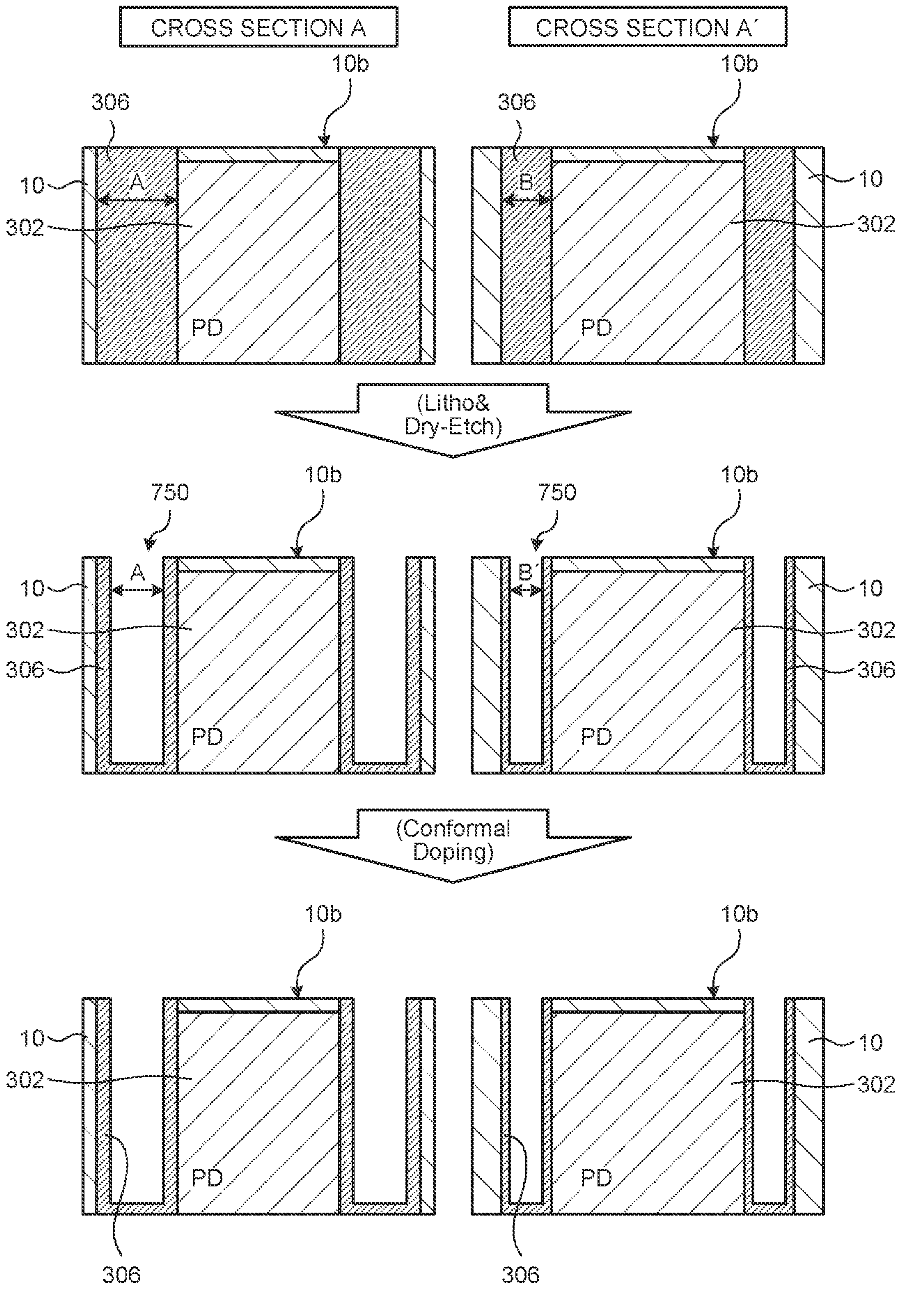
FIG. 20 is a sectional view for explaining a part of a manufacturing process of a manufacturing method 3 for the imaging element 100 according to the second embodiment of the present disclosure.

Next, a part of a manufacturing process (a manufacturing method) for the imaging element 100 according to the present embodiment is explained with reference to FIG. 20. FIG. 20 is a sectional view for explaining a part of the manufacturing process of the manufacturing method 1 for the imaging element 100 according to the present embodiment. Specifically, FIG. 20 corresponds to a part of the sectional view illustrated in FIG. 17, a sectional view on the right side corresponds to the A-A section of FIG. 16, and a sectional view on the left side corresponds to the A'-A' section of FIG. 16.

First, as illustrated in an upper part of FIG. 20, the diffusion regions 306 made of polysilicon or the like containing impurities of the second conductivity type (for example, the p-type) are formed in a range extending in the row direction (the first direction) and the column direction (the second direction) from the front surface 10*b* side to the light receiving surface 10*a* side of the semiconductor substrate 10. At this time, the impurity concentration of the diffusion regions 306 extending in the row direction is lower compared with the impurity concentration of the diffusion regions 306 extending in the column direction. Further, the width of the diffusion regions 306 extending in the row direction is set smaller compared with the width of the diffusion regions 306 extending in the column direction.

Further, as illustrated in a middle part of FIG. 20, the trenches 750 are formed in the diffusion regions 306. At this time, the trenches 750 are formed such that the diffusion regions 306 remain on the sidewalls of the trenches 750.

Further, as illustrated in a lower part of FIG. 20, by applying heat to the semiconductor substrate 10, impurities are diffused from the diffusion regions 306 into the semiconductor substrate 10 (conformal doping). Further, although not illustrated, the element separation walls 310*a* and 310*b* are formed by forming insulating materials in the trenches 750.

4.4 Modification

Figure 21:
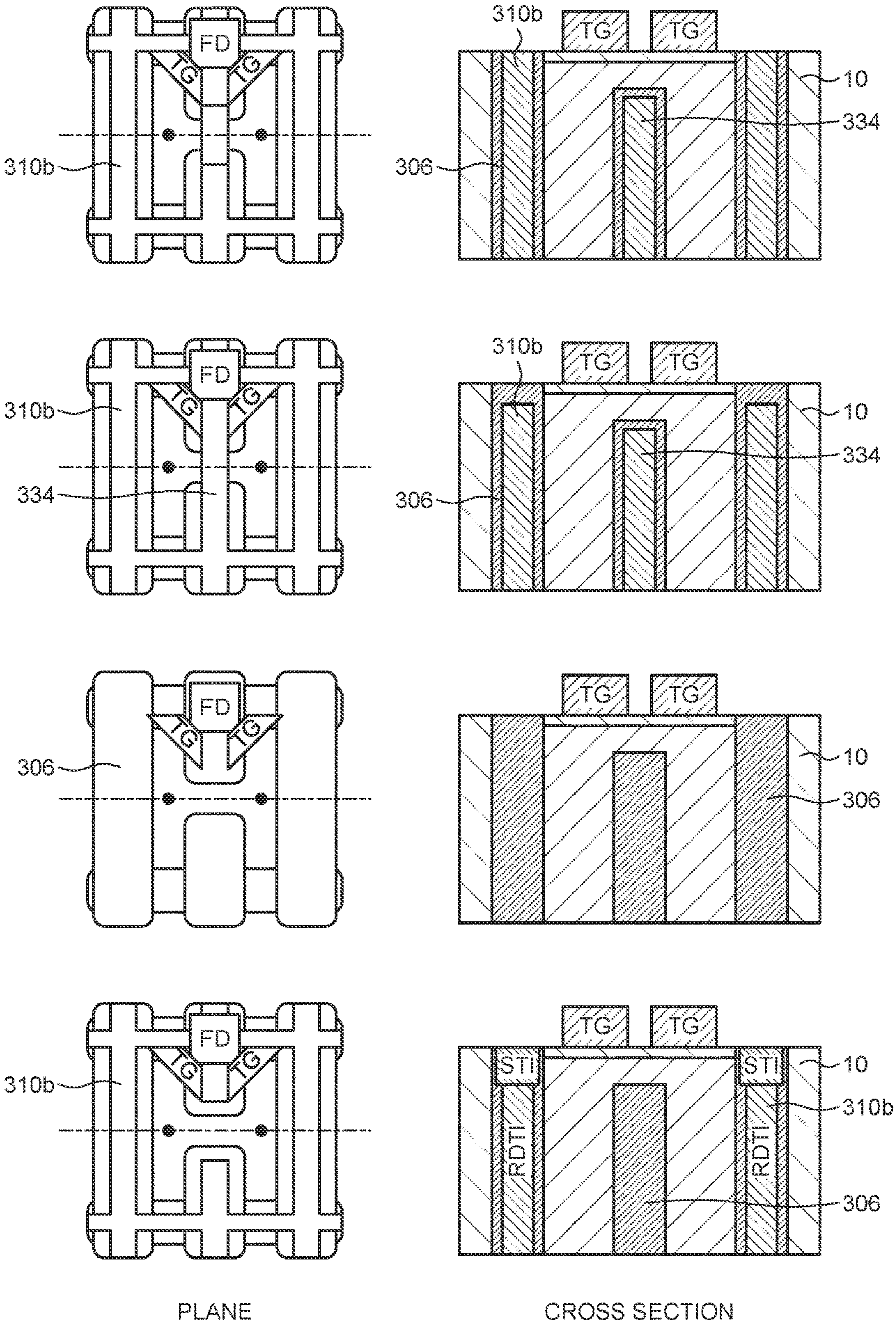
FIG. 21 is a plan view and a sectional view of the imaging element 100 according to a modification of the second embodiment of the present disclosure.

Further, in the present embodiment, the element that separates the two pixels 300*a* and 300*b* (the photoelectric conversion sections 302) is not limited to the pair of projecting sections 304 (an example of the separation section) and the diffusion regions 306 around the projection. Therefore, a modification of the separation section that separates the two pixels 300*a* and 300*b* is explained with reference to FIG. 21. FIG. 21 is a plan view and a sectional view of the imaging element 100 according to a modification of the present embodiment. Specifically, a figure on the left side is a plan view corresponding to FIG. 16 and a figure on the right side illustrates a cross section taken along a broken line in the figure on the left side.

For example, the separation section illustrated in an upper part of FIG. 21 may be the pixel separation wall 334 provided in the slit 312 to pierce through the semiconductor substrate 10 from the light receiving surface 10*a* to halfway in the semiconductor substrate 10 in the thickness direction of the semiconductor substrate 10 and the diffusion regions 306 located around the pixel separation wall 334. In the case of such a modification, as illustrated in a second part from the top of FIG. 21, the element separation walls 310*b* may also be provided to pierce through the semiconductor substrate 10 from the light receiving surface 10*a* to halfway in the semiconductor substrate 10 in the thickness direction of the semiconductor substrate 10.

For example, the separation section illustrated in a third part from the top of FIG. 21 may be only the diffusion regions (fourth diffusion regions) 306. The diffusion regions 306 contain impurities of the second conductivity type (for example, the p-type). In this case, the element separation wall 310*b* may also include the diffusion regions 306.

For example, as illustrated in a lower part of FIG. 21, the element separation wall 310*b* may be formed by connecting an element separation section (STI) including a trench piercing through the semiconductor substrate 10 from the light receiving surface 10*a* to halfway in the semiconductor substrate 10 in the thickness direction of the semiconductor substrate 10 and an element separation section (RDTI) including a trench piercing through the semiconductor substrate 10 from the front surface 10*b* to halfway in the semiconductor substrate 10 in the thickness direction of the semiconductor substrate 10.

5. THIRD EMBODIMENT

5.1 Background

Figure 22A:
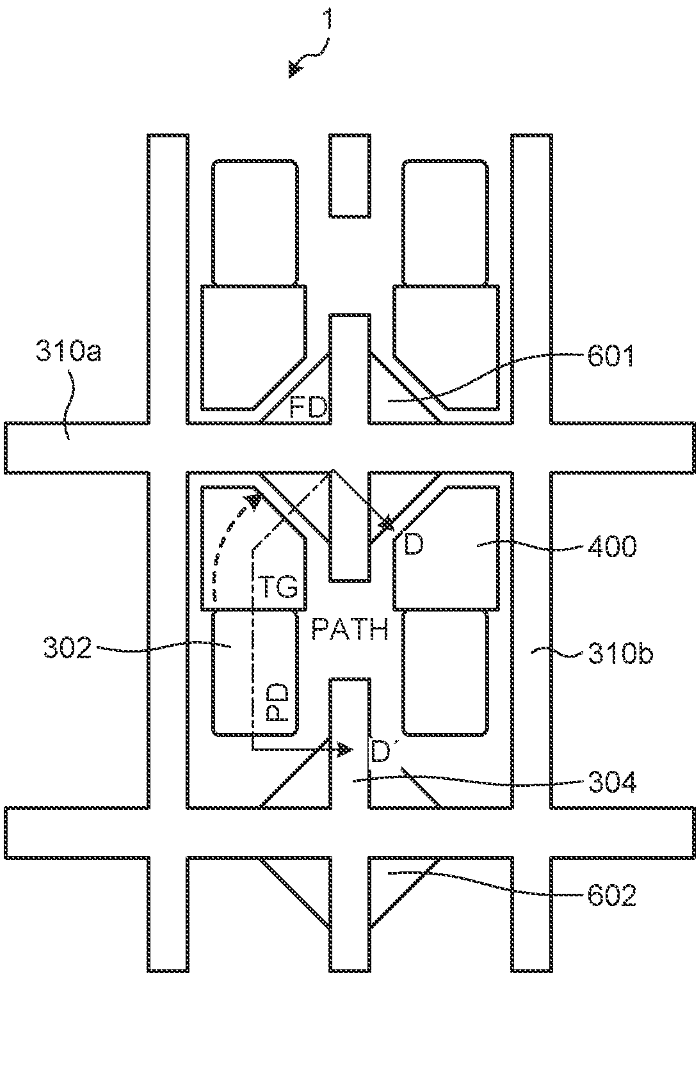
FIG. 22A is a plan view of a part of the imaging device 1 according to a comparative example.
Figure 22B:
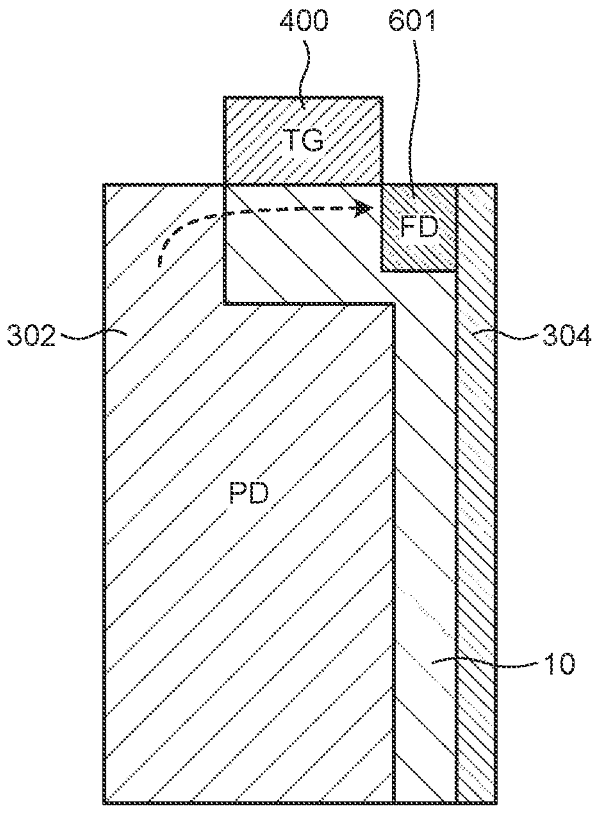
FIG. 22B is a sectional view of a part of the imaging device 1 according to a comparative example.

Next, a third embodiment of the present disclosure created by the present inventors is explained with reference to FIG. 22A and FIG. 22B. First, a background leading to the creation of the third embodiment is explained. FIG. 22A is a plan view of a part of the imaging device 1 according to a comparative example viewed from the front surface 10*b*. FIG. 22B is a sectional view of a part of the imaging device 1 according to the comparative example and, specifically, is a sectional view of the semiconductor substrate 10 taken along line D-D' illustrated in FIG. 22A.

As illustrated in FIG. 22A and FIG. 22B, in the comparative example, since the transfer gates 400*a* and 400*b* are formed by flat plate-shaped electrodes provided on the semiconductor substrate 10, it is difficult to modulate potential deeply in the semiconductor substrate 10 and it is difficult to efficiently transfer electric charges from a PD to an FD. Therefore, it is conceivable to increase the transfer gate 400 itself in size. However, this is also difficult as the imaging element 100 is refined.

In the comparative example, when the transfer gate 400 is increased in size, the transfer gate 400 is closer to the position of the overflow path between the pixels 300*a* and 300*b*. Therefore, when a line passing the center of the overflow path and extending in the column direction is set as a symmetric axis, a potential gradient of the overflow path is not sometimes symmetric by being affected by modulation from the transfer gate 400. In addition, since it is inevitable that the photoelectric conversion sections 302 (photodiodes: PDs) decrease in size when the transfer gate 400 is increased in size, there is a limit in an increase in the saturation signal amount (Qs) of the imaging element 100.

Therefore, the present inventors have created the third embodiment of the present disclosure such that the influence from the transfer gate 400 can be suppressed, the potential gradient of the overflow path can be made more symmetric, and the degree of modulation and the saturation signal amount (Qs) by the transfer gate 400 can be further increased.

5.2 Embodiment

First, a configuration of the imaging element 100 of the present embodiment is explained with reference to FIG.

Figure 23A:
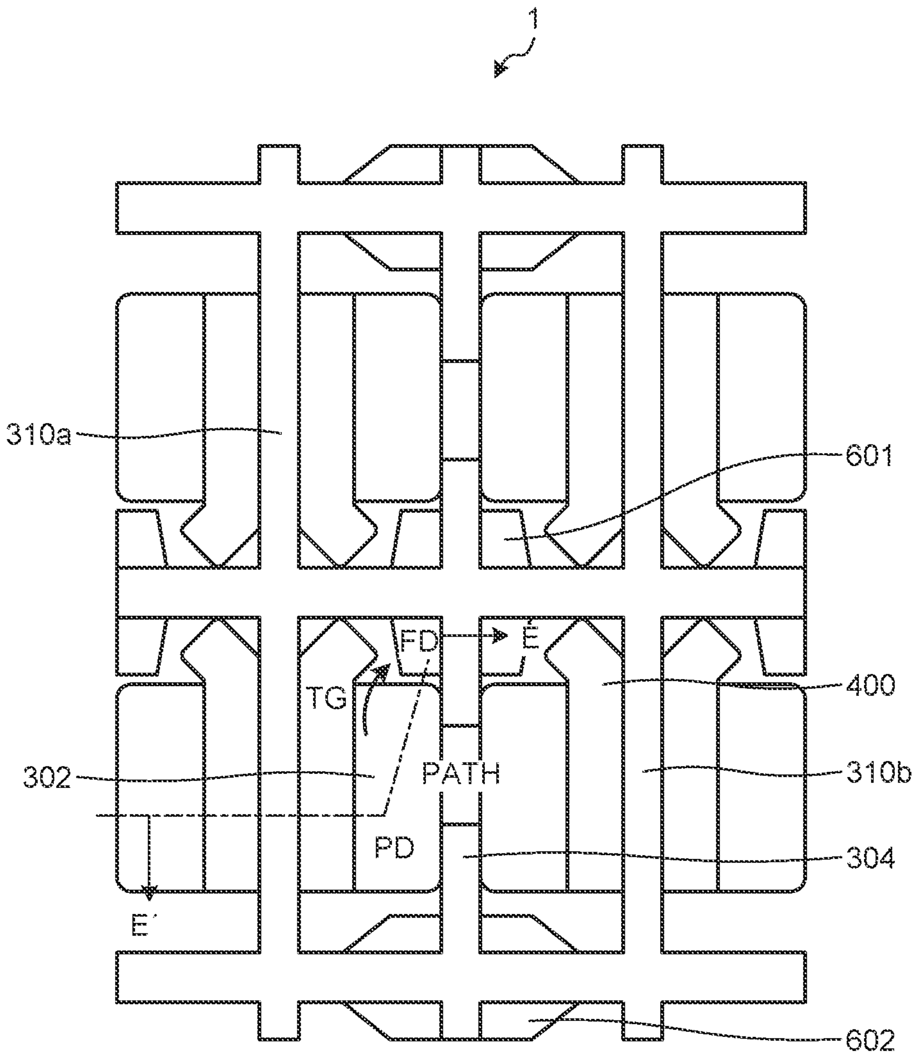
FIG. 23A is a plan view (part 1) of a part of the imaging device 1 according to the third embodiment of the present disclosure.
Figure 23B:
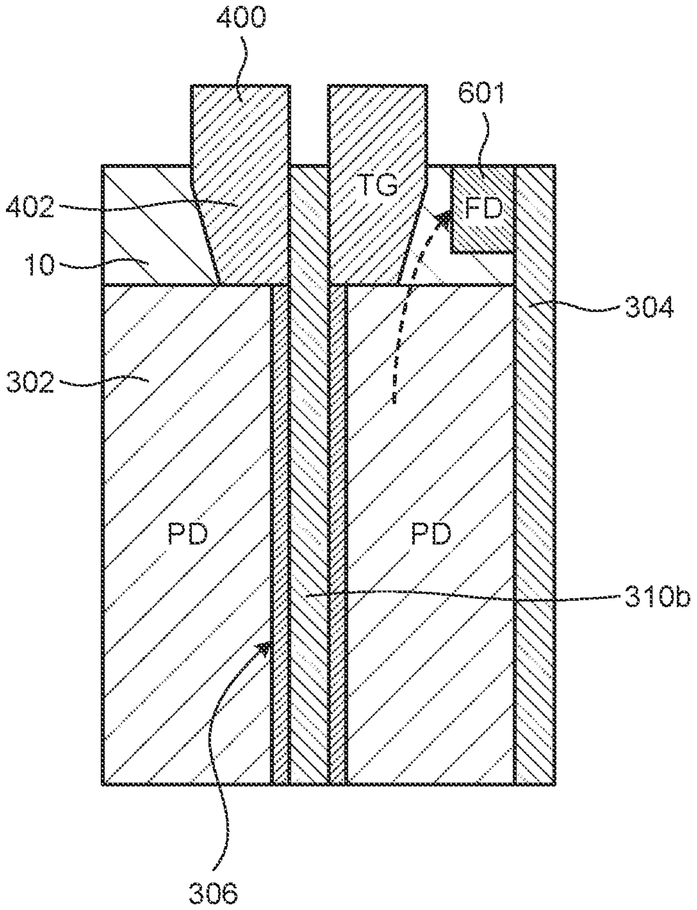
FIG. 23B is a sectional view of a part of the imaging device 1 according to the third embodiment of the present disclosure.
Figure 24:
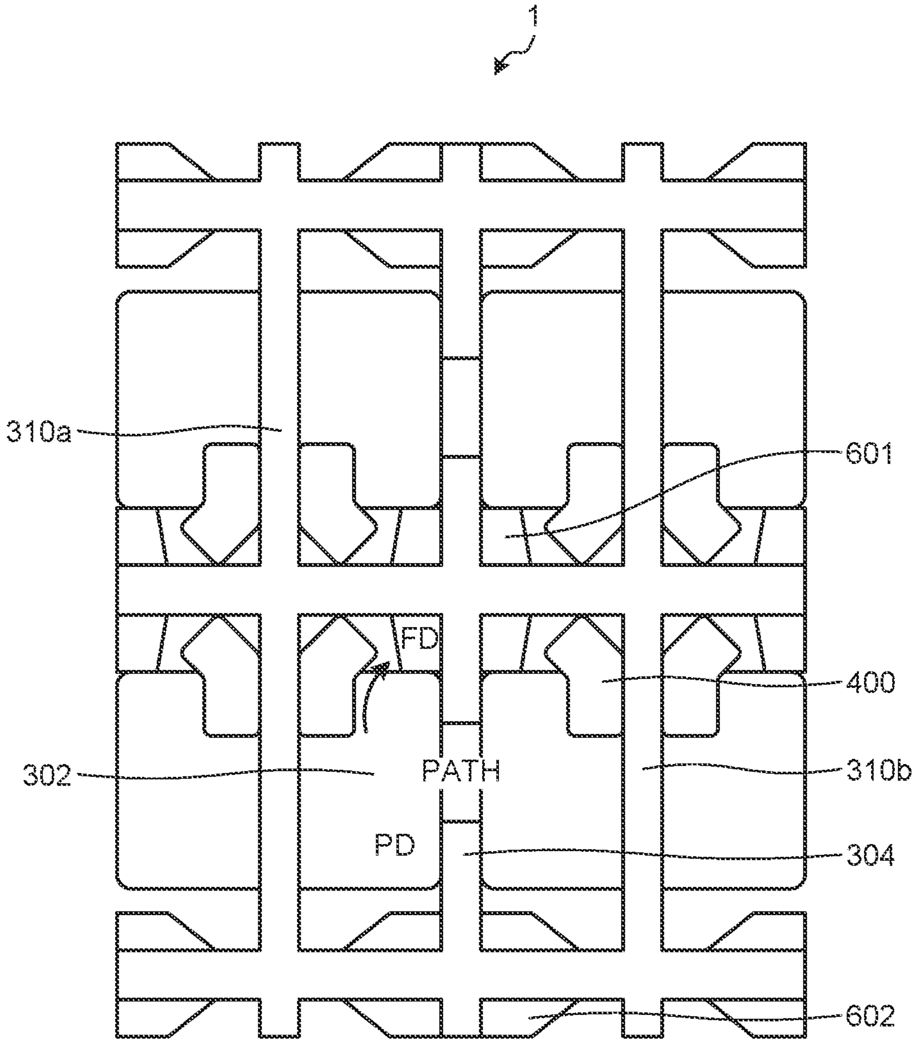
FIG. 24 is a plan view (part 2) of a part of the imaging device 1 according to the third embodiment of the present disclosure.

23A, FIG. 23B, and FIG. 24. FIG. 23A and FIG. 24 are plan views of the imaging device 1 according to the present embodiment viewed from the front surface 10*b*. Further, FIG. 23B is a sectional view of a part of the imaging device 1 according to the present embodiment and, specifically, is a sectional view of the semiconductor substrate 10 taken along line E-E' illustrated in FIG. 23A. In the following explanation, elements common to the comparative example are denoted by the same reference numerals and signs in the figures, and explanation of the elements is omitted.

In the present embodiment, as illustrated in FIG. 23A, the transfer gate (a transfer gate electrode) 400 is disposed in a position away from the overflow path (described as "path" in the figure) not to interfere with the overflow path. Specifically, when the semiconductor substrate 10 is viewed from above the front surface 10*b*, the transfer gate 400 is provided to be adjacent to the element separation wall (the first element separation wall) 310*b* extending in the column direction (the second direction) and to extend along the element separation wall (the first element separation wall) 310*b*.

When viewed from above the front surface 10*b*, the floating diffusion section (FD section) (the charge storage section) 601 is provided in the vicinity of a first intersection where one element separation wall (the third element separation wall) 310*a* and the projecting section 304 (an example of the separation section) intersect. Further, the transfer gate 400 is provided in the vicinity of a second intersection where the element separation wall (the third element separation wall) 310*a* forming the first intersection and the element separation wall (the first element separation wall) 310*b* extending in the column direction (second direction) intersect.

In the present embodiment, the transfer gate (the transfer gate electrode) 400 can be disposed in a position away from the overflow path by being disposed as explained above. Note that, in the present embodiment, the transfer gate 400 is preferably disposed in a position away from the overflow path as far as possible as long as the transfer gate 400 does not hinder arrangement and functions of the other elements. According to the present embodiment, since the influence from the potential modulation by the transfer gate 400 can be suppressed, the potential gradient of the overflow path can be brought close to symmetry. In addition, in the present embodiment, since the photoelectric conversion sections 302 (the photodiodes: PDs) can be widely formed by disposing the transfer gate 400 in the position away from the overflow path, the saturation signal amount (Qs) of the imaging element 100 can be further increased.

In the present embodiment, as illustrated in FIG. 23B, the transfer gate (the transfer gate electrode) 400 includes an embedded electrode section 402 in the semiconductor substrate 10. As explained above, in the present embodiment, by providing the embedded electrode section 402 in the transfer gate 400, it is easy to modulate the potential deeply in the semiconductor substrate 10 and electric charges from the photoelectric conversion sections 302 (the photodiodes: PDs) can be efficiently transferred to the floating diffusion section (FD section) (the charge storage section) 601. Note that, in the present embodiment, as illustrated in FIG. 24B, the diffusion regions 306 located near the transfer gate 400 are disposed below the embedded electrode section 402.

In the present embodiment, as illustrated in FIG. 24, when viewed from above the front surface 10*b*, the length of the transfer gate 400 extending along the element separation wall (the first element separation wall) 310*b* may be set smaller compared with the example illustrated in FIG. 23A. Consequently, since the transfer gate (the transfer gate electrode) 400 can be disposed in a position away from the overflow path, the influence from the transfer gate 400 can be suppressed. Therefore, the potential gradient of the overflow path can be brought closer to symmetry. In addition, since the photoelectric conversion sections 302 (the photodiodes: PDs) can be widely formed by disposing the transfer gate 400 in the position away from the overflow path, the saturation signal amount (Qs) of the imaging element 100 can be further increased.

5.3 Modification

Figure 25A:
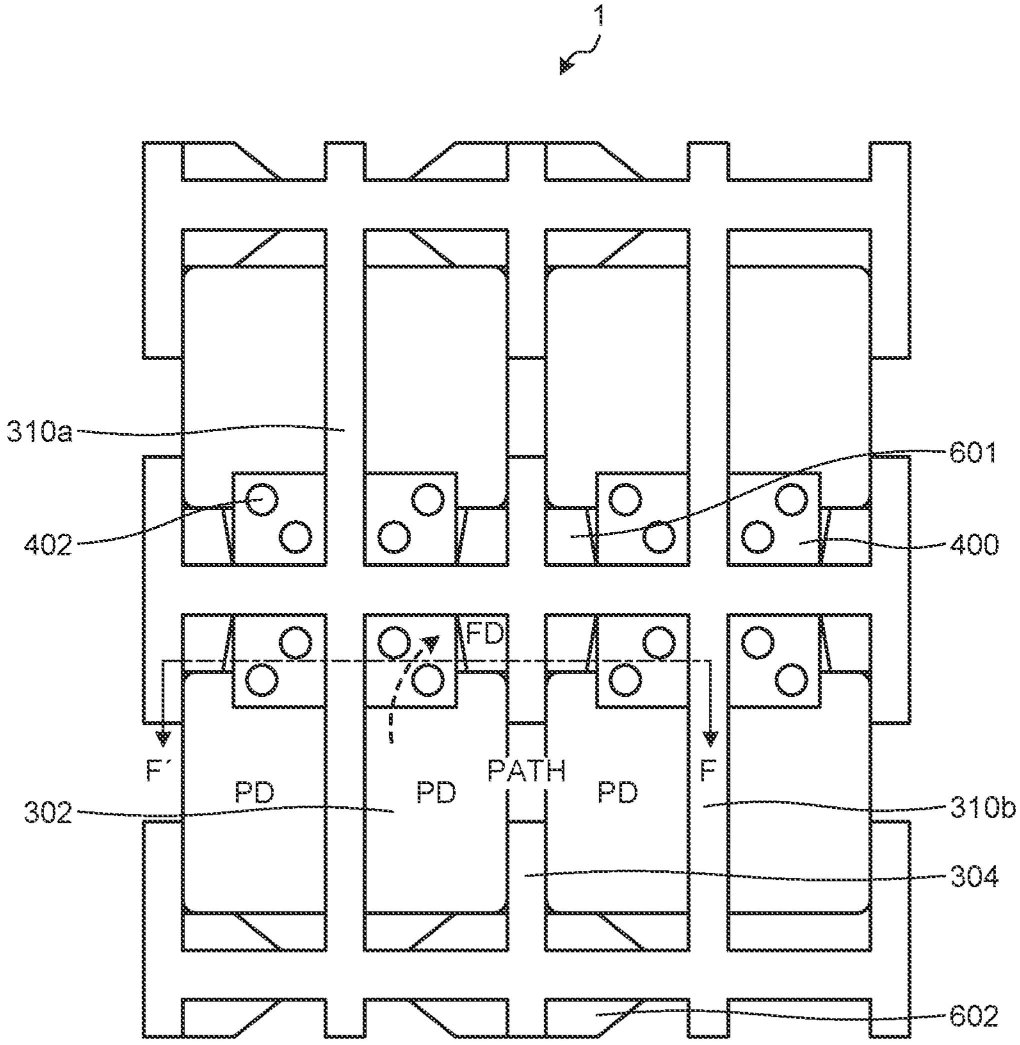
FIG. 25A is a plan view of a part of the imaging device 1 according to a modification of the third embodiment of the present disclosure.
Figure 25B:
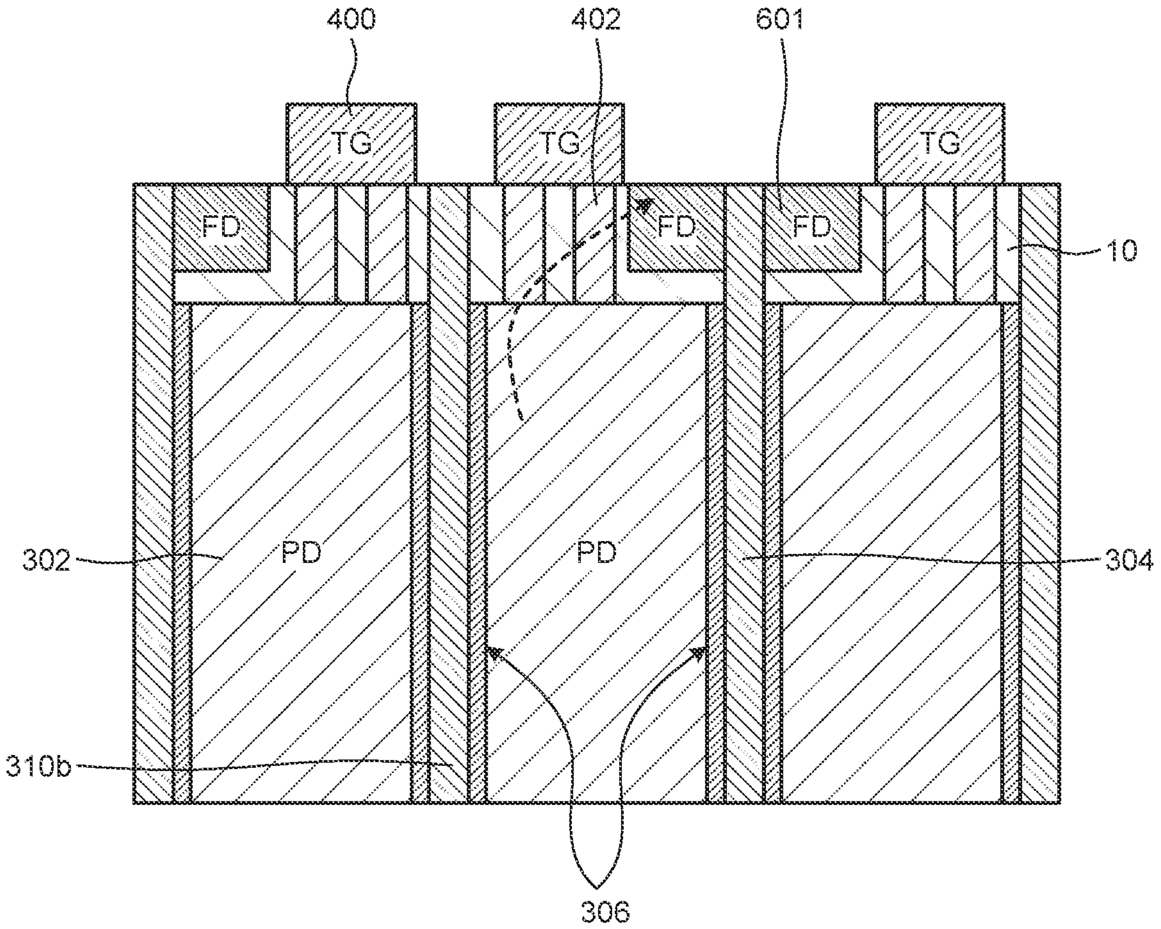
FIG. 25B is a sectional view of the part of the imaging device 1 according to the modification of the third embodiment of the present disclosure.

Further, the present embodiment can be modified. A modification of the transfer gate (the transfer gate electrode) 400 is explained with reference to FIG. 25A and FIG. 25B. FIG. 25A is a plan view of the imaging device 1 according to the present embodiment viewed from front surface 10*b*. FIG. 25B is a sectional view of a part of the imaging device 1 according to the present embodiment and, specifically, is a sectional view of the semiconductor substrate 10 taken along line F-F' illustrated in FIG. 25A.

As illustrated in FIG. 25A and FIG. 25B, the transfer gate (the transfer gate electrode) 400 includes two embedded electrode sections 402 embedded in the semiconductor substrate 10. Consequently, according to the present modification, it is easy to more effectively modulate the potential deeply in the semiconductor substrate 10. Electric charges from the photoelectric conversion sections 302 (the photodiodes: PDs) can be efficiently transferred to the floating diffusion section (FD section) (the charge storage section) 601. Note that the two embedded electrode sections 402 are preferably provided in a well-balanced manner not to disturb a path of electric charges from the photoelectric conversion sections 302 (the photodiodes: PDs) to the floating diffusion section (FD section) 601 and are not limited to be two or to have a circular cross section as long as the potential can be modulated as desired. For example, three or four or more embedded electrode sections 402 may be provided for one transfer gate 400 and the cross section of the embedded electrode sections 402 may have a circular shape, an elliptical shape, or a polygonal shape.

6. FOURTH EMBODIMENT

Figure 26:
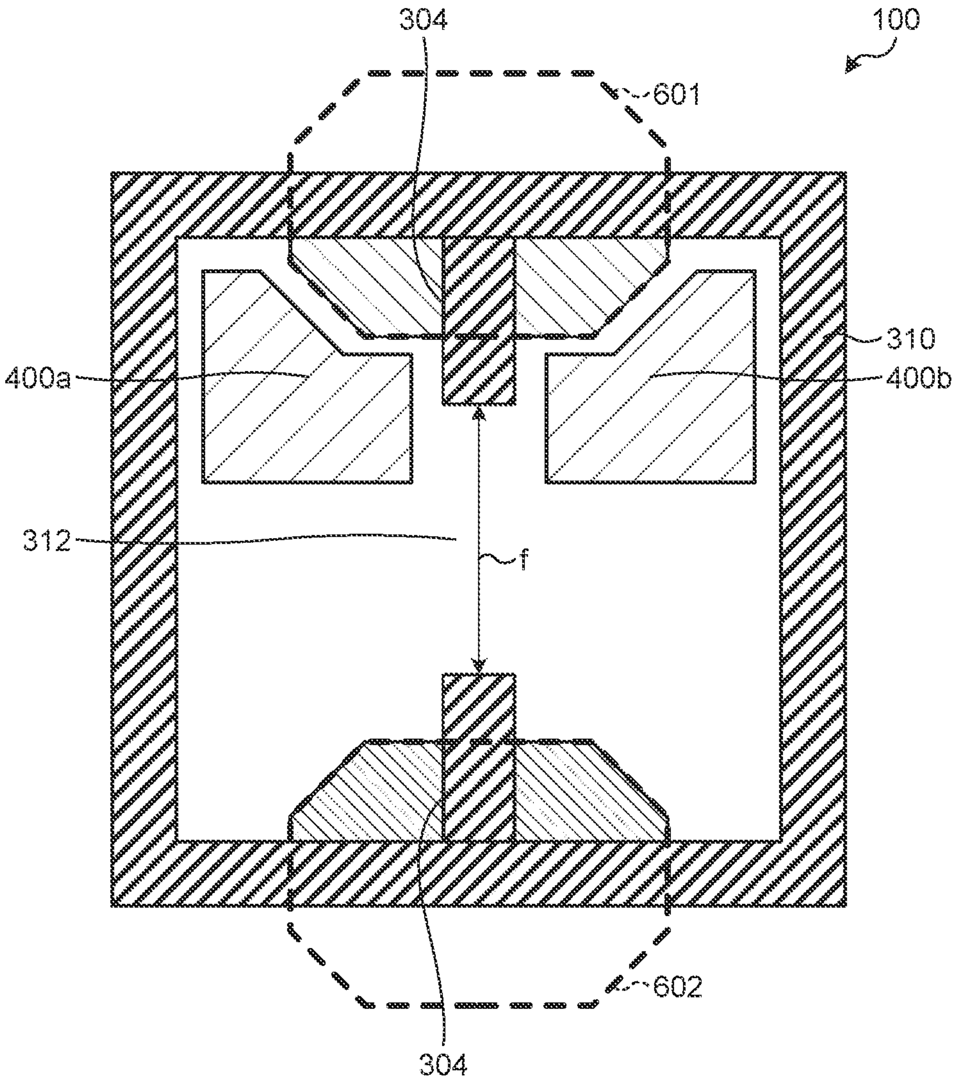
FIG. 26 is an explanatory diagram (part 1) illustrating a plane of the imaging element 100 according to a fourth embodiment of the present disclosure.
Figure 27:
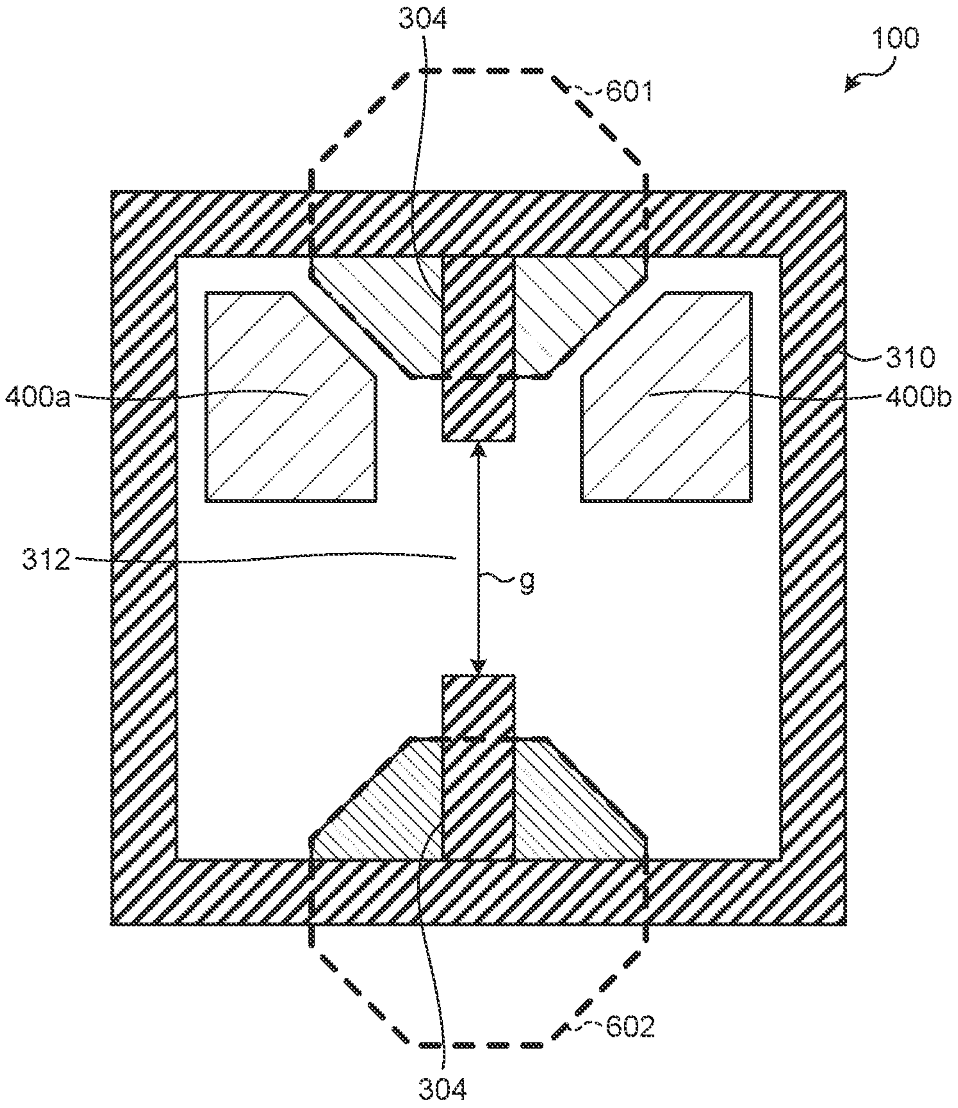
FIG. 27 is an explanatory diagram illustrating a plane of the imaging element 100 according to a comparative example of the fourth embodiment of the present disclosure.

In the embodiment of the present disclosure, the two transfer gates 400*a* and 400*b*, the FD section (the floating diffusion section) 601, and the ground section 602 may be disposed as illustrated in FIG. 26. In the following explanation, such an embodiment is explained as a fourth embodiment of the present disclosure with reference to FIG. 26 and FIG. 27. FIG. 26 is an explanatory diagram illustrating a plane of the imaging element 100 according to the present embodiment and, specifically, corresponds to a cross section of the imaging element 100 taken along a plane direction. FIG. 27 is an explanatory diagram illustrating a plane of the imaging element 100 according to a comparative example of the present embodiment and, specifically, corresponds to a cross section of the imaging element 100 according to the comparative example taken along a plane direction.

As illustrated in FIG. 26, in the present embodiment, the two transfer gates 400*a* and 400*b* are positioned on one end side (for example, the upper side of FIG. 26) of the cell region surrounded by the element separation wall 310. The cell region is included in the imaging element 100. In an example illustrated in FIG. 26, the cell region is a square.

The FD section 601 is a floating diffusion shared by two cell regions adjacent to each other (see a dotted line region in FIG. 26). The FD section 601 is positioned on one end side (for example, the upper side of FIG. 26) of the cell region. In the example illustrated in FIG. 26, the shape of the FD section 601 is not a regular octagon but is an octagon having long sides and short sides. Specifically, the FD section 601 is horizontally long and, in the FD section 601, the length in the direction orthogonal to an extending direction of the projecting section 304 is larger than the length in the extending direction of the projecting section 304. As the FD section 601, for example, Poly-Si (polycrystalline Si) is used.

The ground section 602 is a ground section shared by the two cell regions adjacent to each other (see a dotted line region in FIG. 26). The ground section 602 is positioned on one end side (for example, the lower side of FIG. 26) of the cell region. In the example illustrated in FIG. 26, the shape of the ground section 602 is not a regular octagon but is an octagon having long sides and short sides. Specifically, the ground section 602 is horizontally long and, in the ground section 602, the length in a direction orthogonal to an extending direction of the projecting section 304 is larger than the length in the extending direction of projecting section 304. As the ground section 602, for example, Poly-Si (polycrystalline Si) is used. The ground section 602 is ground (GND) potential and functions as, for example, a well contact.

Here, as illustrated in FIG. 27, when the shape of each of the FD section 601 and the ground section 602 is a regular octagon, width g (the length in the up-down direction in FIG. 27) of the slit 312 is smaller than width f (the length in the up-down direction in FIG. 27) of the slit 312 illustrated in FIG. 75. In FIG. 26 referred to above, a ratio of the width g of the slit 312 to a cell pitch (length in the up-down direction in FIG. 27) of the cell region is increased from the viewpoint of optical factors (improvement of Qe and suppression of color mixing) or because of further refining. For example, when the width g of the slit 312 illustrated in FIG. 27 increases, the region (a dividing section) of the slit 312 and the FD section 601 (for example, an N+ diffusion layer) and the ground section 602 (for example, a P+ diffusion layer) approach. Therefore, the FD section 601 and the ground section 602 sometimes interfere with the region of the slit 312 to cause an increase in variation of the single pixel Qs, FD white spot deterioration, and the like.

Therefore, in the present embodiment, as illustrated in FIG. 26, the shape of each of the FD section 601 and the ground section 602 is formed in a horizontally long shape. For example, in each of FD section 601 and ground section 602, the length in the extending direction of the projecting section 304 is smaller than the length in a direction orthogonal to the extending direction of projecting section 304. Consequently, the FD section 601 and the ground section 602 are further separated from the region (the dividing section) of the slit 312 compared with FIG. 27. Therefore, since the influence of the diffusion of the FD section 601 and the ground section 602 on the potential of the region of the slit 312 is suppressed, it is possible to suppress an increase in single pixel Qs variation, FD white spot deterioration, and the like. The shape of each of the transfer gates 400*a* and 400*b*, for example, the shape on the slit 312 side in the transfer gates 400*a* and 400*b* can be increased in size. It is possible to realize transfer improvement (improvement of transfer characteristics) and suppression of variation in potential barriers.

In the present embodiment, the ground section 602 can be modified as explained below. Therefore, a detailed configuration of the ground section 602 is explained with reference to FIG. 28 to FIG. 31. Each of FIG. 28 to FIG. 31 is an explanatory diagram illustrating a plane of the imaging element 100 according to the present embodiment and, specifically, corresponds to a cross section of the imaging element 100 taken along a plane direction.

Figure 28:
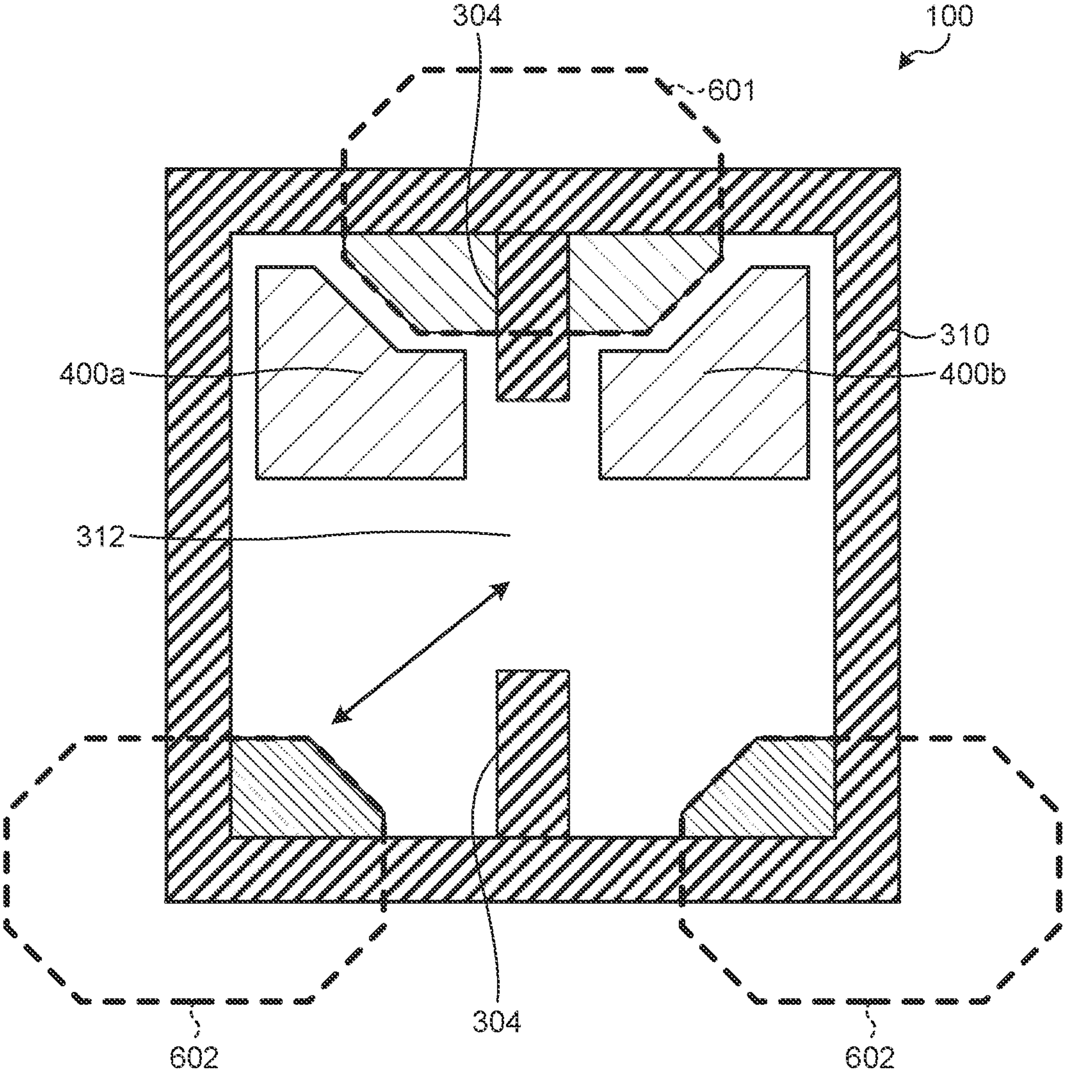
FIG. 28 is an explanatory diagram (part 2) illustrating the plane of the imaging element 100 according to the fourth embodiment of the present disclosure.

As illustrated in FIG. 28, in the present embodiment, ground sections 602 are provided at two of the four corners of the cell region. These ground sections 602 are ground sections shared by four cell regions adjacent to one another. In an example illustrated in FIG. 28, the ground section 602 is provided at the lower left and lower right of the four corners of the cell region. The ground sections 602 are shifted from the FD section 601 by a half of the cell pitch (the length in the left-right direction in FIG. 28) of the cell region. Consequently, the ground sections 602 are further away from the region of the slit 312 compared with FIG. 26 and FIG. 27. Therefore, an increase in single pixel Qs variation, FD white spot deterioration, and the like can be reliably suppressed.

Figure 29:
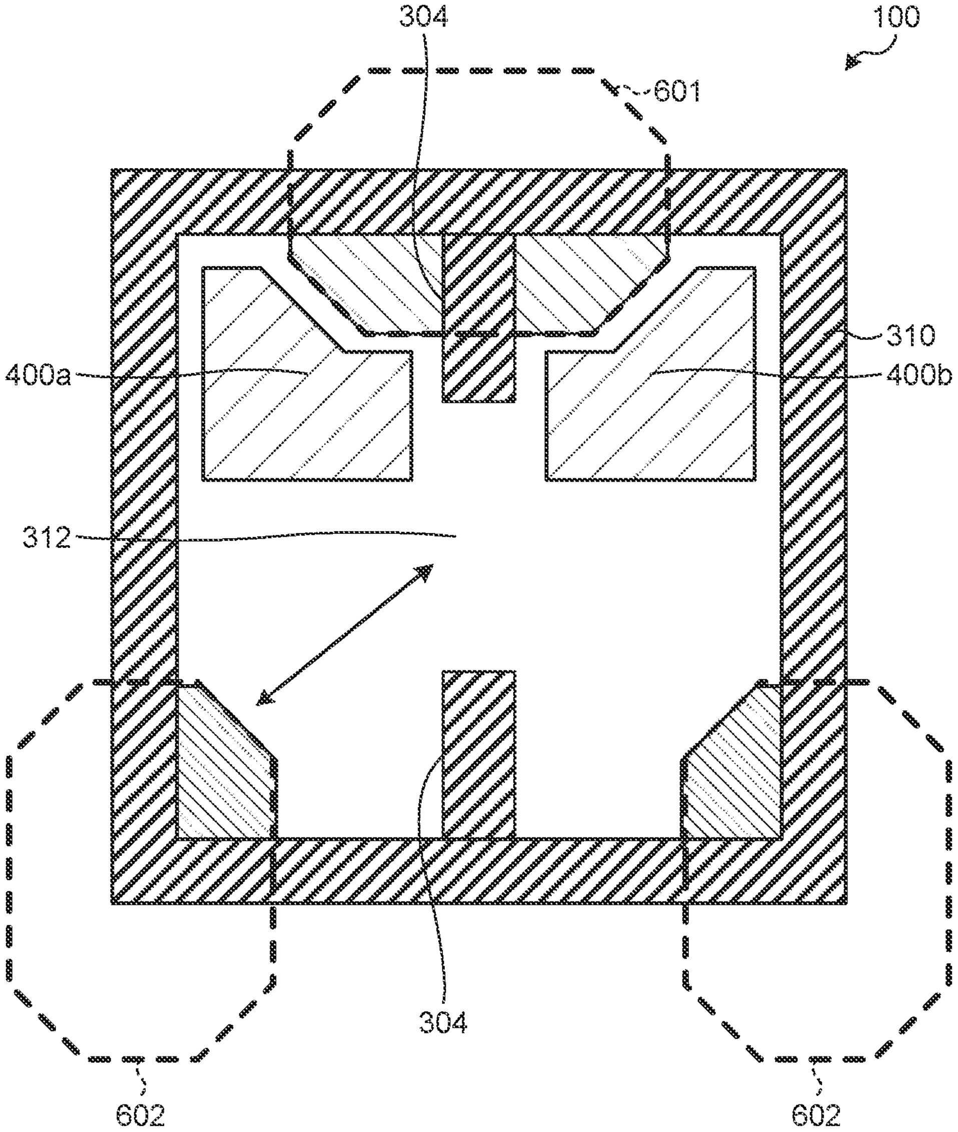
FIG. 29 is an explanatory diagram (part 3) illustrating the plane of the imaging element 100 according to the fourth embodiment of the present disclosure.

As illustrated in FIG. 29, in the present embodiment, the ground sections 602 illustrated in FIG. 28 are provided to be rotated by 90 degrees (the other components the same as the components illustrated in FIG. 28). Consequently, the ground sections 602 are farther away from the region of the slit 312 compared with FIG. 28. Therefore, it is possible to more reliably suppress an increase in single pixel Qs variation, FD white spot deterioration, and the like.

Figure 30:
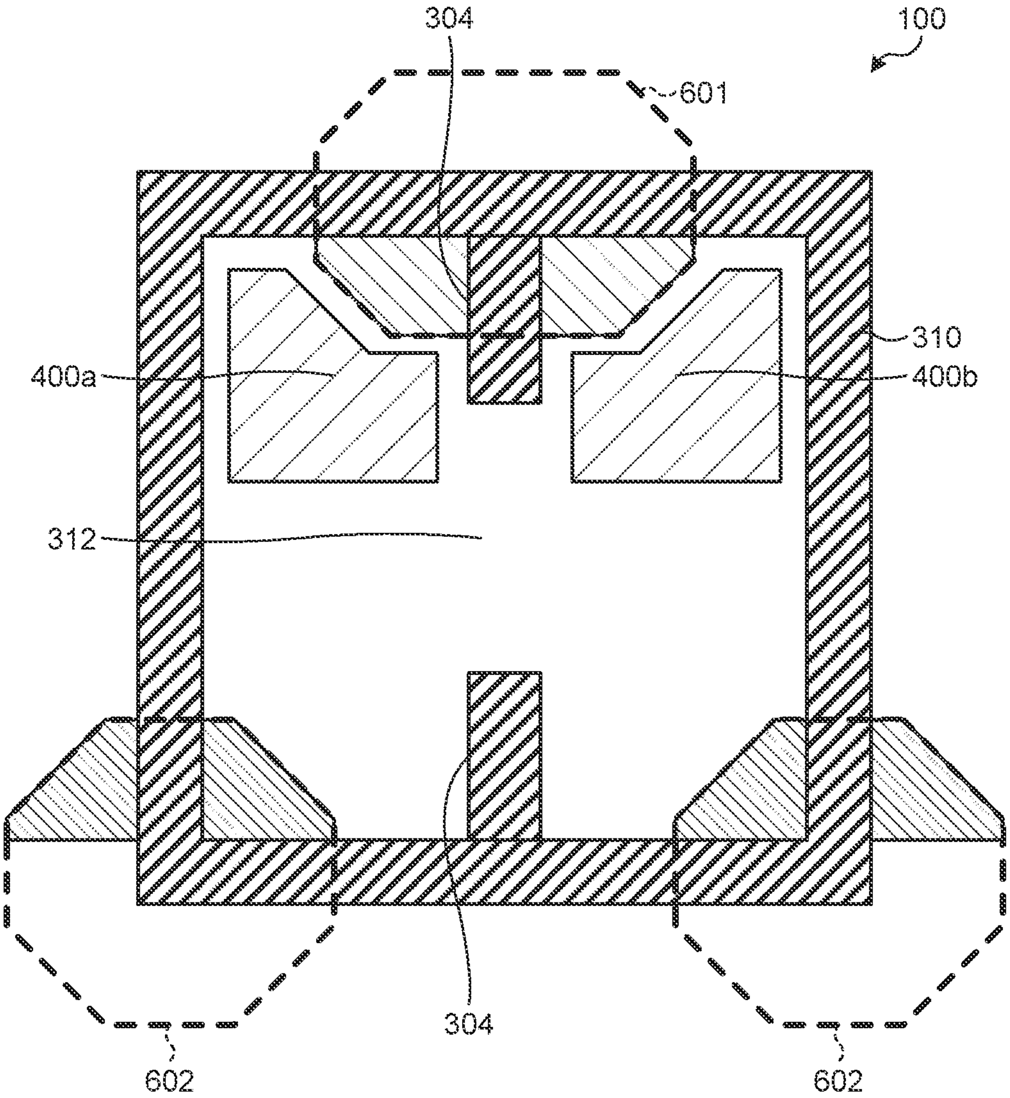
FIG. 30 is an explanatory diagram (part 4) illustrating the plane of the imaging element 100 according to the fourth embodiment of the present disclosure.

As illustrated in FIG. 30, in the present embodiment, the ground sections 602 illustrated in FIG. 28 is formed in a regular octagon (the other components are the same as the components illustrated in FIG. 28). In this case as well, the ground sections 602 are further away from the region of the slit 312 compared with FIG. 27. Therefore, an increase in single pixel Qs variation, FD white spot deterioration, and the like can be reliably suppressed.

Figure 31:
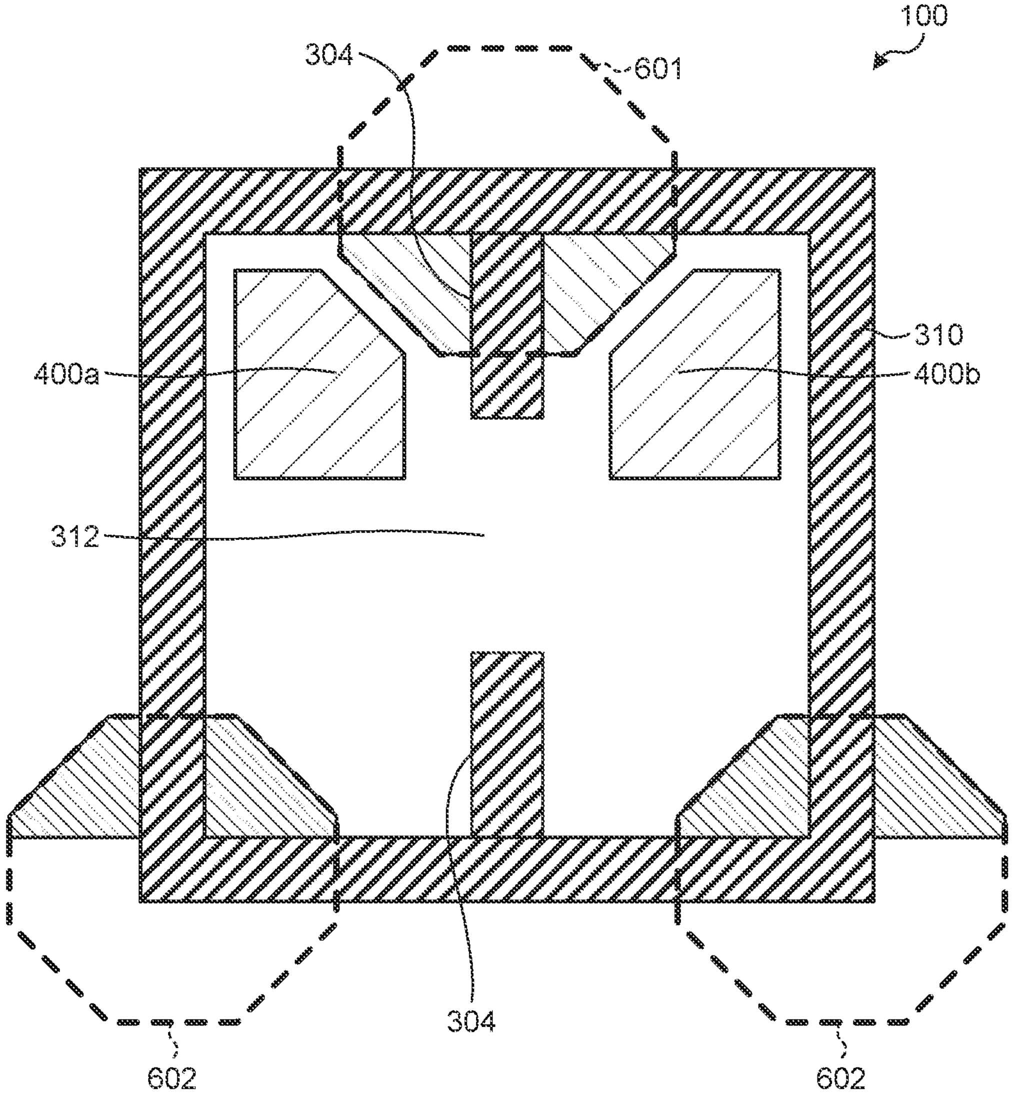
FIG. 31 is an explanatory diagram (part 5) illustrating the plane of the imaging element 100 according to the fourth embodiment of the present disclosure.

As illustrated in FIG. 31, in the present embodiment, the FD section 601 illustrated in FIG. 30 is formed in a regular octagon and the shapes of the transfer gates 400*a* and 400*b* are the same as the shapes illustrated in FIG. 74 (the other components are the same as the components illustrated in FIG. 30). In this case as well, the ground sections 602 are further away from the region of the slit 312 compared with FIG. 27. Therefore, an increase in single pixel Qs variation, FD white spot deterioration, and the like can be reliably suppressed.

Figure 32:
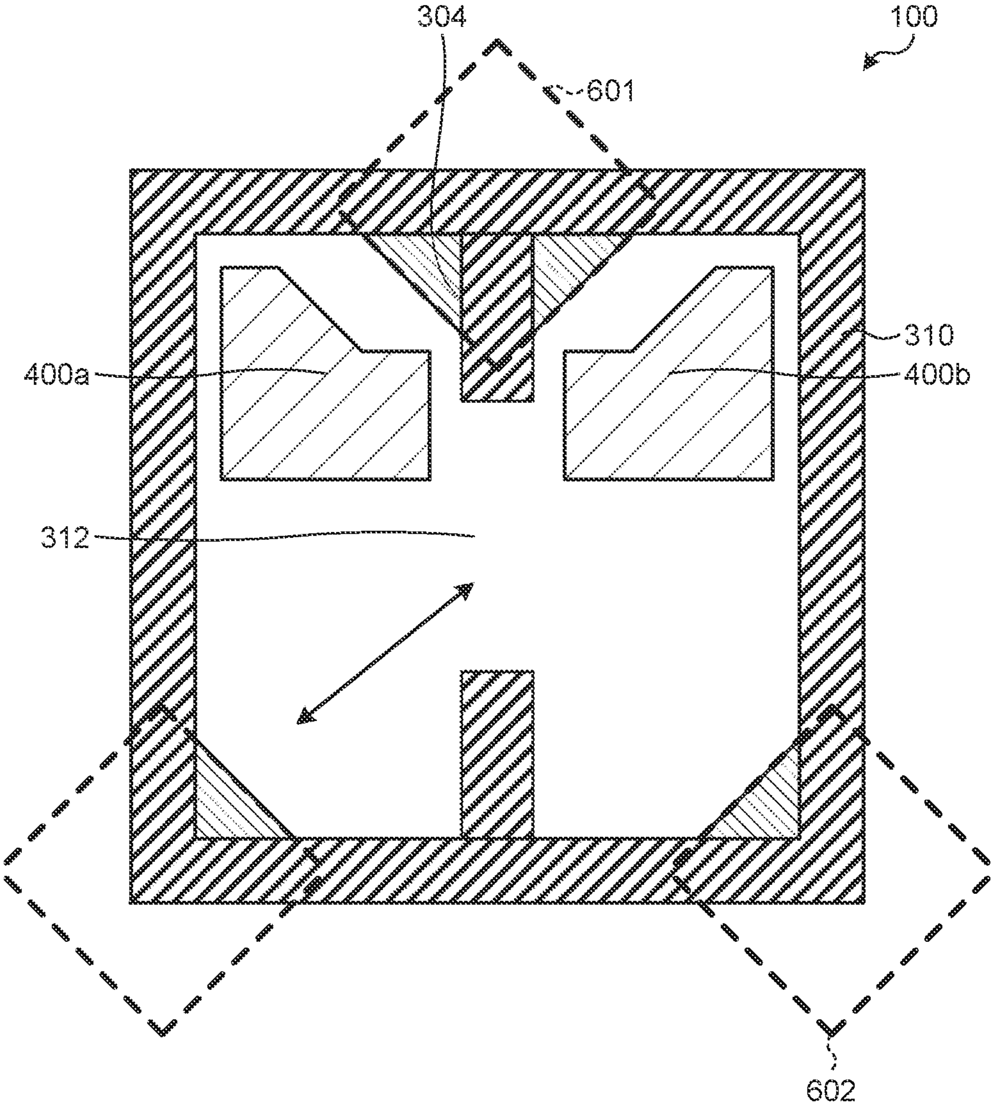
FIG. 32 is an explanatory diagram (part 6) illustrating the plane of the imaging element 100 according to the fourth embodiment of the present disclosure.
Figure 33:
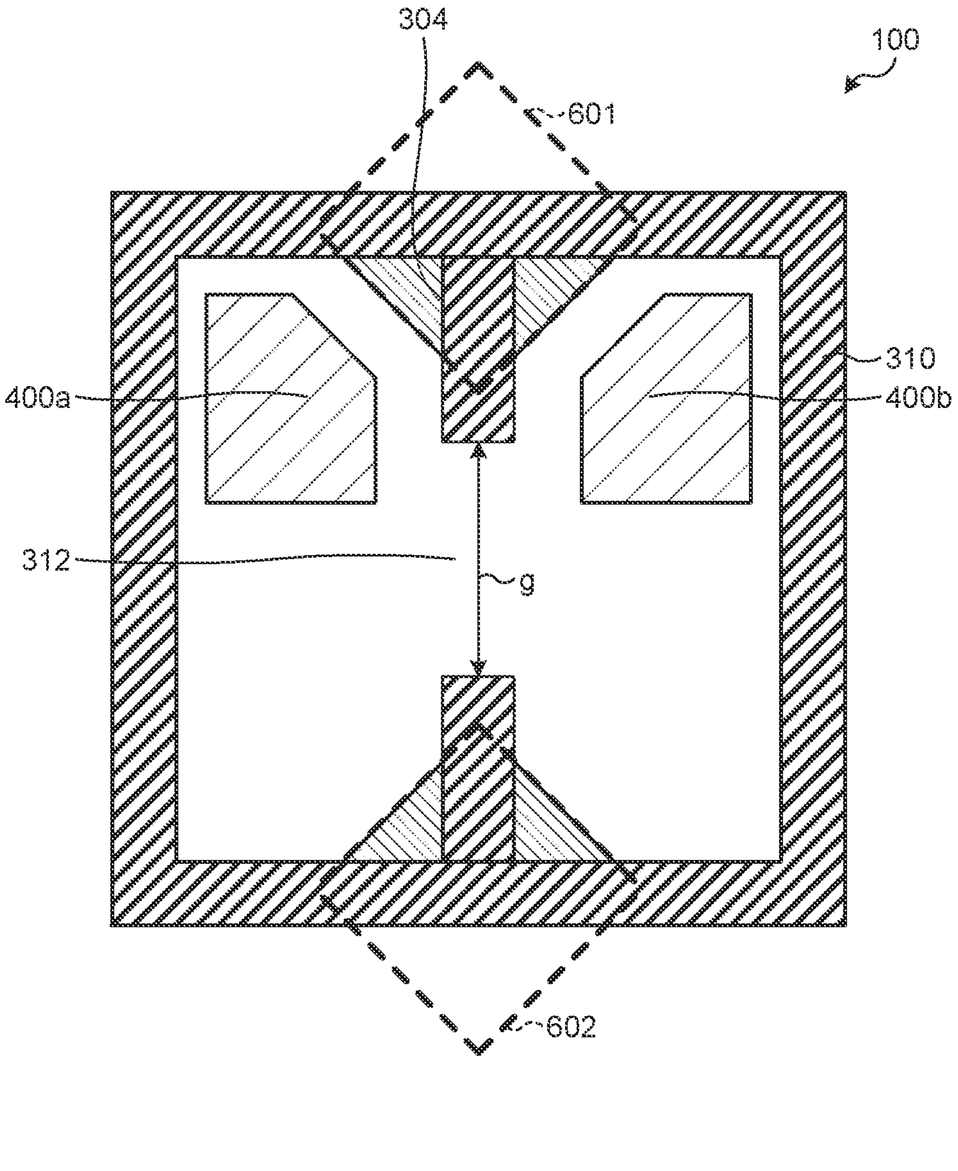
FIG. 33 is an explanatory diagram (part 7) illustrating the plane of the imaging element 100 according to the fourth embodiment of the present disclosure.
Figure 34:
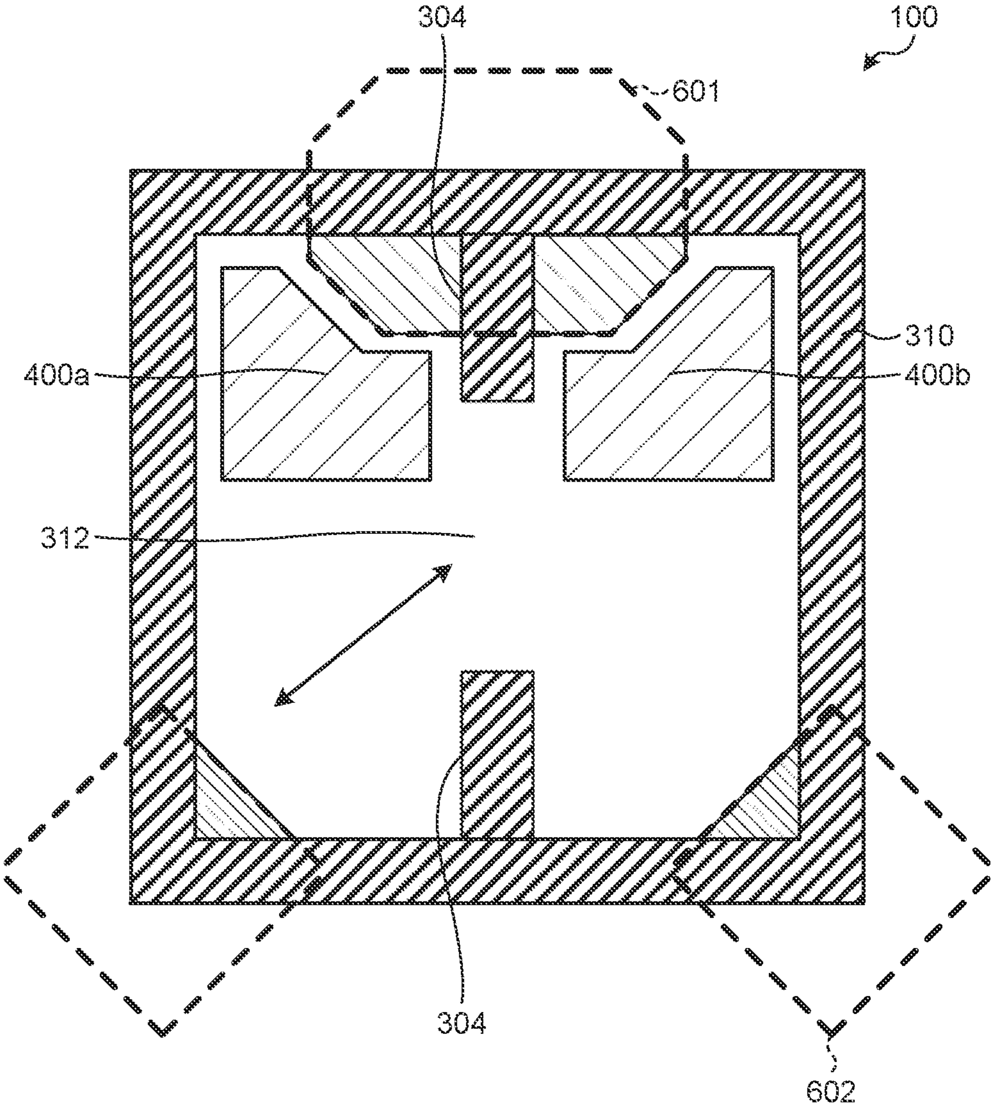
FIG. 34 is an explanatory diagram (part 8) illustrating the plane of the imaging element 100 according to the fourth embodiment of the present disclosure.

Further, in the present embodiment, the FD section 601 and the ground sections 602 can be modified as explained below. Therefore, detailed configurations of the FD section 601 and the ground sections 602 ware explained with reference to FIG. 32 to FIG. 34. FIG. 32 to FIG. 34 are explanatory diagrams illustrating a plane of the imaging element 100 according to the present embodiment and, specifically, correspond to a cross section of the imaging element 100 taken along a plane direction.

As illustrated in FIG. 32 and FIG. 33, in the present embodiment, the FD section 601 and the ground sections 602 are formed in a square shape (the other components are the same as the components illustrated in FIG. 28). Consequently, since the PD can be formed larger, the saturation signal amount (Qs) can be further increased.

As illustrated in FIG. 34, in the present embodiment, the ground sections 602 are formed in a square shape (the other components are the same as the components illustrated in FIG. 28). Consequently, since the PD can be formed larger, the saturation signal amount (Qs) can be further increased. Note that, in an example illustrated in FIG. 34, the transfer gate 400 is preferably increased in length in the row direction. Consequently, it is possible to reduce a load due to application of a high voltage while increasing the distance from the overflow path.

Note that the shapes of the FD section 601 and the ground sections 602 may be the same (see FIG. 26 to FIG. 29 and FIG. 31 to FIG. 33) or may be different (see FIG. 30 and FIG. 34). The shape of the FD section 601 or the ground sections 602 may be a shape having long sides and short sides, for example, a vertically and horizontally symmetrical shape (see FIG. 26 to FIG. 34), or a vertically and horizontally asymmetrical shape.

The FD section 601 and the ground sections 602 are arranged in an array (for example, in a matrix in the row direction and the column direction) but may be arranged at the same pitch as the cell pitch of the cell region or may be arranged by being shifted from each other by a half pitch.

The shapes of the FD section 601 and the ground sections 602 may be, for example, other polygonal shapes or elliptical shapes other than the octagonal shape having the long sides and the short sides.

7. SUMMARY

7.1 Summary

As explained above, according to the embodiment of the present disclosure, it is possible to avoid deterioration of a captured image while improving the accuracy of phase difference detection.

Note that, in the embodiment of the present disclosure explained above, a case where the present disclosure is applied to a back-illuminated CMOS image sensor structure is explained. However, the embodiment of the present disclosure is not limited to this and may be applied to other structures.

Note that, in the embodiment of the present disclosure explained above, the imaging element 100 in which the first conductivity type is the n-type, the second conductivity type is the p-type, and electrons are used as signal charges is explained. However, embodiments of the present disclosure are not limited to such an example. For example, the present embodiment can be applied to the imaging element 100 in which the first conductivity type is the p-type, the second conductivity type is the n-type, and holes are used as signal charges.

In the embodiment of the present disclosure explained above, the semiconductor substrate 10 may not always be a silicon substrate and may be another substrate (for example, an SOI (Silicon On Insulator) substrate, an SiGe substrate, or the like). The semiconductor substrate 10 may be a semiconductor substrate in which a semiconductor structure and the like are formed on such various substrates.

Further, the imaging device 1 according to the embodiment of the present disclosure is not limited to an imaging device that detects a distribution of an incident light amount of visible light and images the distribution as an image. For example, the present embodiment can be applied to an imaging device that images a distribution of an incident amount of an infrared ray, an X-ray, particles, or the like as an image and an imaging device (a physical quantity distribution detection device) such as a fingerprint detection sensor that detects a distribution of another physical quantity such as pressure or capacitance and image the distribution as an image.

The imaging device 1 according to the embodiment of the present disclosure can be manufactured using a method, an apparatus, and conditions used for manufacturing a general semiconductor device. That is, the imaging device 1 according to the present embodiment can be manufactured using an existing manufacturing process for a semiconductor device.

Note that examples of the method explained above include a PVD (Physical Vapor Deposition) method, a CVD (Chemical Vapor Deposition) method, and an ALD (Atomic Layer Deposition) method. Examples of the PVD method include a vacuum vapor deposition method, an EB (electron beam) vapor deposition method, various sputtering methods (a Magnetron sputtering method, an RF (Radio Frequency)-DC (Direct Current) coupled bias sputtering method, an ECR (Electron Cyclotron Resonance) sputtering method, a counter target sputtering method, a high frequency sputtering method, and the like), an ion plating method, a laser ablation method, a molecular beam epitaxy (MBE) method, and a laser transfer method. Examples of the CVD method include a plasma CVD method, a thermal CVD method, an organic metal (MO) CVD method, and a photo CVD method. Further, other methods include an electrolytic plating method, an electroless plating method, a spin coating method; an immersion method; a cast method; a micro-contact printing; a drop cast method; a various printing methods such as a screen printing method, an inkjet printing method, an offset printing method, a gravure printing method, and a flexographic printing method; a stamping method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. Further, examples of the patterning method include chemical etching such as shadow mask, laser transfer, and photolithography and physical etching by ultraviolet rays, laser, or the like. In addition, examples of a planarization technology include a CMP (Chemical Mechanical Polishing) method, a laser planarization method, and a reflow method.

7.2 Other Forms

Note that, in the embodiment of the present disclosure explained above, the structures of the projecting section 304 and the pixel separation wall 334 are explained. However, the structure according to the embodiment of the present disclosure is not limited thereto. Here, various forms of the structures of the sections are explained in detail with reference to FIG. 35 to FIG. 40.

Figure 35:
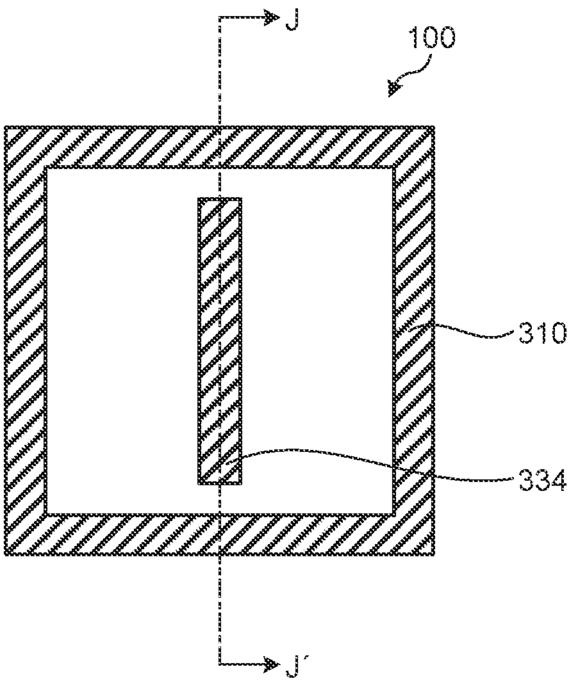
FIG. 35 is an explanatory diagram (part 1) illustrating a plane of the imaging element 100 according to another embodiment of the present disclosure.
Figure 36:
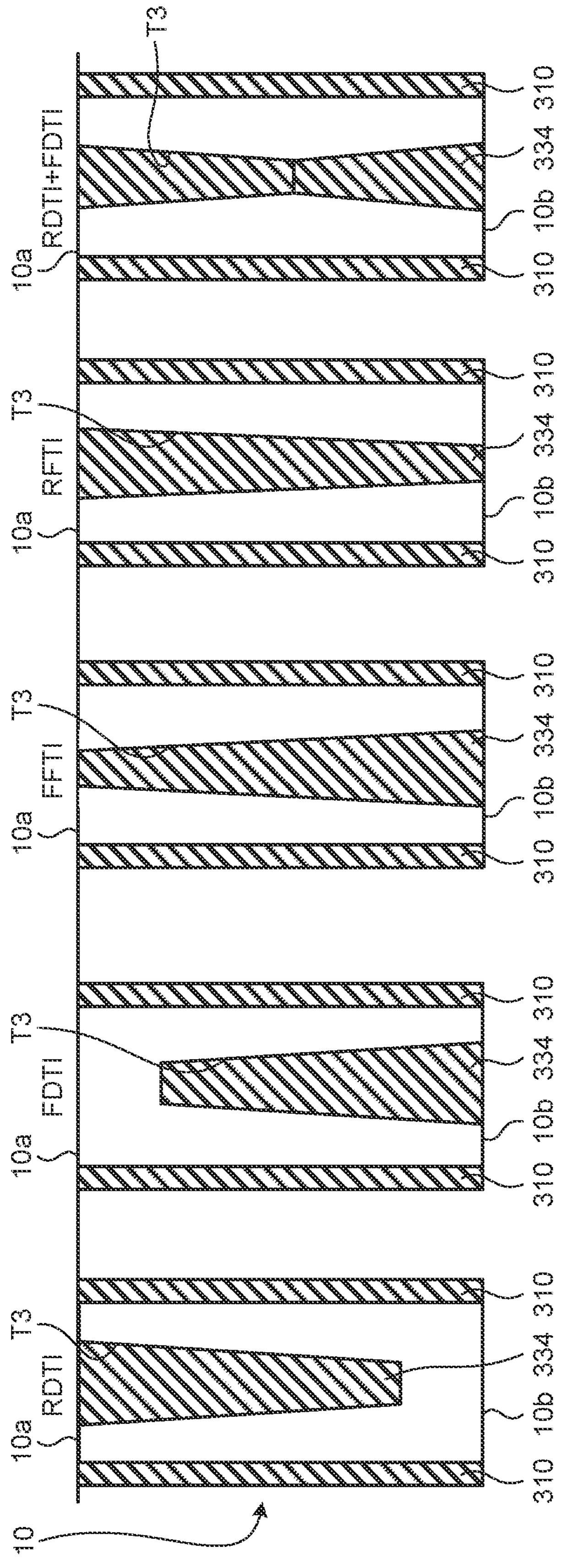
FIG. 36 is an explanatory diagram (part 1) illustrating a part of a cross section of the imaging element 100 for each structure according to the other embodiment of the present disclosure.

FIG. 35 is an explanatory diagram illustrating a plane of the imaging element 100 according to the present embodiment (modification) and, specifically, corresponds to a cross section of the imaging element 100 taken along a plane direction. FIG. 36 is an explanatory diagram illustrating a part of a cross section of the imaging element 100 for each structure, that is, the semiconductor substrate 10 for each structure according to the present embodiment (modification) and, specifically, corresponds to a cross section of the semiconductor substrate 10 for each structure taken along line J-J' illustrated in FIG. 35.

As illustrated in FIG. 35 and FIG. 36, the pixel separation wall 334 is formed in any structure of RDTI (rear surface DTI), FDTI (front surface DTI), FFTI (front surface FTI: Full Trench Isolation), RFTI (rear surface FTI), and RDTI+FDTI. In these structures, a trench T3 is formed in the thickness direction of the semiconductor substrate 10. A material such as an oxide film is embedded in the trench T3. In an example illustrated in FIG. 36, the trench T3 is formed in a tapered shape expanding from the surface toward the inside of the semiconductor substrate 10. However, the trench T3 is not limited to this. For example, the trench T3 may be formed straight to be orthogonal (or substantially orthogonal) to the surface of the semiconductor substrate 10.

The RDTI is structure in which the trench T3 is formed from the light receiving surface 10*a* of the semiconductor substrate 10 to halfway in the semiconductor substrate 10. The FDTI is structure in which a trench is formed from the front surface 10*b* of the semiconductor substrate 10 to halfway in the semiconductor substrate 10. The FFTI is structure formed by causing the trench T3 to pierce through the semiconductor substrate 10 from the front surface 10*b* to the light receiving surface 10*a* of the semiconductor substrate 10. The RFTI is a method of forming the trench T3 to pierce through the semiconductor substrate 10 from the light receiving surface 10*a* to the front surface 10*b* of the semiconductor substrate 10. The RDTI+FDTI is a method in which the RDTI and the FDTI explained above are combined. In the RDTI+FDTI, the trench T3 extending from the light receiving surface 10*a* and the trench T3 extending from the front surface 10*b* are connected near the center in the thickness direction of the semiconductor substrate 10.

Figure 37:
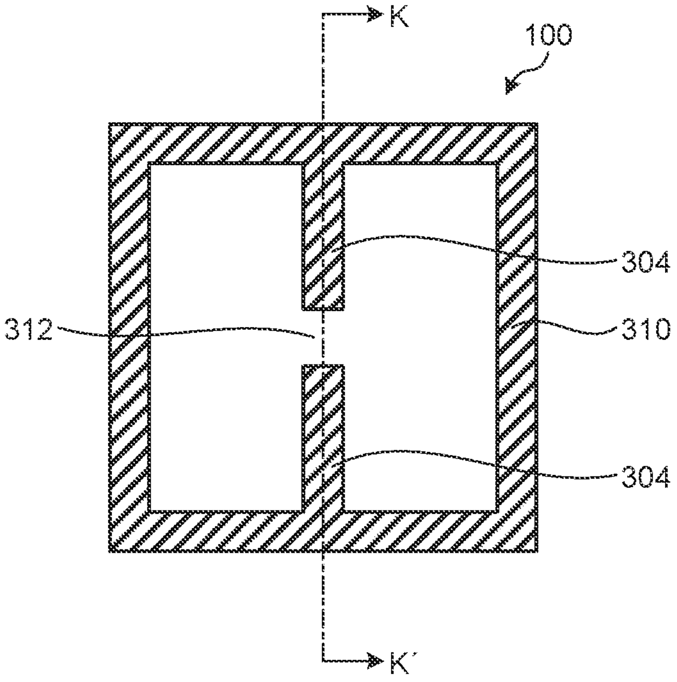
FIG. 37 is an explanatory diagram (part 2) illustrating the plane of the imaging element 100 according to the other embodiment of the present disclosure.
Figure 38:
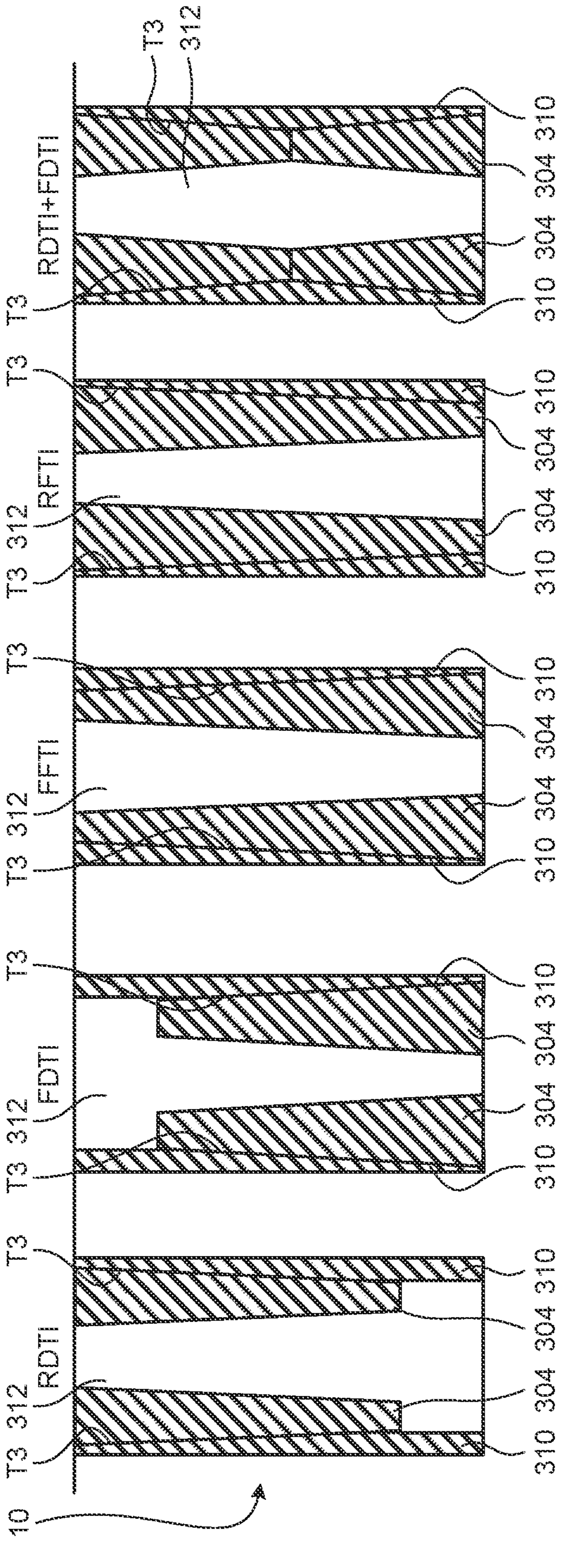
FIG. 38 is an explanatory diagram (part 2) illustrating the part of the cross section of the imaging element 100 for each structure according to the other embodiment of the present disclosure.

FIG. 37 is an explanatory diagram illustrating a plane of the imaging element 100 according to the present embodiment (modification) and, specifically, corresponds to a cross section of the imaging element 100 taken along a plane direction. FIG. 38 is an explanatory diagram illustrating a part of a cross section of the imaging element 100 for each structure, that is, the semiconductor substrate 10 for each structure according to the present embodiment (modification) and, specifically, corresponds to a cross section of the semiconductor substrate 10 for each structure taken along line K-K' illustrated in FIG. 37.

As illustrated in FIG. 37 and FIG. 38, the projecting section 304 is formed in any one structure among RDTI, FDTI, FFTI, RFTI, and RDTI+FDTI that are the same as the structures of the pixel separation wall 334 explained above (see FIG. 36). In these structures, a trench T3 is formed in the thickness direction of the semiconductor substrate 10. At this time, as illustrated in FIG. 38, the trench T3 is formed such that the projecting section 304 is in contact with and is not separated from the element separation wall 310. A material to be an oxide film or the like is embedded in the trench T3. In an example illustrated in FIG. 38, the trench T3 is formed in a tapered shape expanding from the surface toward the inside of the semiconductor substrate 10. However, the trench T3 is not limited to this. For example, the trench T3 may be formed straight to be orthogonal (or substantially orthogonal) to the surface of the semiconductor substrate 10.

Figure 39:
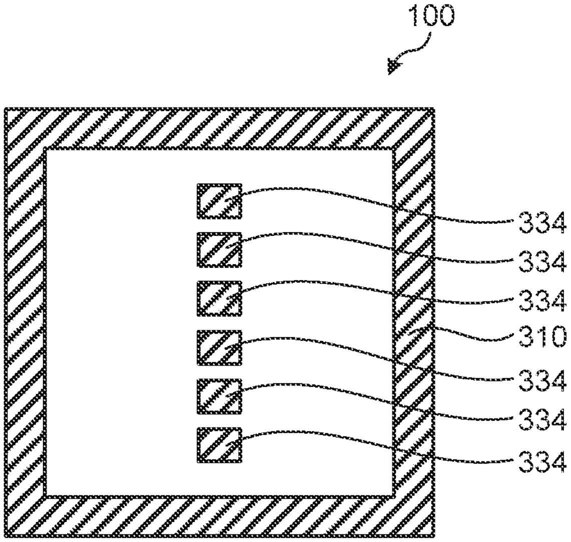
FIG. 39 is an explanatory diagram (part 3) illustrating the plane of the imaging element 100 according to the other embodiment of the present disclosure.
Figure 40:
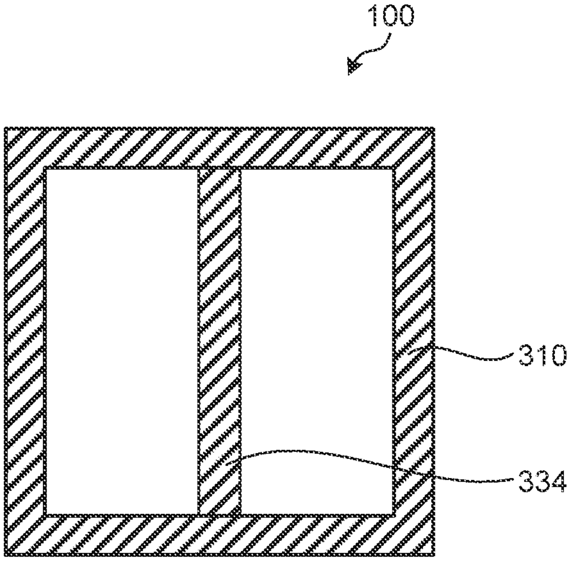
FIG. 40 is an explanatory diagram (part 4) illustrating the plane of the imaging element 100 according to the other embodiment of the present disclosure.

Here, as the pixel separation wall 334, another structure may be used besides one pixel separation wall 334 that is not in contact with the element separation wall 310 as illustrated in FIG. 35. For example, as illustrated in FIG. 39, a plurality of pixel separation walls 334 may be formed in a row in a dot shape not to be in contact with the element separation wall 310. In an example illustrated in FIG. 39, the number of the pixel separation walls 334 is six. However, the number is not limited. As illustrated in FIG. 40, the pixel separation wall 334 may be formed such that both ends thereof are in contact with the element separation wall 310. Note that, in examples illustrated in FIG. 35, FIG. 39, and FIG. 40, the pixel separation wall 334 is formed in the column direction. However, the pixel separation wall 334 is not limited to this and, for example, may be formed in the row direction.

Figure 41:
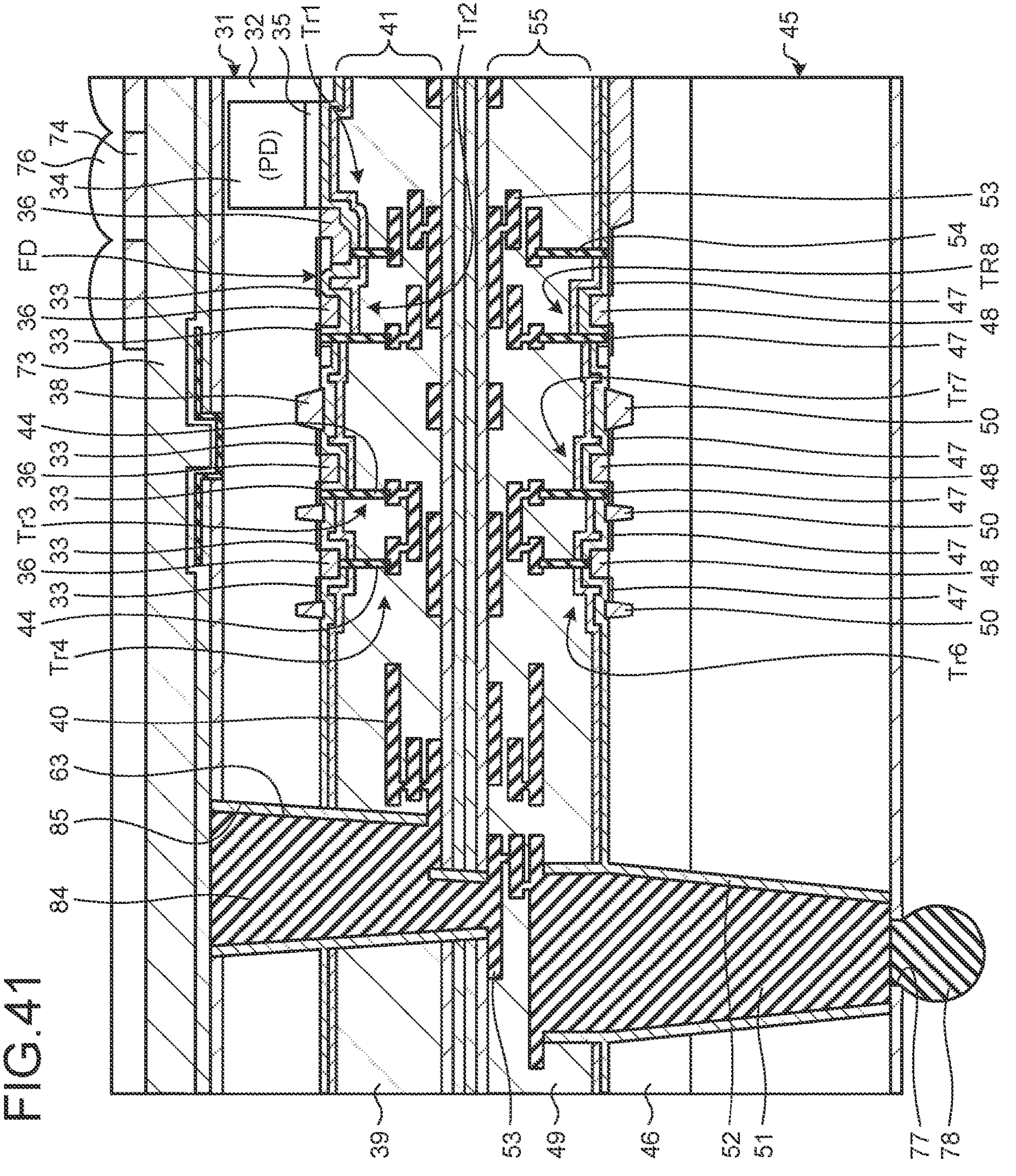
FIG. 41 is an explanatory diagram illustrating a cross section of a two-layer stacked type structure to which the imaging device 1 according to the embodiment of the present disclosure can be applied.
Figure 42:
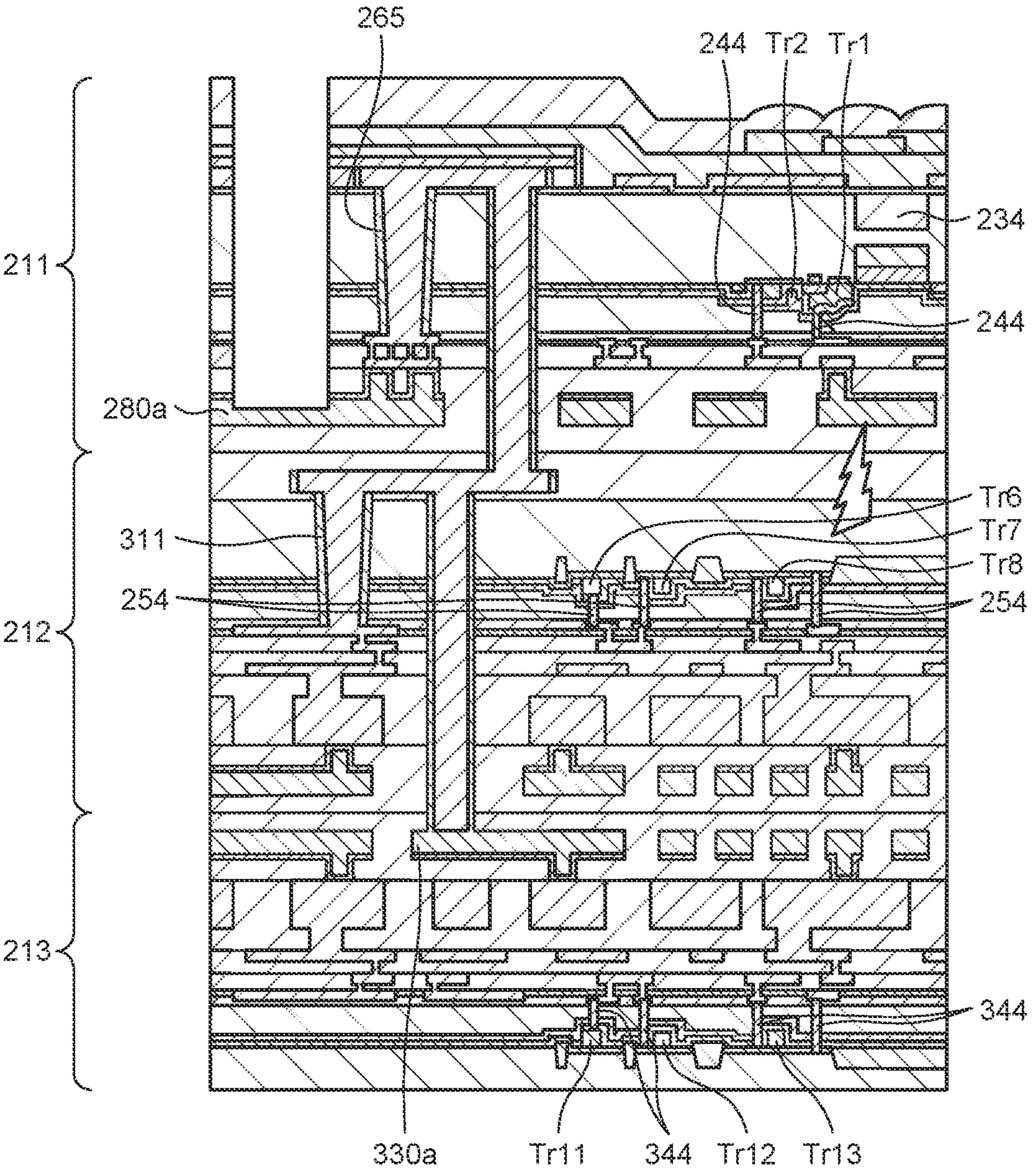
FIG. 42 is an explanatory diagram illustrating a cross section of a three-layer stacked type structure to which the imaging device 1 according to the embodiment of the present disclosure can be applied.
Figure 43:
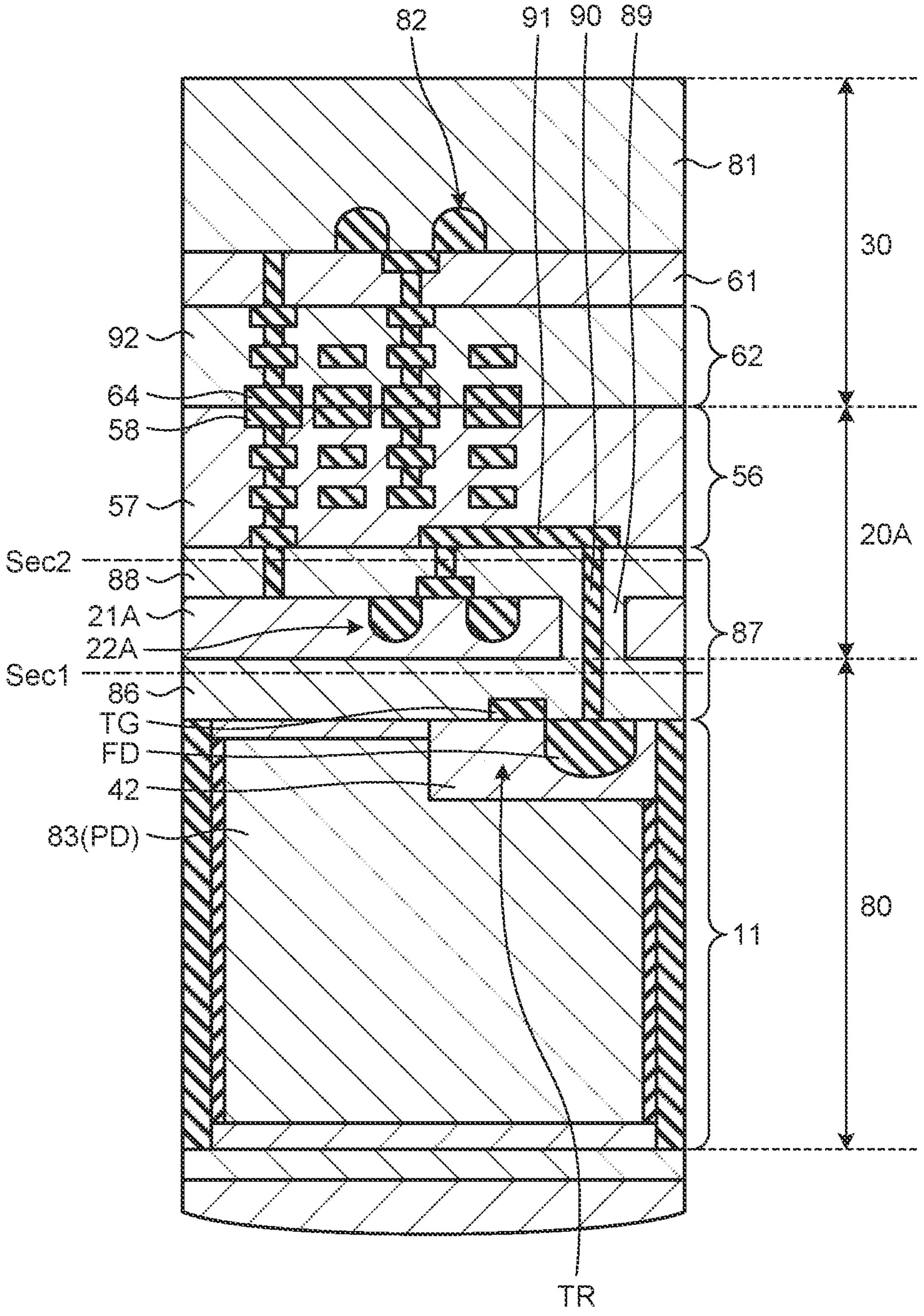
FIG. 43 is an explanatory diagram illustrating a cross section of a two-stage pixel structure to which the imaging device 1 according to the embodiment of the present disclosure is can be applied.

Note that, in the embodiment of the present disclosure explained above, a case in which the present disclosure is applied to a one-layer CMOS image sensor structure is explained. However, the embodiment of the present disclosure is not limited thereto and may be applied to other structures such as a stacked CMOS image sensor (CIS) structure. For example, as illustrated in FIG. 41 to FIG. 43, the embodiments of the present disclosure may be applied to a two-layer stacked CIS, a three-layer stacked CIS, a two-stage pixel CIS, or the like. The application to the two-stage pixel CIS is an example. Application to a one-stage pixel is also possible. Here, the structures of the two-layer stacked CIS, the three-layer stacked CIS, and the two-stage pixel CIS are explained in detail with reference to FIG. 41 to FIG. 43.

(Two-Layer Stacked CIS)

FIG. 41 illustrates an example of a two-layer stacked structure to which the embodiment of the present disclosure is applicable. FIG. 41 is an explanatory diagram illustrating a cross section of a two-layer stacked type structure to which the imaging device 1 according to the embodiment of the present disclosure can be applied.

In the structure illustrated in FIG. 41, the imaging device 1 includes electrically connecting, using one through-connection conductor 84 formed on the first semiconductor substrate 31, the pixel region (the pixel array unit 20) and the control circuit unit 25 on the first semiconductor substrate 31 side and a logic circuit (not illustrated) on a second semiconductor substrate 45 side. That is, in the example illustrated in FIG. 41, the first semiconductor substrate 31 and the second semiconductor substrate 45 are stacked. The semiconductor substrates 31 and 45 are electrically connected by the through-connection conductor 84. Specifically, a through-connection hole 85 that pierces through the first semiconductor substrate 31 from a rear surface 31*b* side of the first semiconductor substrate, reaches a wire 53 in the top layer of the second semiconductor substrate 45, and reaches a wire 40 in the top layer of the first semiconductor substrate 31 is formed. After an insulating film 63 is formed on the inner wall surface of the through-connection hole 85, a through-connection conductor 84 for connecting the wire 40 on the side of the pixel region and the control circuit unit 25 side and the wire 53 on the logic circuit side is embedded in the through-connection hole 85. In FIG. 41, since the through-connection conductor 84 is connected to the wire 40 in the top layer, the wires 40 in the layers are connected to one another such that the connected wire 40 in the top layer is a connection end.

In the structure illustrated in FIG. 41, photodiodes (PDs) serving as photoelectric conversion sections of the pixels are formed in a semiconductor well region 32 of the first semiconductor substrate 31. Further, source/drain regions 33 of pixel transistors are formed in the semiconductor well region 32. The semiconductor well region 32 is formed by introducing, for example, p-type impurities. The source/drain regions 33 are formed by introducing, for example, n-type impurities. Specifically, the photodiode (PD) and the source/drain regions 33 of the pixel transistors are formed by ion implantation from the substrate surface.

The photodiode (PD) has an n-type semiconductor region 34 and a p-type semiconductor region 35 on the substrate surface side. Gate electrodes 36 are formed on the surfaces of substrates configuring pixels via gate insulating films. Pixel transistors Tr1 and Tr2 are formed by the source/drain regions 33 paired with the gate electrodes 36. For example, the pixel transistor Tr1 adjacent to the photodiode (PD) corresponds to a transfer transistor. A source/drain region of the pixel transistor Tr1 corresponds to a floating diffusion (FD). Unit pixels are separated by element separation regions 38.

On the first semiconductor substrate 31, MOS transistors Tr3, Tr4 configuring a control circuit are formed. The MOS transistors Tr3 and Tr4 are formed by the n-type source/drain regions 33 and the gate electrodes 36 formed via a gate insulating film. Further, an interlayer insulating film 39 in a first layer is formed on the surface of the first semiconductor substrate 31. Connection conductors 44 connected to required transistors are formed in the interlayer insulating film 39. In addition, a multilayer wiring layer 41 is formed by the wires 40 in a plurality of layers via the interlayer insulating film 39 to be connected to the connection conductors 44.

As illustrated in FIG. 41, a plurality of MOS transistors configuring a logic circuit separated by element separation regions 50 are formed in a p-type semiconductor well region 46 on the front surface side of the second semiconductor substrate 45. Each of MOS transistors Tr6, Tr7, Tr8 includes a pair of n-type source/drain regions 47 and a gate electrode 48 formed via a gate insulating film. An interlayer insulating film 49 in a first layer is formed on the surface of the second semiconductor substrate 45. A connection conductor 54 connected to a required transistor is formed in the interlayer insulating film 49. Further, a connection conductor 51 piercing through the interlayer insulating film 49 from the surface of the interlayer insulating film 49 to desired depth in the second semiconductor substrate 45 is provided. Further, an insulating film 52 for insulating the connection conductor 51 and the semiconductor substrate 45 is provided.

A multilayer wiring layer 55 is formed by providing wires 53 in a plurality of layers in the interlayer insulating film 49 to be connected to the connection conductors 54 and the connection conductor 51 for electrode extraction.

Further, as illustrated in FIG. 41, the first semiconductor substrate 31 and the second semiconductor substrate 45 are bonded to each other such that the multilayer wiring layers 41 and 55 thereof face each other.

As illustrated in FIG. 41, for example, color filters 74 of red (R), green (G), and blue (B) are provided on a flattening film 73 to correspond to pixels. On-chip lenses 75 are provided on the color filters 74.

On the other hand, on the second semiconductor substrate 45 side, an opening 77 corresponding to the connection conductor 51 is provided. A spherical electrode bump 78 electrically connected to the connection conductor 51 through the opening 77 is provided.

(Three-Layer Stacked CIS)

FIG. 42 illustrates an example of a three-layer stacked structure to which the embodiment of the present disclosure can be applied. FIG. 42 is an explanatory diagram illustrating a cross section of a three-layer stacked structure to which the imaging device 1 according to the embodiment of the present disclosure can be applied.

In the structure illustrated in FIG. 42, in the imaging device 1, a first semiconductor substrate 211, a second semiconductor substrate 212, and a third semiconductor substrate 213 are stacked to form a three-layer stacked structure. Specifically, in the structure illustrated in FIG. 42, for example, the imaging device 1 includes, in addition to the first semiconductor substrate 211 on which a sensor circuit is formed and the second semiconductor substrate 212 on which a logic circuit is formed, the third semiconductor substrate 213 on which a memory circuit is formed. Note that the logic circuit and the memory circuit are configured to operate while involving input and output of signals to and from the outside.

As illustrated in FIG. 42, a photodiode (PD) 234 serving as a photoelectric conversion section of a pixel is formed in the first semiconductor substrate 211. Source/drain regions of pixel transistors are formed in a semiconductor well region of the first semiconductor substrate 211. Further, a gate electrode is formed on the substrate surface of the first semiconductor substrate 211 via a gate insulating film. The pixel transistor Tr1 and the pixel transistor Tr2 are provided by a source/drain region paired with the gate electrode. Specifically, the pixel transistor Tr1 adjacent to the photodiode (PD) 234 is equivalent to a transfer transistor. A source/drain region of the pixel transistor Tr1 is equivalent to a floating diffusion (FD). An interlayer insulating film (not illustrated) is provided on the first semiconductor substrate 211. A connection conductor 244 connected to the pixel transistors Tr1 and Tr2 is provided in the interlayer insulating film.

Further, a contact 265 used for electrical connection to the second semiconductor substrate 212 is provided on the first semiconductor substrate 211. The contact 265 is connected to a contact 311 of a second semiconductor substrate 212 explained below and is also connected to a pad 280*a* of the first semiconductor substrate 211.

On the other hand, a logic circuit is formed on the second semiconductor substrate 212. Specifically, the MOS transistor Tr6, the MOS transistor Tr7, and the MOS transistor Tr8, which are a plurality of transistors configuring a logic circuit, are formed in a p-type semiconductor well region (not illustrated) of the second semiconductor substrate 212. In the second semiconductor substrate 212, connection conductors 254 connected to the MOS transistor Tr6, the MOS transistor Tr7, and the MOS transistor Tr8 are formed.

Further, the contact 311 used for electrical connection to the first semiconductor substrate 211 and the third semiconductor substrate 213 is formed on the second semiconductor substrate 212. The contact 311 is connected to the contact 265 of the first semiconductor substrate 211 and is also connected to a pad 330*a* of the third semiconductor substrate 213.

Further, a memory circuit is formed on the third semiconductor substrate 213. Specifically, an MOS transistor Tr11, an MOS transistor Tr12, and an MOS transistor Tr13, which are a plurality of transistors configuring a memory circuit, are formed in a p-type semiconductor well region (not illustrated) of the third semiconductor substrate 213.

Further, in the third semiconductor substrate 213, connection conductors 344 connected to the MOS transistor Tr11, the MOS transistor Tr12, and the MOS transistor Tr13 are formed.

(Two-Stage Pixel CIS)

FIG. 43 illustrates an example of a two-stage pixel structure to which the embodiment of the present disclosure can be applied. FIG. 43 is an explanatory diagram illustrating a cross section of a two-stage pixel structure to which the imaging device 1 according to the embodiment of the present disclosure can be applied.

In the structure illustrated in FIG. 43, a first substrate 80 includes stacking an insulating layer 86 on a semiconductor substrate 11. The first substrate 80 includes the insulating layer 86 as a part of an interlayer insulating film 87. The insulating layer 86 is provided in a gap between the semiconductor substrate 11 and a semiconductor substrate 21A explained below. The first substrate 80 includes a photodiode PD (83), a transfer transistor TR, and a floating diffusion FD. The first substrate 80 has a configuration in which the transfer transistor TR and the floating diffusion FD are provided in a portion on the front surface side (the opposite side of a light incident surface side, a second substrate 20A side) of the semiconductor substrate 11.

In the structure illustrated in FIG. 43, the transfer transistor TR has a planar transfer gate TG. However, the transfer transistor TR is not limited to such a configuration. Transfer gate TG may be a vertical transfer gate piercing through a well layer 42.

The second substrate 20A includes stacking an insulating layer 88 on a semiconductor substrate 21A. The second substrate 20A includes the insulating layer 88 as a part of the interlayer insulating film 87. The insulating layer 88 is provided in a gap between the semiconductor substrate 21A and a semiconductor substrate 81. The second substrate 20A includes a read circuit 22A. Specifically, the second substrate 20A has a configuration in which the read circuit 22A is provided in a portion on the front surface side (the third substrate 30 side) of the semiconductor substrate 21A. The second substrate 20A is bonded to the first substrate 80 with the rear surface of the semiconductor substrate 21A directed to the front surface side of the semiconductor substrate 11. That is, the second substrate 20A is bonded to the first substrate 80 in a face-to-back manner. The second substrate 20A further includes, in the same layer as the semiconductor substrate 21A, an insulating layer 89 piercing through the semiconductor substrate 21A. The second substrate 20A includes the insulating layer 89 as a part of the interlayer insulating film 87.

A stacked body including the first substrate 80 and the second substrate 20A includes the interlayer insulating film 87 and a through-wire 90 provided in the interlayer insulating film 87. Specifically, the through-wire 90 is electrically connected to the floating diffusion FD and a connection wire 91 explained below. The second substrate 20A further includes, for example, a wiring layer 56 on the insulating layer 88.

The wiring layer 56 further includes, for example, a plurality of pad electrodes 58 in an insulating layer 57. The pad electrodes 58 are made of metal such as copper (Cu) or aluminum (Al). The pad electrodes 58 are exposed on the surface of the wiring layer 56. The pad electrodes 58 are used for electrical connection of the second substrate 20A and the third substrate 30 and bonding of the second substrate 20A and the third substrate 30.

The third substrate 30 includes, for example, stacking an interlayer insulating film 61 on the semiconductor substrate 81. Note that, as explained below, the third substrate 30 is bonded to the second substrate 20A on surfaces on the front surface side. The third substrate 30 has a configuration in which a logic circuit 82 is provided in a portion on the front surface side of the semiconductor substrate 81. The third substrate 30 further includes, for example, a wiring layer 62 on the interlayer insulating film 61. The wiring layer 62 includes, for example, an insulating layer 92 and a plurality of pad electrodes 64 provided in the insulating layer 92. The plurality of pad electrodes 64 are electrically connected to the logic circuit 82. The pad electrodes 64 are made of, for example, Cu (copper). The pad electrodes 64 are exposed on the surface of the wiring layer 62. The pad electrodes 64 are used for electrical connection of the second substrate 20A and the third substrate 30 and bonding of the second substrate 20A and the third substrate 30.

Note that, when the technology of the present disclosure is applied to a one-stage pixel (a normal CIS), as an example, as illustrated in FIG. 43, transistors (for example, CMOS transistors) other than the transfer gates 400*a* and 400*b* can be disposed in two pixel transistor regions Ra and Rb in the imaging element 100. The floating diffusion FD is provided at a position adjacent to the transfer gates 400*a* and 400*b*. In the example illustrated in FIG. 43, the pixel transistor regions Ra and Rb are formed to sandwich a pixel region Rc including the pixels 300*a* and 300*b*. A selection transistor SEL and an amplification transistor AMP are disposed in the pixel transistor region Ra on the left side in FIG. 43 and a reset transistor RST is disposed in the pixel transistor region Rb on the right side in FIG. 43. A pixel sharing scheme, the disposition of the transistors, an embedded structure of the photodiode, and the like according to FIG. 43 are only examples and are not limited.

Figure 44:
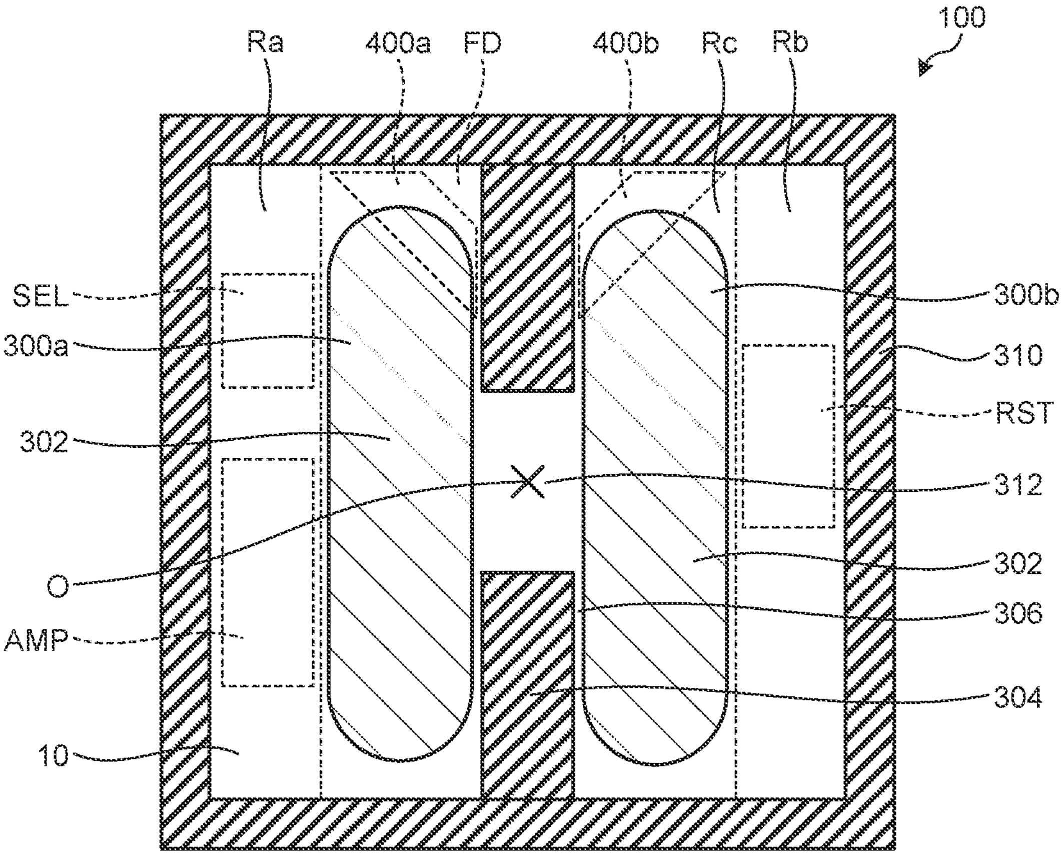
FIG. 44 is an explanatory diagram illustrating a plane of the imaging element 100 according to the embodiment of the present disclosure.
Figure 45:
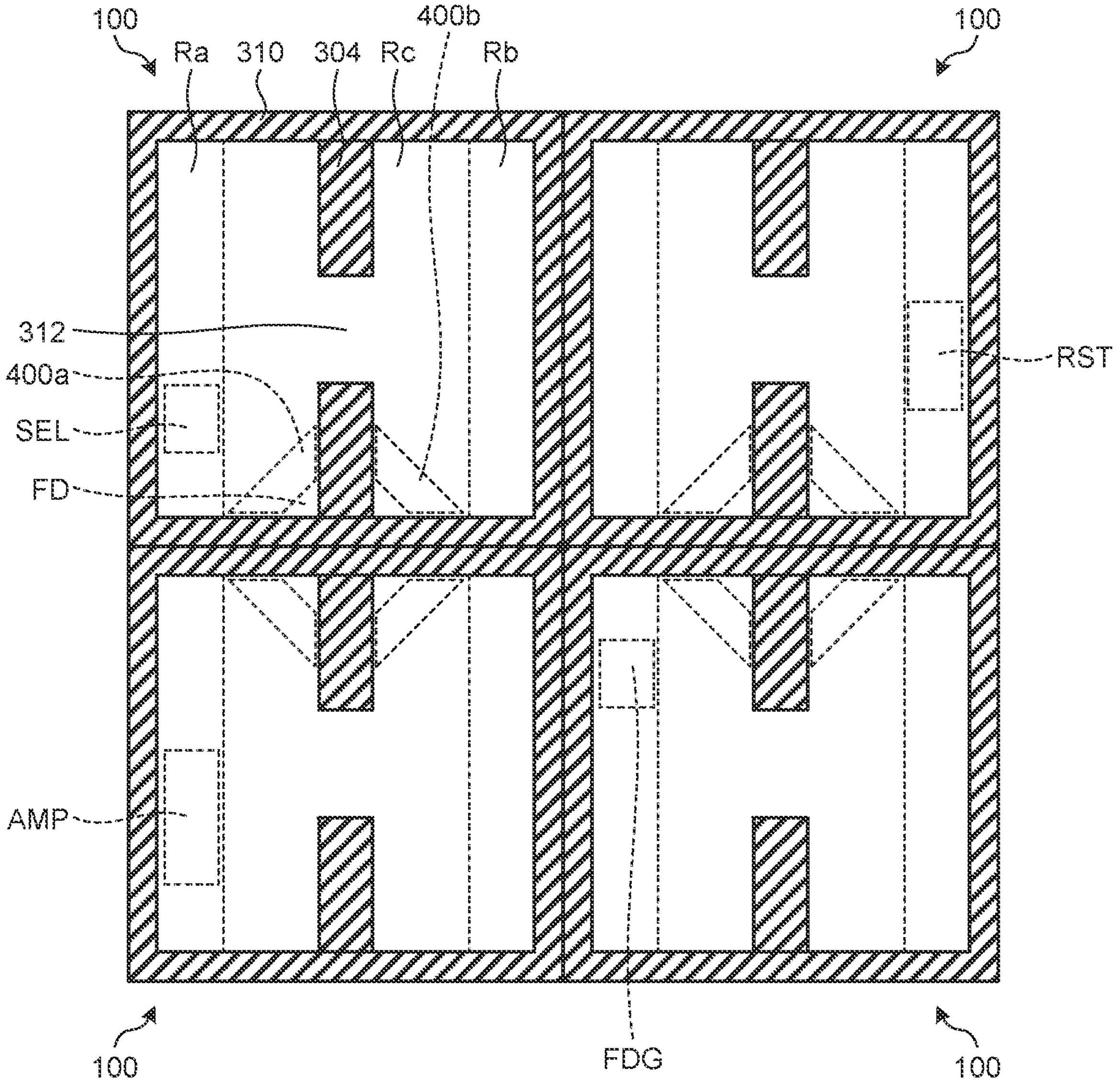
FIG. 45 is an explanatory diagram illustrating planes of a plurality of imaging elements 100 according to the embodiment of the present disclosure.

The imaging element 100 illustrated in FIG. 44 may be disposed as illustrated in FIG. 45 (repeated disposition). One selection transistor SEL, one amplification transistor AMP, one reset transistor RST, and one FD transfer transistor FDG may be disposed in the pixel transistor regions Ra and Rb of each of the imaging elements 100. The FD transfer transistor FDG is used to switch conversion efficiency. The disposition of the transistors may be equal or may be unequal for the pixel transistor regions Ra and Rb. For example, a plurality of amplification transistors AMP may be arranged for four imaging elements 100. The amplification transistors AMP can also be disposed in parallel.

8. APPLICATION EXAMPLE TO A CAMERA

Figure 46:
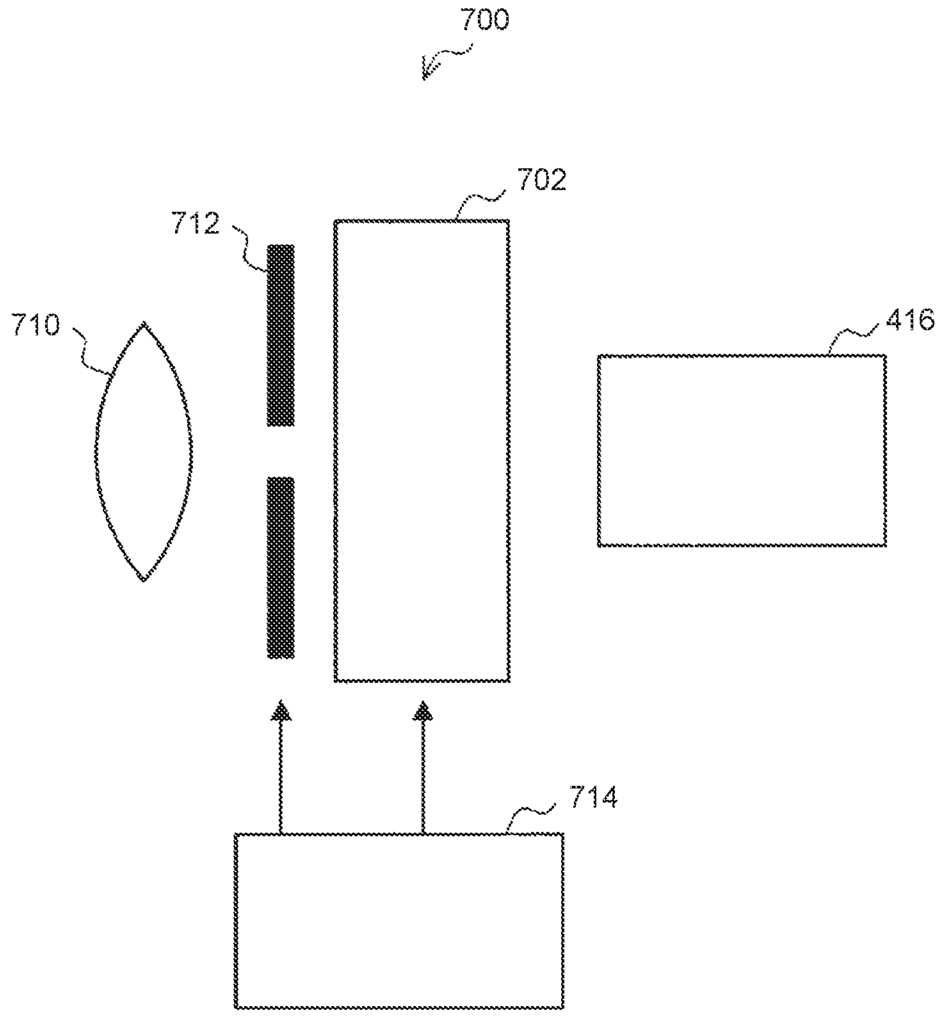
FIG. 46 is an explanatory diagram illustrating an example of a schematic functional configuration of a camera.

The technology according to the present disclosure (the present technology) can be further applied to various products. For example, the technology according to the present disclosure may be applied to a camera or the like. Therefore, a configuration example of the camera 700 serving as electronic equipment to which the present technology is applied is explained with reference to FIG. 46. FIG. 46 is an explanatory diagram illustrating an example of a schematic functional configuration of a camera 700 to which the technology according to the present disclosure (the present technology) can be applied.

As illustrated in FIG. 46, the camera 700 includes an imaging device 702, an optical lens 710, a shutter mechanism 712, a drive circuit unit 714, and a signal processing circuit unit 416. The optical lens 710 forms an image of image light (incident light) from a subject on an imaging surface of the imaging device 702. Consequently, signal charges are stored in the imaging element 100 of the imaging device 702 for a fixed period. The shutter mechanism 712 opens and closes to thereby control a light irradiation period and a light blocking period for the imaging device 702. The drive circuit unit 714 supplies a drive signal for controlling a signal transfer operation of the imaging device 702, a shutter operation of the shutter mechanism 712, and the like to the imaging device 702, the shutter mechanism 712, and the like. That is, the imaging device 702 performs signal transfer based on a drive signal (a timing signal) supplied from the drive circuit unit 714. The signal processing circuit unit 416 performs various kinds of signal processing. For example, the signal processing circuit unit 416 outputs a video signal subjected to signal processing to a storage medium (not illustrated) such as a memory and outputs the video signal to a display section (not illustrated).

9. APPLICATION EXAMPLE TO A SMARTPHONE

Figure 47:
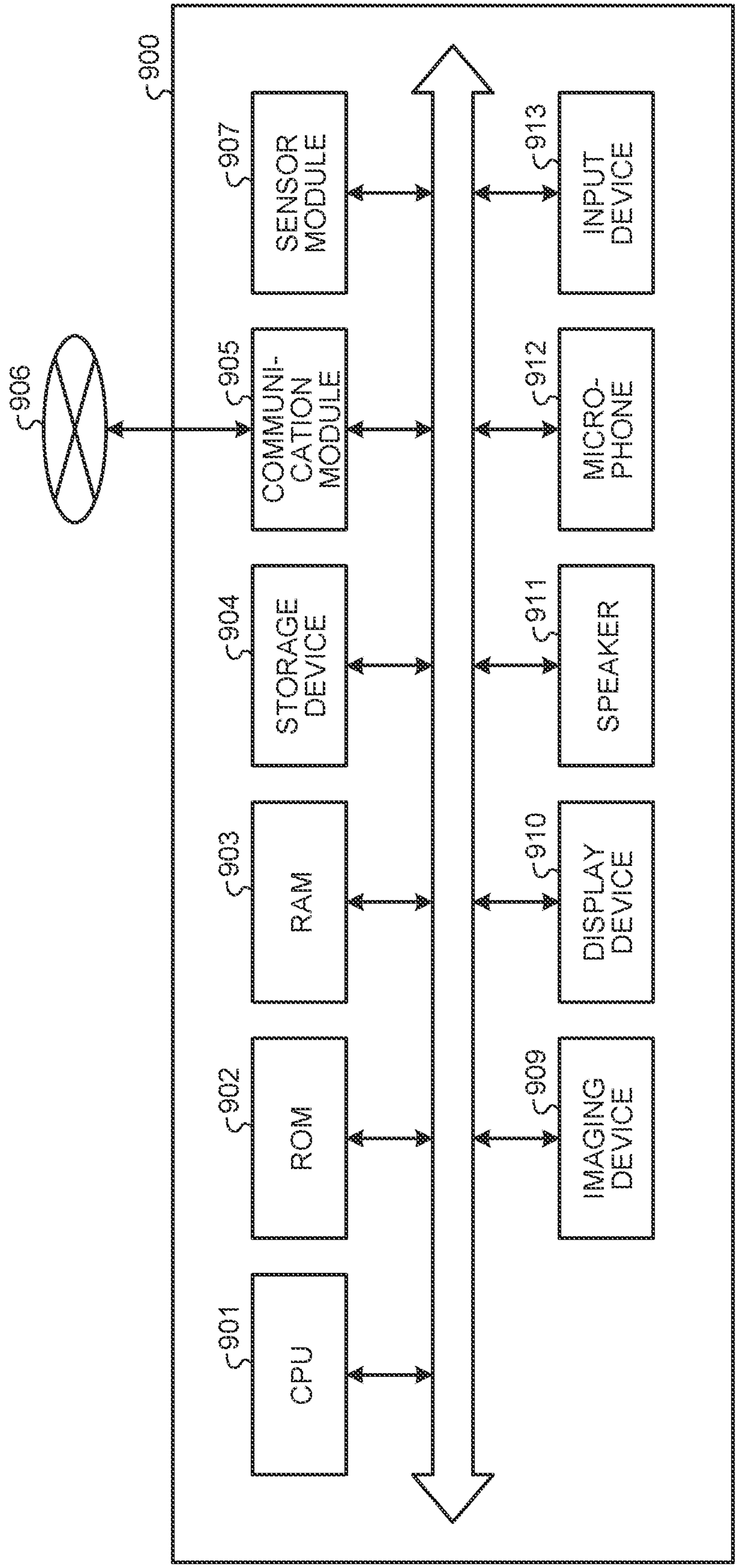
FIG. 47 is a block diagram illustrating an example of a schematic functional configuration of a smartphone.

The technology according to the present disclosure (the present technology) can be further applied to various products. For example, the technology according to the present disclosure may be applied to a smartphone or the like. Therefore, a configuration example of a smartphone 900 serving as electronic equipment to which the present technology is applied is explained with reference to FIG. 47. FIG. 47 is a block diagram illustrating an example of a schematic functional configuration of the smartphone 900 to which the technology according to the present disclosure (the present technology) can be applied.

As illustrated in FIG. 47, the smartphone 900 includes a CPU (Central Processing Unit) 901, a ROM (Read Only Memory) 902, and a RAM (Random Access Memory) 903. The smartphone 900 includes a storage device 904, a communication module 905, and a sensor module 907. Further, the smartphone 900 includes an imaging device 909, a display device 910, a speaker 911, a microphone 912, an input device 913, and a bus 914. The smartphone 900 may include a processing circuit such as a DSP (Digital Signal Processor) instead of or together with the CPU 901.

The CPU 901 functions as an arithmetic processing device and a control device and controls an entire operation or a part of the operation in the smartphone 900 according to various programs recorded in the ROM 902, the RAM 903, the storage device 904, or the like. The ROM 902 stores programs, arithmetic operation parameters, and the like to be used by the CPU 901. The RAM 903 primarily stores programs to be used in execution of the CPU 901, parameters that appropriately change in the execution, and the like. The CPU 901, the ROM 902, and the RAM 903 are connected to one another by a bus 914. The storage device 904 is a device for data storage configured as an example of a storage unit of the smartphone 900. The storage device 904 includes, for example, a magnetic storage device such as an HDD (Hard Disk Drive), a semiconductor storage device, or an optical storage device. The storage device 904 stores programs to be executed by the CPU 901, various data, various data acquired from the outside, and the like.

The communication module 905 is a communication interface including, for example, a communication device for connecting to a communication network 906. The communication module 905 can be, for example, a communication card for a wired or wireless LAN (Local Area Network), Bluetooth (registered trademark), or WUSB (Wireless USB). The communication module 905 may be a router for optical communication, a router for ADSL (Asymmetric Digital Subscriber Line), a modem for various kinds of communication, or the like. The communication module 905 transmits and receives signals and the like to and from, for example, the Internet and other communication equipment using a predetermined protocol such as TCP (Transmission Control Protocol)/IP (Internet Protocol). The communication network 906 connected to the communication module 905 is a network connected by wire or radio and is, for example, the Internet, a home LAN, infrared communication, or satellite communication.

The sensor module 907 includes various sensors such as a motion sensor (for example, an acceleration sensor, a gyro sensor, or a geomagnetic sensor), a biological information sensor (for example, a pulse sensor, a blood pressure sensor, or a fingerprint sensor), or a position sensor (for example, a GNSS (Global Navigation Satellite System) receiver).

The imaging device 909 is provided on the surface of the smartphone 900 and can image a target object or the like located on the rear side or the front side of the smartphone 900. Specifically, the imaging device 909 can include an imaging element (not illustrated) such as a CMOS (Complementary MOS) image sensor to which the technology according to the present disclosure (the present technology) can be applied and a signal processing circuit (not illustrated) that applies imaging signal processing to a signal photo-electrically converted by the imaging element. Further, the imaging device 909 can further include an optical system mechanism (not illustrated) including an imaging lens, a zoom lens, a focus lens, and the like and a drive system mechanism (not illustrated) that controls an operation of the optical system mechanism. The imaging element condenses incident light from a target object as an optical image. The signal processing circuit can acquire a captured image by photo-electrically converting the formed optical image in units of pixels, reading signals of pixels as imaging signals, and performing image processing.

The display device 910 is provided on the surface of the smartphone 900 and can be a display device such as an LCD (Liquid Crystal Display) or an organic EL (Electro Luminescence) display. The display device 910 can display an operation screen, a captured image acquired by the imaging device 909 explained above, and the like.

The speaker 911 can output, for example, call voice, voice incidental to video content displayed by the display device 910 explained above, and the like to a user.

The microphone 912 can collect, for example, call voice of the user, voice including a command to start a function of the smartphone 900, and voice in a surrounding environment of the smartphone 900.

The input device 913 is a device operated by the user such as a button, a keyboard, a touch panel, or a mouse. The input device 913 includes an input control circuit that generates an input signal based on information input by the user and outputs the input signal to the CPU 901. By operating the input device 913, the user can input various data to the smartphone 900 and instructs the smartphone 900 to perform a processing operation.

The configuration example of the smartphone 900 is explained above. The components explained above may be configured using general-purpose members or may include hardware specialized for the functions of the components. Such a configuration can be changed as appropriate according to a technical level at each time to be implemented.

10. APPLICATION EXAMPLE TO AN ENDOSCOPIC SURGERY SYSTEM

The technology according to the present disclosure (the present technology) can be further applied to various products. For example, the technology according to the present disclosure may be applied to an endoscopic surgery system.

Figure 48:
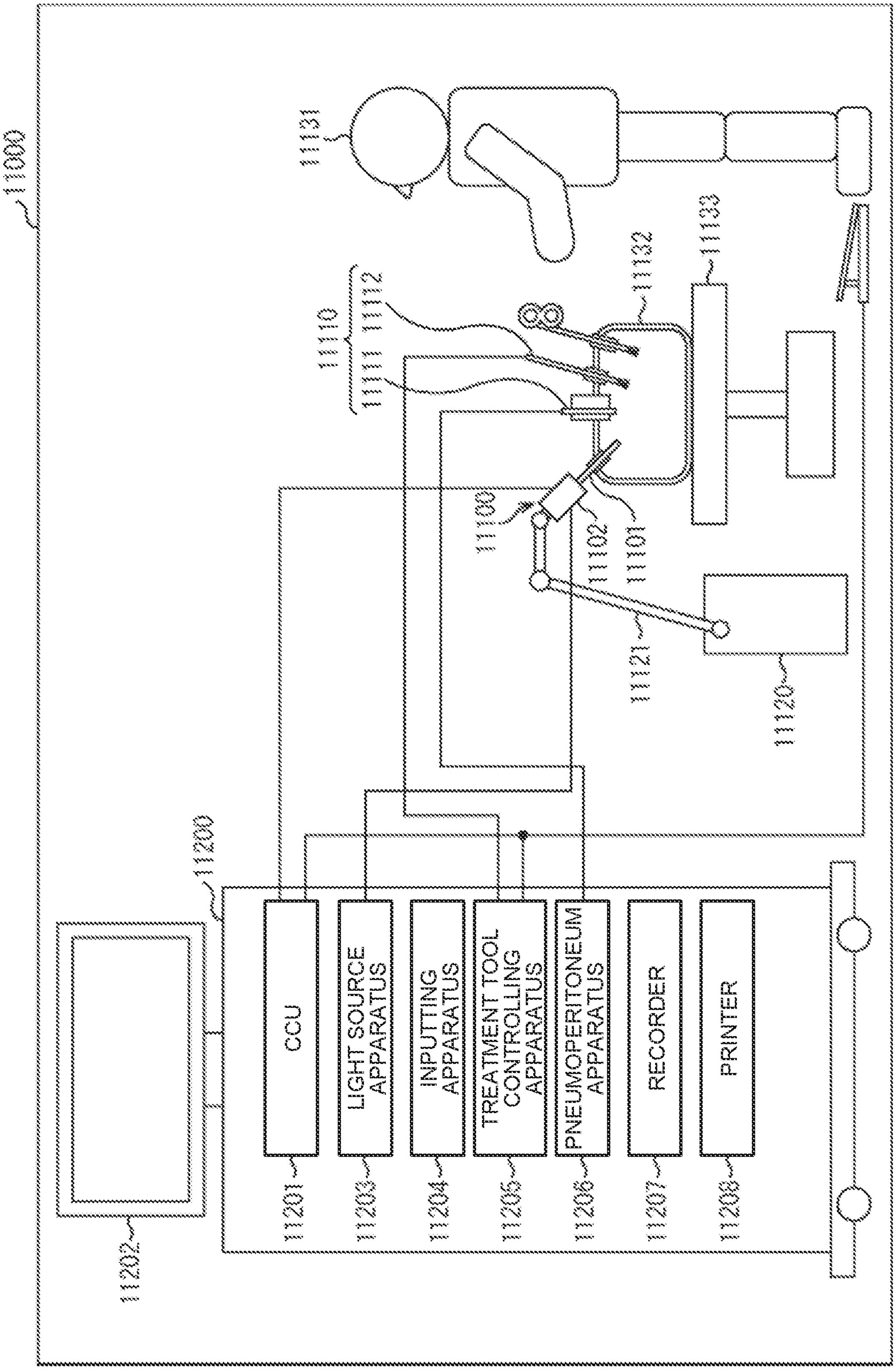
FIG. 48 is a view depicting an example of a schematic configuration of an endoscopic surgery system.

FIG. 48 is a view depicting an example of a schematic configuration of an endoscopic surgery system to which the technology according to an embodiment of the present disclosure (present technology) can be applied.

In FIG. 48, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 49:
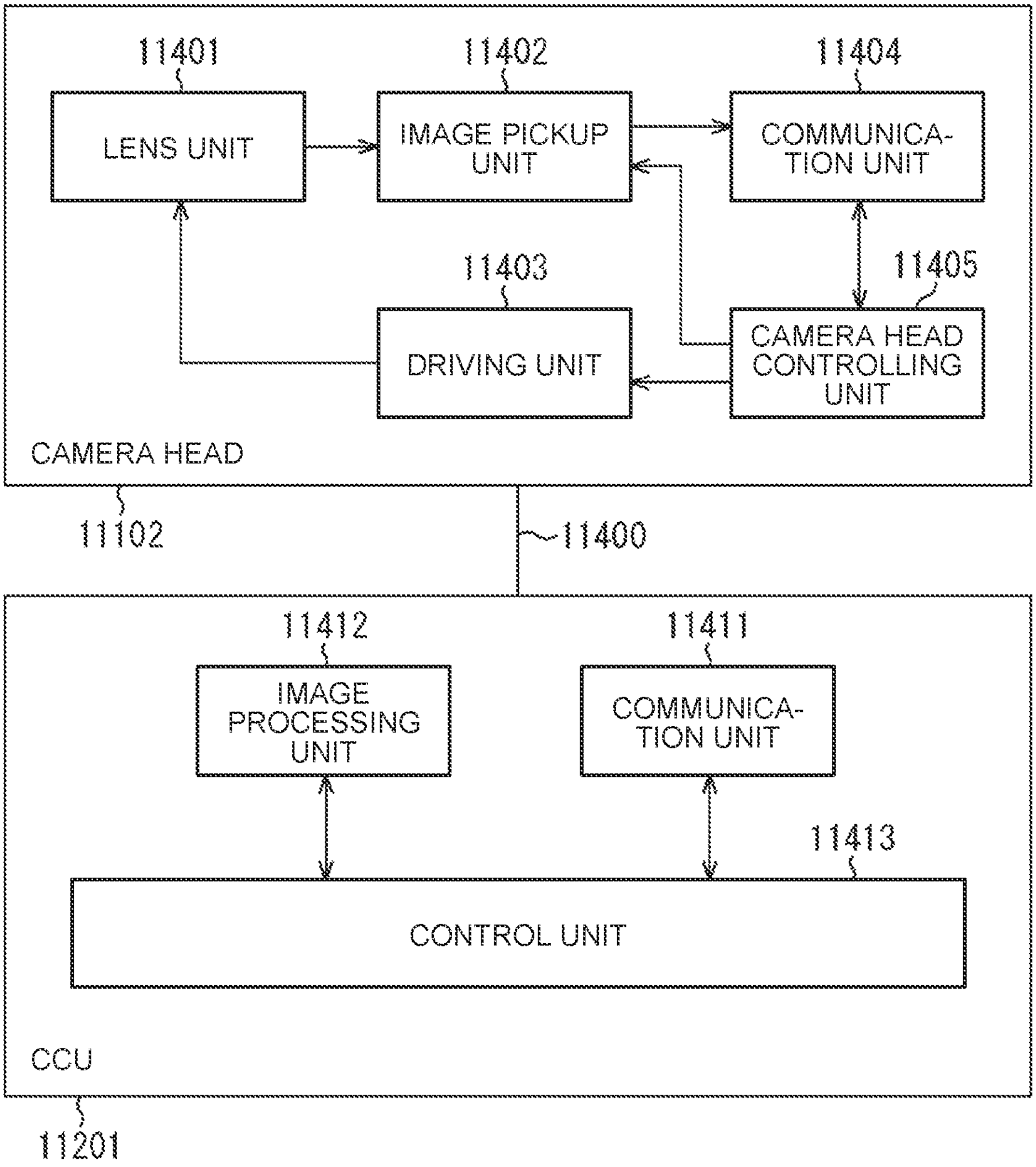
FIG. 49 is a block diagram depicting an example of a functional configuration of a camera head and a camera control unit (CCU).

FIG. 49 is a block diagram depicting an example of a functional configuration of the camera head 11102 and the CCU 11201 depicted in FIG. 48.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes an image pickup element. The number of image pickup elements which is included by the image pickup unit 11402 may be one (single-plate type) or a plural number (multi-plate type).

Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied is explained above. The technology according to the present disclosure can be applied to, for example, the endoscope 11100, (the image pickup unit 11402 of) the camera head 11102, (the image processing unit 11412 of) the CCU 11201, and the like) among the components described above.

Note that, here, the endoscopic surgery system is explained as an example. However, besides, the technology according to the present disclosure may be applied to, for example, a microscopic surgery system or the like.

11. APPLICATION EXAMPLE TO A MOBILE BODY

The technology according to the present disclosure (the present technology) can be applied to various products. For example, the technology according to the present disclosure may be implemented as a device mounted on a mobile body of any type such as an automobile, an electric vehicle, a hybrid electric vehicle, a motorcycle, a bicycle, a personal mobility, an airplane, a drone, a ship, and a robot.

Figure 50:
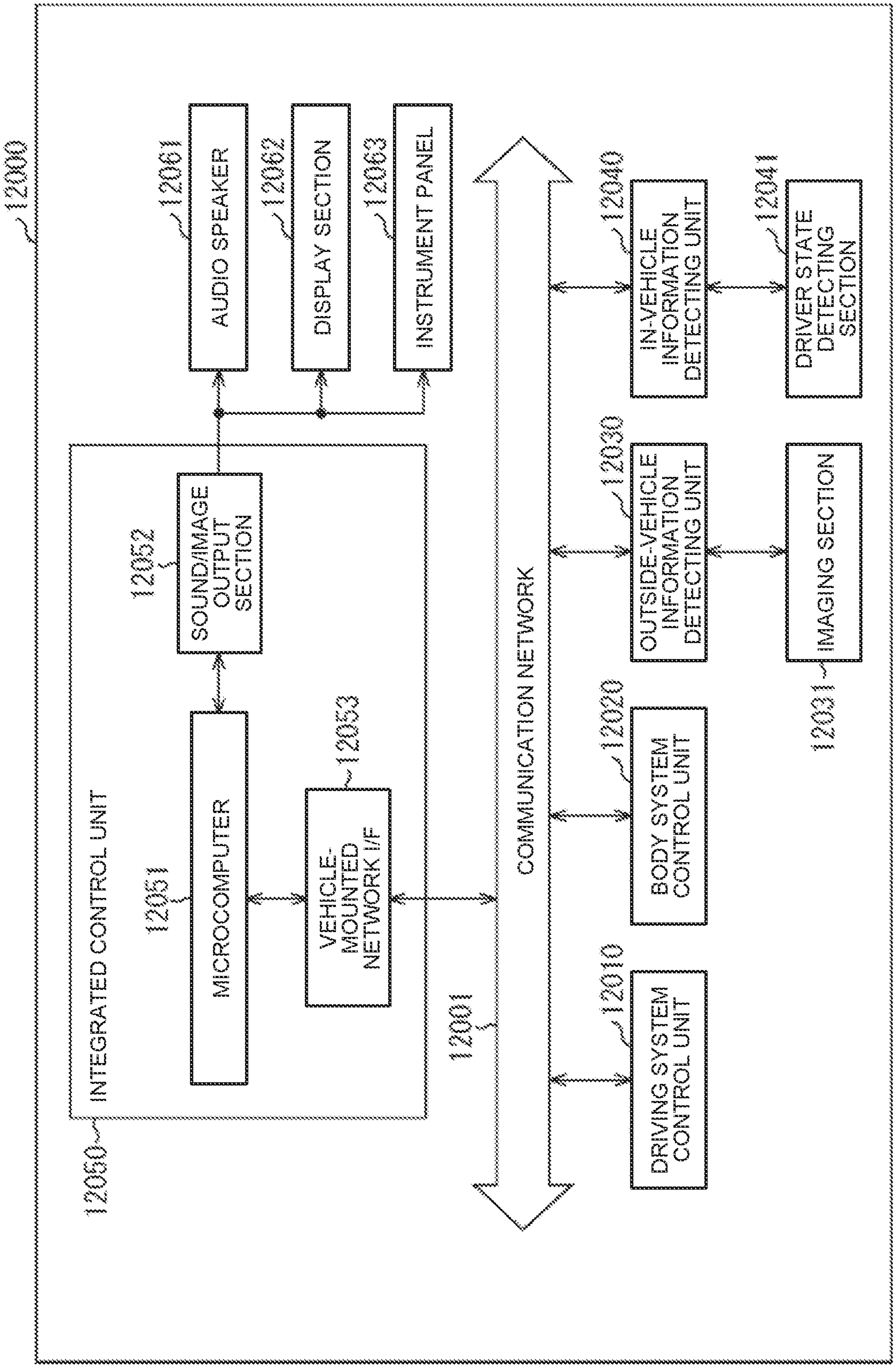
FIG. 50 is a block diagram depicting an example of schematic configuration of a vehicle control system.

FIG. 50 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 50, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 50, an audio speaker 12061, a display section 12062, and an instrument panel 12063 are illustrated as the output device. The display section 12062 may, for example, include at least one of an on-board display and a head-up display.

Figure 51:
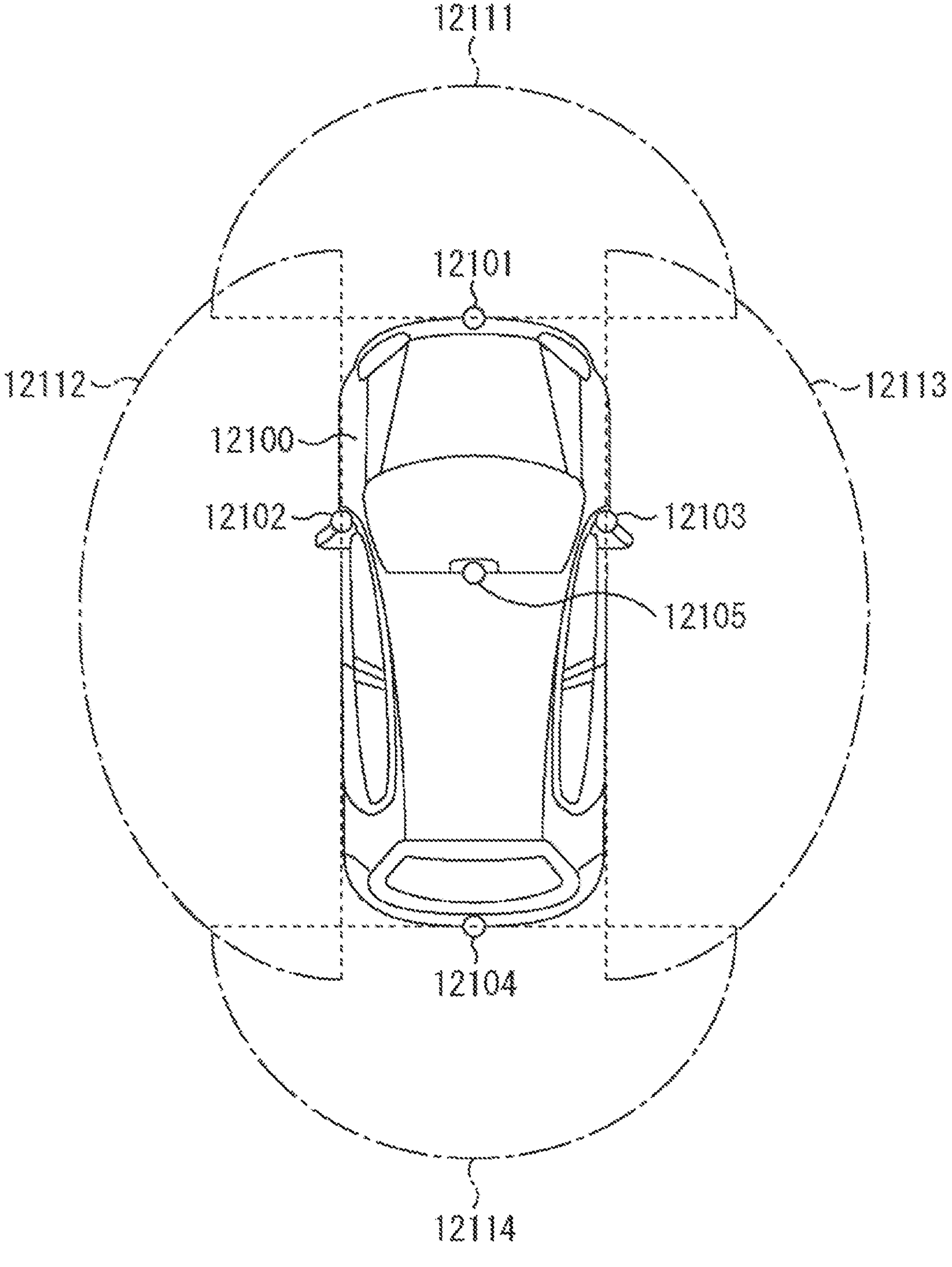
FIG. 51 is a diagram of assistance in explaining an example of installation positions of an outside-vehicle information detecting section and an imaging section.

FIG. 51 is a diagram depicting an example of the installation position of the imaging section 12031.

In FIG. 51, a vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. Front images acquired by the imaging sections 12101 and 12105 are mainly used for detecting a preceding vehicle, a pedestrian, an obstacle, a traffic light, a traffic sign, a lane, or the like.

Incidentally, FIG. 51 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained from a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure can be applied is explained above. The technology according to the present disclosure can be applied to, for example, the imaging section 12031 and the like among the components explained above.

12. SUPPLEMENT

The preferred embodiment of the present disclosure is explained in detail above with reference to the accompanying drawings. However, the technical scope of the present disclosure is not limited to such an example. It is evident that those having the ordinary knowledge in the technical field of the present disclosure can arrive at various alterations or corrections within the category of the technical idea described in claims. It is understood that these alterations and corrections naturally belong to the technical scope of the present disclosure. The embodiments and the modifications explained above can be implemented in combination with each other.

The effects described in the present specification are only explanatory or illustrative and are not limiting. That is, the technology according to the present disclosure can achieve other effects obvious for those skilled in the art from the description of the present specification together with or instead of the effects described above.

Note that the present technology can also take the following configurations.

(1) An imaging device comprising:
- a semiconductor substrate; and
- a plurality of imaging elements that are arrayed in a matrix in a first direction and a second direction on the semiconductor substrate and perform photoelectric conversion on incident light, wherein
- each of the plurality of imaging elements includes:
- a plurality of pixels provided to be adjacent to one another in a predetermined unit region of the semiconductor substrate and including a photoelectric conversion section containing impurities of a first conductivity type;
- a separation section that separates the plurality of pixels;
- two first element separation walls provided to pierce through at least a part of the semiconductor substrate along two first side surfaces of the predetermined unit region extending in the second direction;
- an on-chip lens provided above a light receiving surface of the semiconductor substrate to be shared by the plurality of pixels; and
- a first diffusion region provided in the semiconductor substrate around the first element separation wall and the separation section and containing impurities of a second conductivity type having a conductivity type opposite to the first conductivity type.

(2) The imaging device according to (1), wherein the imaging element further includes a second diffusion region provided in the semiconductor substrate around two second side surfaces extending in the first direction of the predetermined unit region and containing the impurities of the second conductivity type.

(3) The imaging device according to (2), wherein at least a part of the second diffusion region contains the impurities of the second conductivity type at higher concentration compared with the first diffusion region.

(4) The imaging device according to (2) or (3), wherein the imaging element further includes a second element separation wall provided along the second side surface between the first element separation wall and the separation section.

(5) The imaging device according to (1), wherein the imaging element further includes:

two third element separation walls provided to pierce through at least a part of the semiconductor substrate along two second side surfaces of the predetermined unit region extending in the first direction; and a third diffusion region provided in the semiconductor substrate around the third element separation wall and containing the impurities of the second conductivity type.

(6) The imaging device according to (5), wherein, when viewed from above the light receiving surface, width of the third element separation wall is smaller compared with the first element separation wall.

(7) The imaging device according to (5) or (6), wherein the third element separation wall is provided to pierce through the semiconductor substrate from a surface opposite to the light receiving surface in a thickness direction of the semiconductor substrate.

(8) The imaging device according to any one of (2) to (6), wherein the first element separation wall is provided to pierce through the semiconductor substrate from a surface opposite to the light receiving surface in a thickness direction of the semiconductor substrate.

(9) The imaging device according to any one of (2) to (8), wherein the first direction is a row direction in the plurality of imaging elements arrayed in the matrix, and the second direction is a column direction in the plurality of imaging elements arrayed in the matrix.

(10) The imaging device according to any one of (2) to (9), wherein the separation section includes a first pixel separation wall extending in the second direction to separate the plurality of pixels and provided to pierce through the semiconductor substrate.

(11) The imaging device according to (10), wherein the first pixel separation wall has two pixel separation regions divided by a slit, and the first diffusion region is located in the slit.

(12) The imaging device according to (11), wherein the slit is provided to be located in a center of the imaging element when viewed from above the light receiving surface.

(13) The imaging device according to (5), wherein each of the pixels includes:

a transfer gate electrode that transfers electric charges generated in the photoelectric conversion section; and a charge storage section that stores electric charges from the photoelectric conversion section, and the charge storage section is provided near a first intersection where one of the third element separation walls and the separation section intersect with each other when viewed from above a surface of the semiconductor substrate opposite to the light receiving surface.

(14) The imaging device according to (13), wherein the transfer gate electrode is provided to be adjacent to the first element separation wall and extend along the first element separation wall when viewed from above the surface.

(15) The imaging device according to (14), wherein the transfer gate electrode is provided near a second intersection where the third element separation wall forming the first intersection and the first element separation wall when viewed from above the surface.

(16) The imaging device according to any one of (13) to (15), wherein the transfer gate electrode includes one or a plurality of embedded electrode sections embedded in the semiconductor substrate.

(17) The imaging device according to (10), wherein the first pixel separation wall is provided to be shorter compared with the first element separation wall in the second direction when viewed from above the light receiving surface.

(18) The imaging device according to any one of (1) to (6), wherein the separation section includes a second pixel separation wall extending in the second direction to separate the plurality of pixels and provided to pierce through the semiconductor substrate from a surface opposite to the light receiving surface to halfway in the semiconductor substrate in a thickness direction of the semiconductor substrate.

(19) The imaging device according to any one of (1) to (6), wherein the separation section includes a fourth diffusion region containing impurities of the second conductivity type.

(20) Electronic equipment comprising an imaging device including:

a semiconductor substrate; and a plurality of imaging elements that are arrayed in a matrix in a first direction and a second direction on the semiconductor substrate and perform photoelectric conversion on incident light, wherein each of the plurality of imaging elements includes:

a plurality of pixels provided to be adjacent to one another in a predetermined unit region of the semiconductor substrate and including a photoelectric conversion section containing impurities of a first conductivity type;

a separation section that separates the plurality of pixels;

two first element separation walls provided to pierce through at least a part of the semiconductor substrate along two first side surfaces of the predetermined unit region extending in the second direction;

an on-chip lens provided above a light receiving surface of the semiconductor substrate to be shared by the plurality of pixels; and a first diffusion region provided in the semiconductor substrate around the first element separation wall and the separation section and containing impurities of a second conductivity type having a conductivity type opposite to the first conductivity type.

REFERENCE SIGNS LIST

1 IMAGING DEVICE

10, 11, 20A, 21A, 30, 31, 45, 80, 81, 211, 212, 213 SUBSTRATE

10*a* LIGHT RECEIVING SURFACE

10*b* FRONT SURFACE

20 PIXEL ARRAY UNIT

21 VERTICAL DRIVE CIRCUIT UNIT

22 COLUMN SIGNAL PROCESSING CIRCUIT UNIT

22A READ CIRCUIT
23 HORIZONTAL DRIVE CIRCUIT UNIT
24 OUTPUT CIRCUIT UNIT
25 CONTROL CIRCUIT UNIT
26 PIXEL DRIVE WIRE
27 VERTICAL SIGNAL LINE
28 HORIZONTAL SIGNAL LINE
29 INPUT/OUTPUT TERMINAL
31*b* REAR SURFACE
32, 46 WELL REGION
33, 47 SOURCE/DRAIN REGION
34, 35 SEMICONDUCTOR REGION
36, 48 GATE ELECTRODE
38 ELEMENT SEPARATION REGION
39, 49, 61, 87 INTERLAYER INSULATING FILM
40, 53 WIRE
41, 55 MULTILAYER WIRING LAYER
42 WELL LAYER
44, 51, 54, 244, 254, 344 CONNECTION CONDUCTOR
52, 63 INSULATING FILM
56, 62 WIRING LAYER
57, 86, 88, 89, 92 INSULATING LAYER
58, 64 PAD ELECTRODE
73 FLATTENING FILM
74, 202 COLOR FILTER
75, 200 ON-CHIP LENS
77 OPENING
78 ELECTRODE BUMP
82 LOGIC CIRCUIT
84 THROUGH CONNECTION CONDUCTOR
234 PD
85 THROUGH-CONNECTION HOLE
90 THROUGH WIRE
91 CONNECTION WIRE
100 IMAGING ELEMENT
204, 204*a*, 204*b* LIGHT BLOCKING SECTION
265, 311 CONTACT
280*a*, 330*a* PAD
300*a*, 300*b* PIXEL
302 photoelectric conversion section
304 PROJECTING SECTION
306, 306*c*, 306*d*, 306*e*, 306*h*, 320 DIFFUSION REGION
310, 310*a*, 310*b*, 340 ELEMENT SEPARATION WALL
312 SLIT
334, 334*b* PIXEL SEPARATION WALL
400*a*, 400*b* TRANSFER GATE
402 EMBEDDED ELECTRODE SECTION
601 FD SECTION
602 GROUND SECTION
750 TRENCH
752 MASK

The invention claimed is:

1. An imaging device, comprising:
a semiconductor substrate; and
a plurality of imaging elements that are arrayed in a matrix in a first direction and a second direction on the semiconductor substrate and perform photoelectric conversion on incident light,
wherein each of the plurality of imaging elements includes:
a plurality of pixels provided to be adjacent to one another in a predetermined unit region of the semiconductor substrate and including a photoelectric conversion section containing impurities of a first conductivity type;
a separation section that separates the plurality of pixels;
two first element separation walls provided to pierce through at least a part of the semiconductor substrate along two first side surfaces of the predetermined unit region extending in the second direction;
an on-chip lens provided above a light receiving surface of the semiconductor substrate to be shared by the plurality of pixels;
a first diffusion region provided in the semiconductor substrate around the first element separation wall and the separation section and containing impurities of a second conductivity type having a conductivity type opposite to the first conductivity type,
a second diffusion region provided in the semiconductor substrate around two second side surfaces extending in the first direction of the predetermined unit region and containing the impurities of the second conductivity type,
wherein at least a part of the second diffusion region provided perpendicular to the first diffusion region contains the impurities of the second conductivity type at higher concentration compared with the first diffusion region.

2. The imaging device according to claim 1, wherein the imaging element further includes a second element separation wall provided along the second side surface between the first element separation wall and the separation section.

3. The imaging device according to claim 1, wherein the first element separation wall is provided to pierce through the semiconductor substrate from a surface opposite to the light receiving surface in a thickness direction of the semiconductor substrate.

4. The imaging device according to claim 1, wherein
the first direction is a row direction in the plurality of imaging elements arrayed in the matrix, and
the second direction is a column direction in the plurality of imaging elements arrayed in the matrix.

5. The imaging device according to claim 1, wherein the separation section includes a first pixel separation wall extending in the second direction to separate the plurality of pixels and provided to pierce through the semiconductor substrate.

6. The imaging device according to claim 5, wherein
the first pixel separation wall has two pixel separation regions divided by a slit, and
the first diffusion region is located in the slit.

7. The imaging device according to claim 6, wherein the slit is provided to be located in a center of the imaging element when viewed from above the light receiving surface.

8. The imaging device according to claim 5, wherein the first pixel separation wall is provided to be shorter compared with the first element separation wall in the second direction when viewed from above the light receiving surface.

9. The imaging device according to claim 1, wherein the imaging element further includes:
two third element separation walls provided to pierce through at least a part of the semiconductor substrate along two second side surfaces of the predetermined unit region extending in the first direction; and
a third diffusion region provided in the semiconductor substrate around the third element separation wall and containing the impurities of the second conductivity type.

10. The imaging device according to claim 9, wherein, when viewed from above the light receiving surface, a width of the third element separation wall is smaller compared with a width of the first element separation wall.

11. The imaging device according to claim 9, wherein the third element separation wall is provided to pierce through the semiconductor substrate from a surface opposite to the light receiving surface in a thickness direction of the semiconductor substrate.

12. The imaging device according to claim 9, wherein each of the pixels includes:

a transfer gate electrode that transfers electric charges generated in the photoelectric conversion section; and a charge storage section that stores electric charges from the photoelectric conversion section, and wherein the charge storage section is provided near a first intersection where one of the third element separation walls and the separation section intersect with each other when viewed from above a surface of the semiconductor substrate opposite to the light receiving surface.

13. The imaging device according to claim 12, wherein the transfer gate electrode is provided to be adjacent to the first element separation wall and extends along the first element separation wall when viewed from above the surface of the semiconductor substrate opposite to the light receiving surface.

14. The imaging device according to claim 13, wherein the transfer gate electrode is provided near a second intersection where the third element separation wall forming the first intersection and the first element separation wall when viewed from above the surface of the semiconductor substrate opposite to the light receiving surface.

15. The imaging device according to claim 12, wherein the transfer gate electrode includes one or a plurality of embedded electrode sections embedded in the semiconductor substrate.

16. The imaging device according to claim 1, wherein the separation section includes a second pixel separation wall extending in the second direction to separate the plurality of pixels and provided to pierce through the semiconductor substrate from a surface opposite to the light receiving surface to halfway in the semiconductor substrate in a thickness direction of the semiconductor substrate.

17. The imaging device according to claim 1, wherein the separation section includes a fourth diffusion region containing impurities of the second conductivity type.

18. Electronic equipment, comprising an imaging device including:

a semiconductor substrate; and a plurality of imaging elements that are arrayed in a matrix in a first direction and a second direction on the semiconductor substrate and perform photoelectric conversion on incident light, wherein each of the plurality of imaging elements includes:

a plurality of pixels provided to be adjacent to one another in a predetermined unit region of the semiconductor substrate and including a photoelectric conversion section containing impurities of a first conductivity type;

a separation section that separates the plurality of pixels;

two first element separation walls provided to pierce through at least a part of the semiconductor substrate along two first side surfaces of the predetermined unit region extending in the second direction;

an on-chip lens provided above a light receiving surface of the semiconductor substrate to be shared by the plurality of pixels;

a first diffusion region provided in the semiconductor substrate around the first element separation wall and the separation section and containing impurities of a second conductivity type having a conductivity type opposite to the first conductivity type, a second diffusion region provided in the semiconductor substrate around two second side surfaces extending in the first direction of the predetermined unit region and containing the impurities of the second conductivity type, wherein at least a part of the second diffusion region provided perpendicular to the first diffusion region contains the impurities of the second conductivity type at higher concentration compared with the first diffusion region.

19. The electronic equipment according to claim 18, wherein the imaging element further includes a second element separation wall provided along the second side surface between the first element separation wall and the separation section.

20. The electronic equipment according to claim 18, wherein the imaging element further includes:

two third element separation walls provided to pierce through at least a part of the semiconductor substrate along two second side surfaces of the predetermined unit region extending in the first direction; and a third diffusion region provided in the semiconductor substrate around the third element separation wall and containing the impurities of the second conductivity type.

* * * * *